(12) United States Patent
Reghetti et al.

(10) Patent No.: US 6,970,078 B2
(45) Date of Patent: Nov. 29, 2005

(54) METHODS AND APPARATUS FOR GENERATING A DATA STRUCTURE INDICATIVE OF AN ALARM SYSTEM CIRCUIT

(75) Inventors: Joseph Reghetti, Las Vegas, NV (US); Barry Kenneth Anspach, Centennial, CO (US)

(73) Assignee: M.E.P. CAD, Inc., Las Vegas, NV (US)

( * ) Notice: Subject to any disclaimer, the term of this patent is extended or adjusted under 35 U.S.C. 154(b) by 269 days.

(21) Appl. No.: 10/282,560

(22) Filed: Oct. 29, 2002

(65) Prior Publication Data

US 2004/0080407 A1    Apr. 29, 2004

(51) Int. Cl.[7] .............................................. G08B 29/00
(52) U.S. Cl. ................. 340/506; 340/524; 340/286.05; 340/293
(58) Field of Search ................................ 340/506, 507, 340/508, 509, 510, 511, 516, 517, 520, 521, 340/522, 523, 531, 691.1, 691.4, 691.5, 825.22, 340/524, 525, 286.02, 286.05, 286.07, 293, 340/294; 701/1, 2

(56) References Cited

U.S. PATENT DOCUMENTS

| 4,427,974 | A | * | 1/1984 | Sheahan ................ 340/286.05 |
| 5,103,214 | A | * | 4/1992 | Curran et al. ............ 340/691.1 |
| 5,227,983 | A |   | 7/1993 | Cox et al. ...................... 703/1 |
| 5,557,537 | A |   | 9/1996 | Normann et al. ............... 703/1 |
| 5,608,375 | A | * | 3/1997 | Kosich ........................ 340/293 |
| 5,808,905 | A |   | 9/1998 | Normann et al. ............... 703/2 |
| 5,877,683 | A | * | 3/1999 | Sheasley ...................... 340/506 |
| 5,977,872 | A | * | 11/1999 | Guertin ....................... 340/515 |
| 6,331,982 | B1 | * | 12/2001 | Watanabe .................... 370/399 |
| 6,853,299 | B2 | * | 2/2005 | Shiratori et al. ............ 340/506 |

OTHER PUBLICATIONS

M.E.P.CAD "AlarmCAD Getting Started" Copyright 2000.
M.E.P.CAD "The AutoSPRINK Production System" Copyright 2002.
M.E.P.CAD "AlarmCAD Product Brochure" Copyright 2002.
M.E.P.CAD "AutoSPRINK Alarm version 1.0.42.738" Aug. 27, 2001.
M.E.P.CAD "AutoALARM Help File from AutoSPRINK Alarm version 1.0.42.738" Copyight 2001. As printed May 2004.
M.E.P.CAD "AutoALARM v.1.0.24.700" Oct. 2000.
M.E.P.CAD "AutoSPRINK Help File from AutoALARM v.1.0.24.700." Copyright 2000. As printed May 2004.
M.E.P.CAD "AlarmCAD v.1.0.63.Beta" Copyright 2002.

(Continued)

*Primary Examiner*—Van T. Trieu
(74) *Attorney, Agent, or Firm*—Hanley, Flight & Zimmerman, LLC

(57) ABSTRACT

A user of a computer aided design (CAD) system graphically places fire alarm elements, such as smoke detectors, sirens, and sources on a drawing area. After one or more of the elements are placed, the disclosed methods and apparatus automatically determine a series of electrical circuit connections between alarm source elements and alarm appliance elements. This determination may be based on circuit type compatibility as well as a number of connected segments between a particular alarm source and a particular alarm appliance.

38 Claims, 59 Drawing Sheets

OTHER PUBLICATIONS

M.E.P.CAD "AlarmCAD Help File From AutoCAD v.1.0.63.787." Copyright 2002. As printer May 2004.
"NACTool Electronic Circuit Builder Operating Instructions" Rev. 2.63. Aug. 1997. Wheelock, Inc. pp. 1-5.
"MicroStation" Jan. 2003. Bentley Systems, Inc. pp. 1-2.
"AutoCAD 2005: Features and Benefits" 2004. Autodesk, Inc. pp. 1-9.
"Wheelock, Inc. Design Software" Wheelock, Inc. Website [retrieved on Jun. 25, 2004]. Retrieved from <URL: http://www.wheelockinc.com/technical_support/software.htm>. p. 1.
"Arris Learning Guide" Version 8.1. Mar. 23, 2004. Sigma Design, LLC. pp. 1-62.
"Arris New User Tutorial" Version 8.1. Jun. 9, 2004. Sigma Design, LLC. pp. 1-67.
"Fire-Lite Alarms" Fire-Lite Alarms, Inc. Website [retrieved on Jun. 25, 2004]. Retrieved from <URL: http://www.firelite.com/aboutus.html>. p. 1.

\* cited by examiner

| Appliance List | | | | |
|---|---|---|---|---|
| Device Type | Address | Circuit | V. Drop | Panel Node |
| Photoelectric detector | 01 | A | 0.0089 | 1 |
| Photoelectric detector | 02 | A | 0.0067 | 1 |
| Photoelectric detector | 03 | A | 0.0056 | 1 |
| Photoelectric detector | 04 | A | 0.01 | 1 |
| Photoelectric detector | 01 | A | 0 | 2 |
| Photoelectric detector | 02 | A | 0 | 2 |
| Photoelectric detector | 01 | A | 0 | 3 |
| Photoelectric detector | 01 | A | 0 | 4 |
| Photoelectric detector | 02 | A | 0 | 4 |

FIG. 17

| Battery Calculations for Panel P03 ||||
|---|---|---|---|
| Supervisory Hours:24 || Alarm Minutes:5 ||
| Qty. | Part No. | Supervisory mA | Alarm mA |
| 1 | 976153 | 268.0000mA | 375.0000mA |
| 3 | 920096 | 0.3000mA | 0.3000mA |
| 3 | 920192 | 0.0010mA | 4.2000mA |
| | | | TOTALS |
| Battery Size without Compensation: 6.49 AH ||||
| Battery Size with Compensation: 7.78 AH ||||

FIG. 19

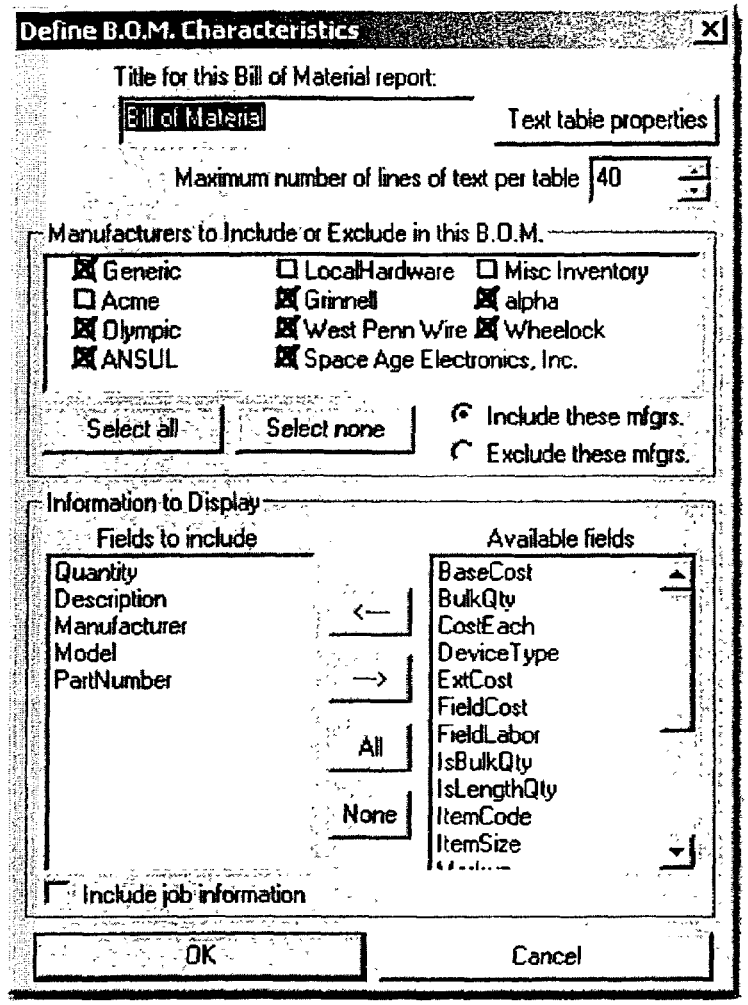

FIG. 20

| Bill of Material | | | |
|---|---|---|---|
| Qty. | Description | Model | Par. No. |
| 8 | Micromotor driven fire alarm bell | K-MB-3P | 538723 |
| 9 | Photoelectric smoke detector | ISN-550P | 920096 |
| 9 | 6" Low profile addressable base with remote LED output | IBN-552 | 920192 |
| 3 | Wall mounted electromagnetic holder for low profile doors | FM-990 | 930176 |
| 1 | Programmable auxiliary relay module | ARM-500 | 976014 |
| 4 | MP-500 Main processor board | MP-500 | 976037 |
| 4 | AUTOCALL TFX-500M - Standard door | TFX-500M | 976153 |
| 4 | Panel core assembly | | 9976228 |
| 1 | Plenum cable, fire alarm, cabled, w/TFE binder tape | | 3756-760 |
| 1 | Power - Limited, Multiple Conductor | 990 | 990 |
| 1 | Power - Limited, Addressable system data cable | D991 | C991 |

Circuit Calculations     Panel: P01   Node: 1   Circuit: B

Circuit Type: Signaling line    Voltage: 24V.DC    Amperage: 0.9000mA
Cable: Power, Limited, Addressable system data grade #16

| Part No | Appliance Desc | Distance | Current | Voltage | Voltage Drop |
|---|---|---|---|---|---|
| | Panel | | | 24V | |
| 920096 | Photoelectric smoke detector | 16'-0 | 0.3000mA | 23.9999V | (0.0001V) |
| 920096 | Photoelectric smoke detector | 13'-0 | 0.3000mA | 23.9998V | (0.0001V) |
| 920096 | Photoelectric smoke detector | 12'-0 | 0.3000mA | 23.9998V | (0V) |
| | | | 0.9000mA | | |

Total Current:0.9000mA
Total Voltage Drop:0.0002V

METHODS AND APPARATUS FOR GENERATING A DATA STRUCTURE INDICATIVE OF AN ALARM SYSTEM CIRCUIT

TECHNICAL FIELD

This disclosure relates to building construction drawing systems and, more particularly, to an alarm drawing and wiring system.

BACKGROUND

Alarm systems, such as fire alarm systems are commonplace and are typically used in commercial buildings of all types. Fire alarm systems, which are usually placed into buildings during the construction of those buildings, include numerous initiating devices (e.g., pull stations, smoke and heat detectors), notification appliances (e.g., sirens and strobes), and other devices typically disposed at or below the ceiling of each floor of a building, with each of the devices being electrically connected to fire alarm control panels within the building. Of course, there are many different kinds of alarm systems, and the type and design of an alarm system is generally based on a number of factors, such as the use of the building, what is stored in the building, cost effective routing of electrical wiring, etc.

In the past, fire alarm designers designed a fire alarm system for a particular building using a blueprint or layout drawing of the building. During this process, the designer selected the fire alarm system components to be used and designed the fire alarm system layout based on the locations of the walls, the ceilings, and other building elements. In addition, the designer designed the electrical connections between the fire alarm components. Faced with a large number of possibilities, this process was time consuming as it was manual in nature. In addition, the manual wiring process typically did not result in the most cost effective wiring scheme (e.g., the least amount of wire and wiring labor).

BRIEF DESCRIPTION OF THE DRAWINGS

FIG. 17 is a screen-shot of an "Appliance List" chart.

FIG. 19 is a screen-shot of a "Battery Calculations" chart.

FIG. 20 is a screen-shot of a "Define B.O.M. Characteristics" window and a screen-shot of a "Bill of Materials" chart.

FIG. 22 is a screen-shot of a "Circuit Calculations" chart.

FIG. 53 is a screen-shot of a "Trim Kit Detail" window.

DETAILED DESCRIPTION OF EXAMPLE EMBODIMENTS

Computer Based System

Figure 1:
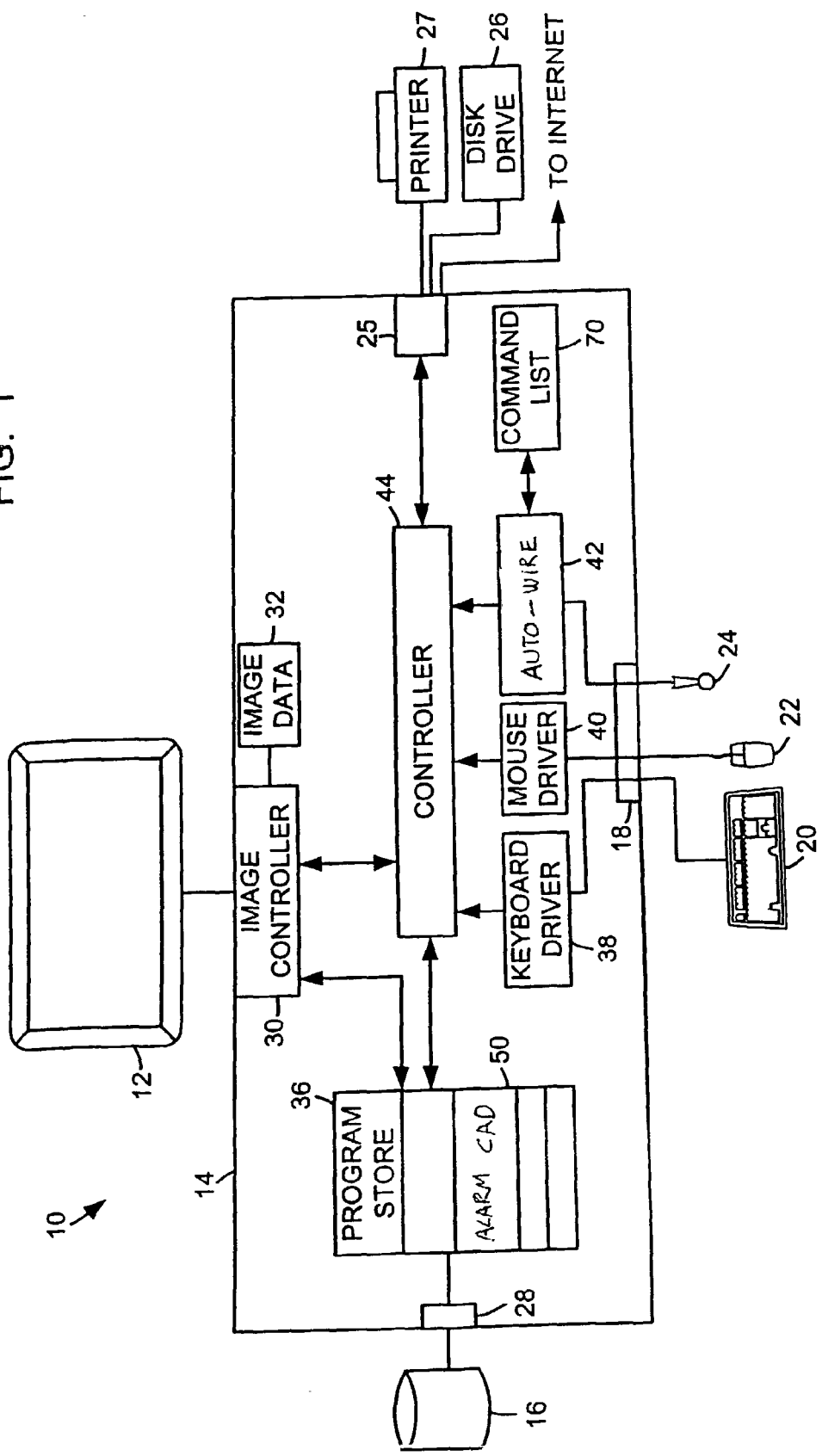
FIG. 1 is a block diagram of a fire alarm drawing system.

Referring to FIG. 1, a computer based alarm drawing system 10 is illustrated in block diagram form. It should be noted that, while the alarm drawing system 10 is described herein as being implemented in software executed on a personal computer, this system could be executed on any other type of computer as well, such as any laptop computer, handheld computer or data assistant, any larger mainframe type computer, etc. Still further, the alarm drawing system 10 described herein could be implemented in firmware or hardware elements such as in application specific integrated circuits (ASICs) as well as in typical software routines. It will also be understood that, as described herein, the different modules, routines or programs stored in a computer memory may be stored in any desired manner in volatile memory, such as in a magnetic type memory, random access memory, etc., as well as in any desired type of non-volatile memory such as in EPROMs, EEPROMs, ASICs, etc. Still further, these routines may be embodied in hardware logic circuits (e.g., memories) of any desired types, such as ASICs. Moreover, while the description herein specifically describes a fire alarm drawing system, this same concept could be embodied in any alarm drawing system implemented on a computer, including, for example, in security systems. In those cases, the drawing program could be tailored to the specific type of alarm system being drawn.

As illustrated in FIG. 1, the alarm drawing system 10 includes a display device 12, such as an LCD screen, CRT screen, plasma panel display, printer or other type of display, a processing unit 14 and a database 16. The system 10 may also include user input ports 18 which may include standard or known inputs for a keyboard 20, a mouse device 22 and a microphone 24 or other voice input device. If desired, the system 10 may also include one or more input/output ports 25 that enable files, such as drawing files or other types of data to be delivered to the processing unit 14 from, for example, a compact disk (CD) or floppy disk drive 26, the internet, etc. Further, a printer 27 may be connected to the alarm drawing system via one of the input/output ports 25 and any other external communication port may be included and used to enable the system 10 to print out or to download reports or other data generated by the system 10.

The database or memory storage unit 16 may be a RAM on a hard drive or any other type of memory and is connected to the processing unit 14 via any appropriate input/output (I/O) driver or device 28. Furthermore, the database 16 may include different storage regions for elements available to be used to draw an alarm system and for building elements available to be used to draw a building. The memory 16 may be organized in any desired manner and may be accessed using any suitable database access software. Preferably, the database 16 stores one or more data structures indicative of one or more alarm systems including the components of the alarm system, the physical placement of those components, and the electrical wiring between those components.

A number of different programs or routines may be stored in and executed on the processing unit 14 which, of course, includes a memory and a typical processor such as a general purpose processor of any desired type. As illustrated in FIG. 1, the processing unit 14 may store and execute a number of modules or routines which are used to provide user input/output functions as well as to implement or provide assistance in drawing an alarm system for a building. In particular, the processing unit 14 may implement a graphics or image display controller 30 which may store, in an image data memory 32, data associated with the image being displayed on the display device 12 and may process or manipulate that data as needed. While the image data memory 32 will generally be RAM or a buffer memory that is easily accessible, the image data memory 32 may be within the hard drive of the computer or may be any other suitable memory. The image or display controller 30 may be implemented using any desired or known image or display control software or routine, such as that associated with the MICROSOFT Windows operating system.

The processing unit 14 also includes a program store 36 which stores the programs or routines (or the portions thereof currently being used) which are executing within the processor. The program store 36 stores or implements the programs needed to perform the numerous tasks associated with the alarm drawing program that will be described in more detail herein. The processing unit 14 also includes a number of input drivers, such as any standard keyboard input unit 38 and mouse input unit 40 which process the keyboard and mouse generated commands. Such input drivers may be those as provided by the MICROSOFT Windows operating system. Still further, and importantly, the processing unit 14 stores and executes a automatic wiring module or routine 42. The processing unit 14 also includes an arbiter or controller 44 that controls the order of and the timing of the execution of the different programs or modules within the processing unit 14. Thus, the controller 44 arbitrates the timing and execution of the different programs, routines or modules such as the programs within the program store 36, the input drivers 38, 40 and 42, the image controller 30, etc. to assure that these programs interact together in a seamless manner.

In one embodiment, a fire alarm drawing program 50 is stored in the program store 36. This fire alarm drawing program 50 may be, for example, based on the AlarmCAD program produced by M.E.P.CAD. In any event, the fire alarm drawing program 50 may be implemented in a CAD programming structure developed using an object oriented programming paradigm. In this situation, the logical concept for describing components of the computer program are known as objects. An object is used to define the properties and interfaces of a system component. The computer program is an assembly of one or more objects and this object structure helps to clearly define and encapsulate the components of the computer program. The program uses "Object Oriented Programming," an industry standard practice, well known in the art, for program definition, design, and development. In one embodiment, the objects are implemented in C++ program code as classes. A class is a C++ programming language data structure that exists to implement the logical concept of an object and is used to encapsulate the data properties and methods/interfaces of an object into a single data structure.

Generally speaking, three basic foundation structure programs are initially stored into the computer memory 16 or the processing unit 14 to implement the alarm system objects for display in a fire alarm system drawing produced on the display device 12. First, Microsoft Foundation Program Structure is a program based upon the Microsoft standard Multi-Document Interface (MDI). This program model is built upon a base including four fundamental objects, namely, Application, Frame, Document, and View. The Application, sold under the trademark, MICROSOFT FOUNDATION CLASS LIBRARIES (MFC), provides utilitarian objects and represents a program itself. It is through the Application object that the process is initiated and all other objects come into existence. The Application creates the Frame, Document, and View objects. The Frame object represents the frame window of the Application that becomes visible to the user and acts as the manager for subsequent user interface objects, such as other windows. The Frame object encapsulates the internal data structures used by the operating system, sold under the trademark MICROSOFT WINDOWS, to create and maintain an application's parent window. The Document object represents an instance of the user's data and is stored to memory for later retrieval. Many Document objects can exist for each instance of the program, enabling the program to open several documents simultaneously. The View object represents a view into the data of a Document object. The View object provides the user with a visual interface to the Document. The View object encapsulates the internal data structures used by the MICROSOFT WINDOWS operating system to create and maintain an application's child window. Many View objects can exist for each Document object, enabling the program to display several different views of the same document simultaneously.

The second foundation program within the routine 50 is a CAD foundation program sold under the trademark SYMMETRICA, for the alarm system design software. This software includes a set of programming objects that expands upon the MFC program structure. It adds capability to the MFC Application, Frame, Document, and View objects, enabling them to offer the fundamental behavior and interfaces of a CAD program. Many essential objects provided by this program support the needs of a CAD program. An Application object necessary to support the CAD program, and a Frame object which establishes the parent window framework required to support the CAD program objects are derived from MICROSOFT MFC Objects. A Document object is used to provide all the capability required to encapsulate CAD drawing data, which includes drawing elements and user settings appropriate to each drawing. A View object provides a visual interface to the document object. This View object provides the three dimensional view, rotation and scaling properties, enabling the user to view the document's data from any arbitrary three dimensional position, view rotation, and magnification. It also provides for requesting three dimensional Cartesian coordinate (x, y, z) point input from the user. Input is provided by the system pointing device 22 (mouse), the keyboard 20, or both. Also provided is a base class object of all CAD drawing elements, such as lines, arcs, circles, etc., that can be managed by the Document object and displayed by the View object. This object defines the interface to the CAD drawing elements that all derived classes inherit through standard C++ mechanisms. This standard interface enables the definition of the new kinds of elements for the CAD drawing, such as a wire object derived from a line segment. The CAD foundation program further acts as the foundation program for other programs.

The third foundation program is the program sold under the trademark OBJECT DBX. This program is a collection of objects for reading, writing, and viewing DWG and DXF drawing files. This file format is well known in the art, the industry standard for the exchange of drawing files, and is used in one embodiment of the fire sprinkler drawing system described herein. Using OBJECT DBX objects, the above CAD foundation has the capability to read, write, and view DWG and DXF drawing files. This capability is implemented in the CAD program Document and View objects. DWG and DXF drawing files can be read/appended to a CAD drawing and the CAD drawings may be stored on a data storage medium as DWG and DXF drawing files. Additionally, DWG and DXF drawing files can be selected as a backdrop to the current CAD drawing. This method enables the CAD program to make full use of the high-speed display objects to view DWG and DXF drawings. When the display must be refreshed, the background drawing is displayed first, immediately followed by the elements of the CAD drawing.

In general, the CAD program stores fire alarm system elements, such as smoke detectors, sirens, power supplies, circuit panels, wire paths, etc., as well as building elements, such a walls, ceilings, floors, beams, electrical components, plumbing components, etc. as templates or generic objects in one or more parts databases in, for example, the memory 16. The CAD program may also store information describing features and capabilities of the drawing routine in the form of a Help database, in the memory 16.

During operation, the CAD program enables the user to perform any of numerous commands to create or produce a building and/or a fire alarm system drawing having a plurality of alarm system elements connected together at particular locations in the drawing using the parts and elements in the parts databases. During operation, and in response to the user initiated commands, the CAD program produces the alarm system drawing essentially as a set of interconnected objects each having particular properties (as specified by the user initiated commands), such as location, size, color, etc. that define these objects and the interconnection of these objects. The CAD program stores the alarm system drawing in a data structure, which may include fire alarm system elements and electrical wiring data with or without building elements therein, in the memory 16 or other memory associated with the system 10. The CAD program, using the image controller 30 and other programs described herein, also displays the alarm system drawing, or portions thereof, on the display unit 12.

In some cases, the CAD program may enable a user to perform other functions or analyses on or with respect to the alarm system drawing, such as performing any desired or known electrical load calculations or analysis on the drawing. Still further, the CAD program may implement a report that lists all of the parts in the fire alarm system or a selected portion of the fire alarm system, or any other desired report. While the fire alarm drawing routine is described herein as being an object-oriented routine, it could be any other type of routine, using other programming structures or paradigms, that provides a user with the capability to produce a fire alarm system drawing on a display device using a set of user initiated commands.

Interface Overview

Figure 2:
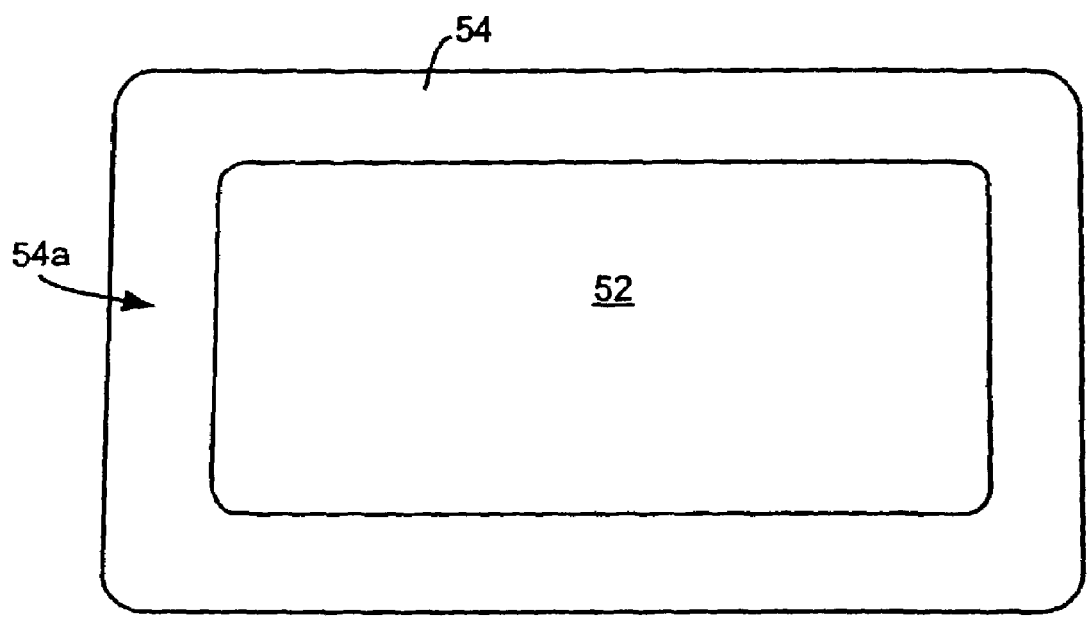
FIG. 2 is a generic diagram of an image screen illustrating an image region and a command region on the display of FIG. 1.

As will be described below, the fire alarm drawing program 50 is responsive to user initiated commands in the form of keyboard and mouse commands as well as voice commands. FIG. 2 illustrates the generic form of a possible graphics image that may be placed on the display unit 12 including an image or drawing region 52 and a command region 54. The image region 52 is the region in which the fire alarm system drawing and, if desired, the building in which the fire alarm system being drawn, is illustrated in graphical form. The building and the fire alarm system can be drawn in any form, such as in two-dimensional form, three-dimensional form, etc. In this case, each part of the drawing, such as each building wall, floor, ceiling, detector, siren, wire, etc. is a separate object which is instantiated to have some particular properties as well as a particular location in some coordinate space. The user can add or delete elements from the drawing on the image region 52 as desired using appropriate commands.

Generally speaking, the command region 54, provides or displays commands that can be used to draw a fire alarm system and a building in which this system is to be used. Such commands typically take the form of pull down menus and/or toolbars having numerous commands that can be selected by the user with, for example, the mouse 22 or the keyboard 24 (via, for example, function keys) to perform certain tasks within the image region 52. The command region 54 may also include a section 54a that displays templates, toolbars, and/or other drawing commands that can be used to place, delete or modify objects within the image region. These commands may cause the curser to draw, for example, a wall, a ceiling, a smoke detector, a wire, etc. when the command is selected and the cursor is placed in the image region 52. When a user selects one of these commands and draws an element in the image region, the program 50 will instantiate the element as an object within the fire alarm system drawing, as stored in the database 16.

Elements, Symbols, Groups, and Tools

As described above, elements are the individual pieces that make up a drawing. Elements compose the visible form of the design. A simple drawing could be entirely constructed of line segment elements. However, a typical design will contain a variety of elements, including fire alarm specific elements. An element encapsulates the data and processes that are required for the element to exist in the drawing and interact with other elements. There are many different types of elements, each specialized to represent a particular design concept in the drawing. There is no practical limit to the variety of elements that may be developed for the drawing. For example, the drawing may include alarm source devices, alarm appliances, and/or other fire alarm components. Preferably, every instance of every element in the drawing is assigned a unique identification number. The identification number may appear on an element properties page for each element.

Symbols provide a convenient and efficient means for duplicating a collection of elements repeatedly in a drawing. The drawing data that makes up the symbol is stored once, and then each instance of the symbol in the drawing simply references the common drawing data. For example, a drawing of a conference room might contain many instances of the same chair symbol. Each instance of a symbol in the drawing causes a graphic representation of the symbol data to appear at that location. The symbol instance exists on only one layer. Each symbol instance can be assigned a 3D rotation, 3D scale and color. The color of the symbol instance only affects certain elements within the symbol data. For example, a chair symbol could be created so that the color of the symbol instance only affects the fabric portions. Each symbol instance references a single common symbol definition. The appearance of instances of a symbol throughout a drawing may be changed by changing the definition of the symbol.

Grouping elements together creates an association between elements in the drawing. The element data exists in the data structure for the drawing. Each element of a group exists on a drawing layer. Consequently, layer visibility can be used to control portions of a group. Every group has a designated "parent" element. When the user creates a group, a special stretch box element is created to act as the parent of the group. The selected elements are then associated with the stretch box parent element. In most groups, selecting any element of the group causes the entire group to become selected. In such groups the parent provides the only interface to modify the individual members. In the case of the user-created stretch box group, the members of the group are scaled according to size changes to the parent element. Some groups form a loose association that enables the individual elements of the group to be modified without breaking the group. Dimension lines are created in this way, with the text loosely grouped with the dimension lines. This enables the dimension line to manage the contents of its text while permitting the user to easily modify the location of the text.

Tools are the user interfaces that create elements in a drawing. Tools may use a variety of user interface objects, such as dialog box windows and custom controls, to collect the information needed to create associated drawing and data structure elements. Tools may also require the identification of drawing locations, either with the mouse and/or via textual input. When a new element type is added, a new tool is usually developed that creates a single instance of the element in a drawing. These utilitarian tools provide base level functionality for creating drawings. Tools are not restricted to creating only one element. An example of this is the Circle tool, which creates an Ellipse element. The Ellipse is not restricted to a circular shape, so it is not appropriate to call it a Circle element. On the other hand, the Circle tool is restricted to creating circular shapes. Many tools query the user for point input. In such an instance, the user can choose to use a different tool rather than answering the point input prompt. Generally, starting a new tool completely and safely cancels any tool that is currently awaiting point input. There are a few tools that suspend the current tool rather than canceling it. Examples include "Zoom Area" and "Move Benchmark." These tools are useful while in the midst of the drawing tools. Once these tools are finished, control reverts to the drawing tool that was suspended.

The drawing system may include a wide variety of computer-aided design (CAD) tools and commands. For example, the drawing system may include commands such as rotate, array, bind, clean-up, create detail, create symbol, flatten, group, hide layers, match color, match elevation, match layer, match line type, match line weight, match properties, mirror, move, copy, paste, scale, split, stretch, trim, extend, center, connect, and/or other commands and tools included in commercially available CAD packages.

Alarm System Design Tools

In addition, specific commands/tools for designing fire alarm systems are preferably included. For example, after placing one or more alarm source devices (e.g., power supply, circuit panel, module, addressable signaling line, remote bus signaling line, notification circuit, etc.) and/or one or more alarm appliances (e.g., notifier device, siren, bell, initiator device, smoke detector, heat detector, carbon-dioxide detector, relay, phone, etc.), the user may wish to connect appliances to circuits, disconnect appliances, label appliances elevations, re-sequence by addressable circuits, re-sequence by selected appliances, update wirepath labels, etc.

Figure 3:
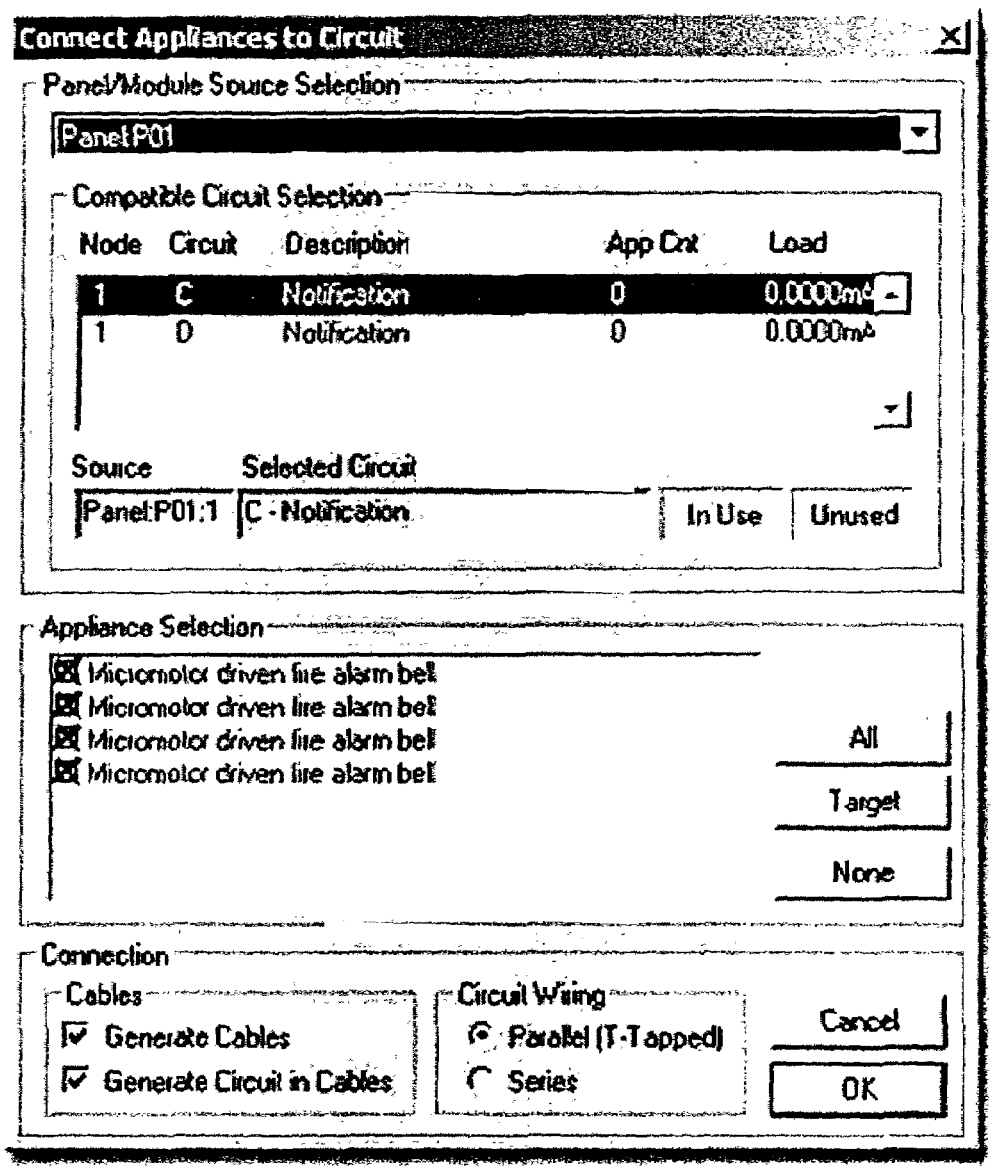
FIG. 3 is a screen-shot of a "Connect Appliances to Circuit" window.

A "Connect Appliance to Circuit" tool connects selected devices on a drawing field to available circuit panels. To connect appliances to a circuit, the user may select an appliance and click either a "Connect Appliance" icon on a "Circuit" toolbar or choose "Connect Appliances to Circuit" from a "Commands" menu. On the "Connect Appliances to Circuit" dialog (see FIG. 3), the user may choose a panel from the "Panel/Module Source Selection" drop-down. The chosen panel's circuit information then appears. The selected device and any other devices of the same type that precede the selected device on a shared wirepath are listed in an "Appliance Section" window. The user may check or uncheck any appliances that he wishes to include in, or exclude from the connection process. Under "Connection," unchecking "Generate Cables" connects the selected device(s) to the chosen panel without placing either a cable or a wirepath in the drawing. Checking "Generate Circuit in Cables" gives the connecting wirepath circuit information (which is accessible by double-clicking the wirepath to bring up its "Properties" page). Under "Circuit Wiring," the user may choose "Parallel" to splice the connecting cable into an existing circuit, or the user may choose "Series" to include the new appliance into an existing sequence.

Figure 4:
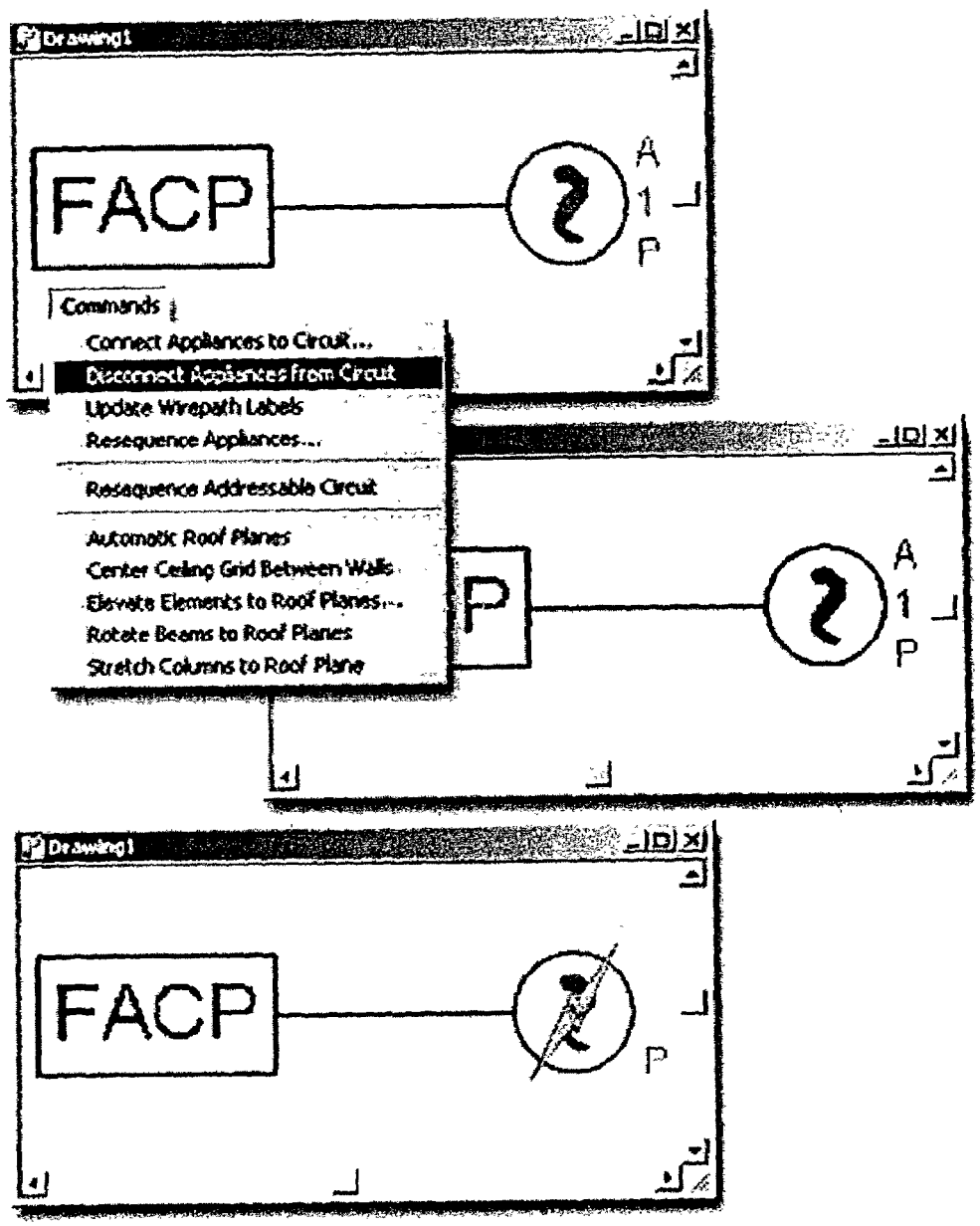
FIG. 4 is screen-shots of a "Disconnect Appliances from Circuit" operation.

A "Disconnect Appliances from Circuit" tool dissociates selected devices from their current circuit assignment(s) without removing joining wirepaths or cable properties. To break an appliance's connection, the user may select the appliance by clicking on it in the drawing field. From the "Commands" menu, the user may choose "Disconnect Appliances" (see FIG. 4). If "Show Invalid Connections" is checked on a "View" menu, a lightning bolt will appear across the disconnected appliance (see FIG. 4). The "Disconnect Appliance" command does not remove wirepaths or cables, so these will still appear in the drawing. Double-clicking the wirepath will display the wirepath's properties.

Figure 5:
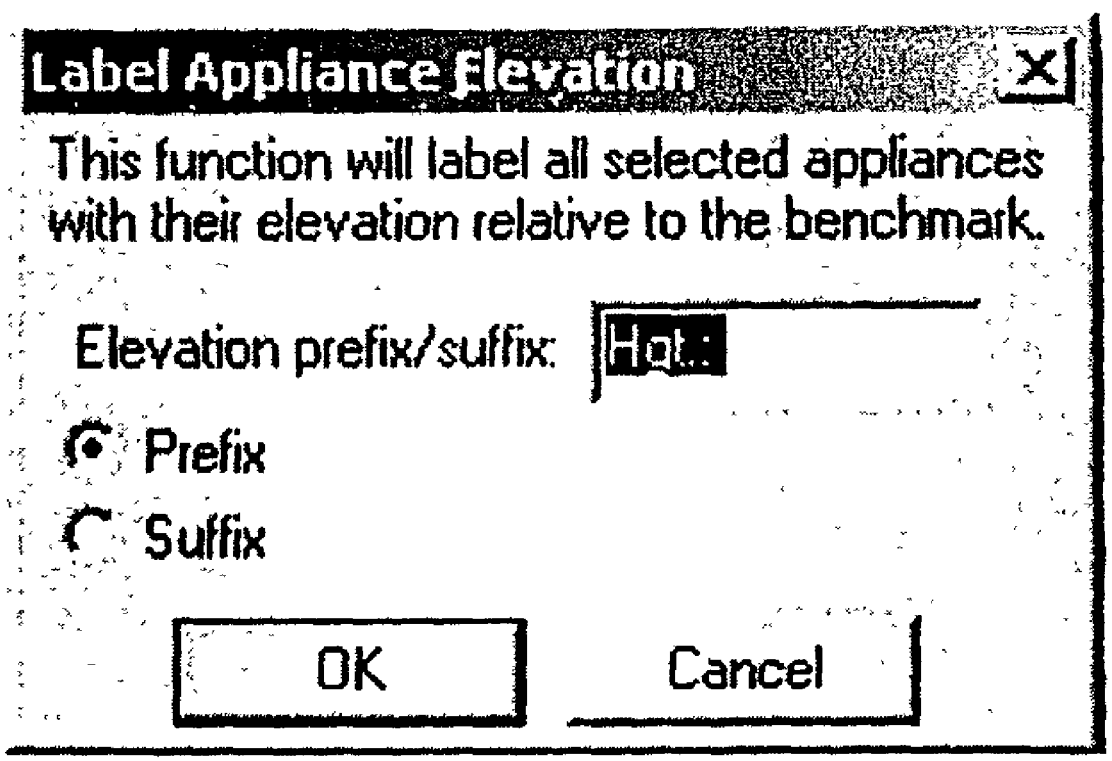
FIG. 5 is a screen-shot of a "Label Appliance Elevation" window.

A "Label Appliance Elevation" tool allows a user to include "Z" dimension information for selected devices. Elevation, or Z height, is measured relative to the current location of a benchmark (which may be placed anywhere by the user). To include the Z height of a specific appliance in the data attached to it, the user may select a symbol in the drawing field and choose "Label Appliance Elevation" in the "Commands" menu. A "Label Appliance Elevation" dialog box (FIG. 5) includes an elevation prefix. New text can be added to or replace entirely the existing prefix, or if "Suffix" is checked, any text entered in the box will follow the elevation. Subsequently, the elevation information appears below the symbol in the drawing and the user may adjust the position of the elevation information.

Figure 6:
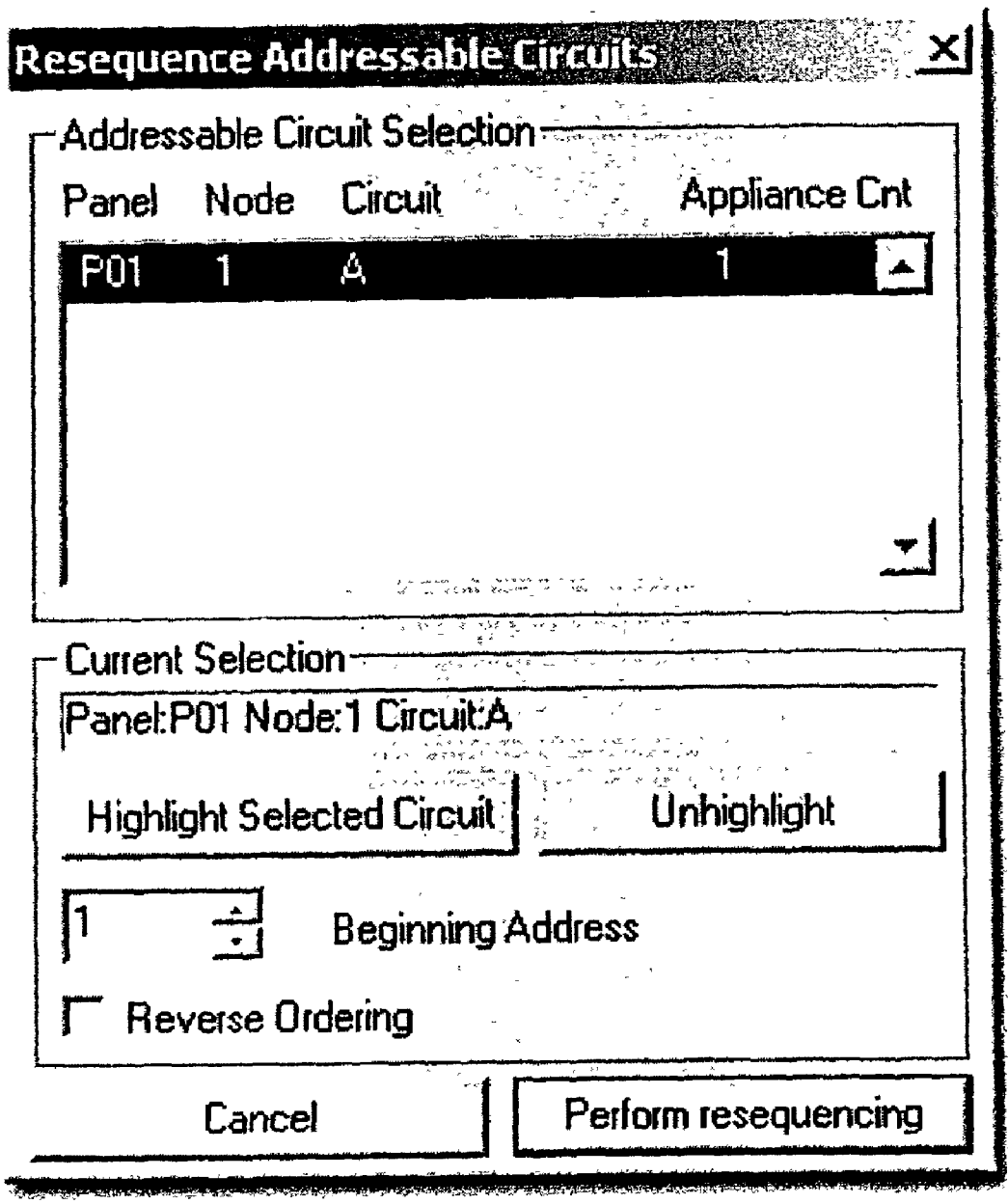
FIG. 6 is a screen-shot of a "Resequence Addressable Circuits" window.

A "Re-sequence by Addressable Circuit" tool changes the designations of all devices that share a particular wire. With one or more circuits in the drawing selected, the user may choose "Resequence by Addressable Circuit" from the "Commands" menu. In a "Resequence Addressable Circuits" window (FIG. 6), all available circuits in the drawing are listed by "Panel," "Node," "Circuit," and the number of appliances involved. After the user selects the circuits he wants to alter, the user may enter a number for the first device in the selected series under "Current Selection." The user may also check a "Reverse Ordering" box to assign the entered number to the last device and successive numbers to devices that precede it in the sequence according to their relative position. Next, the user may click the "Perform resequencing" button to enact the changes made on the dialog.

Figure 7:
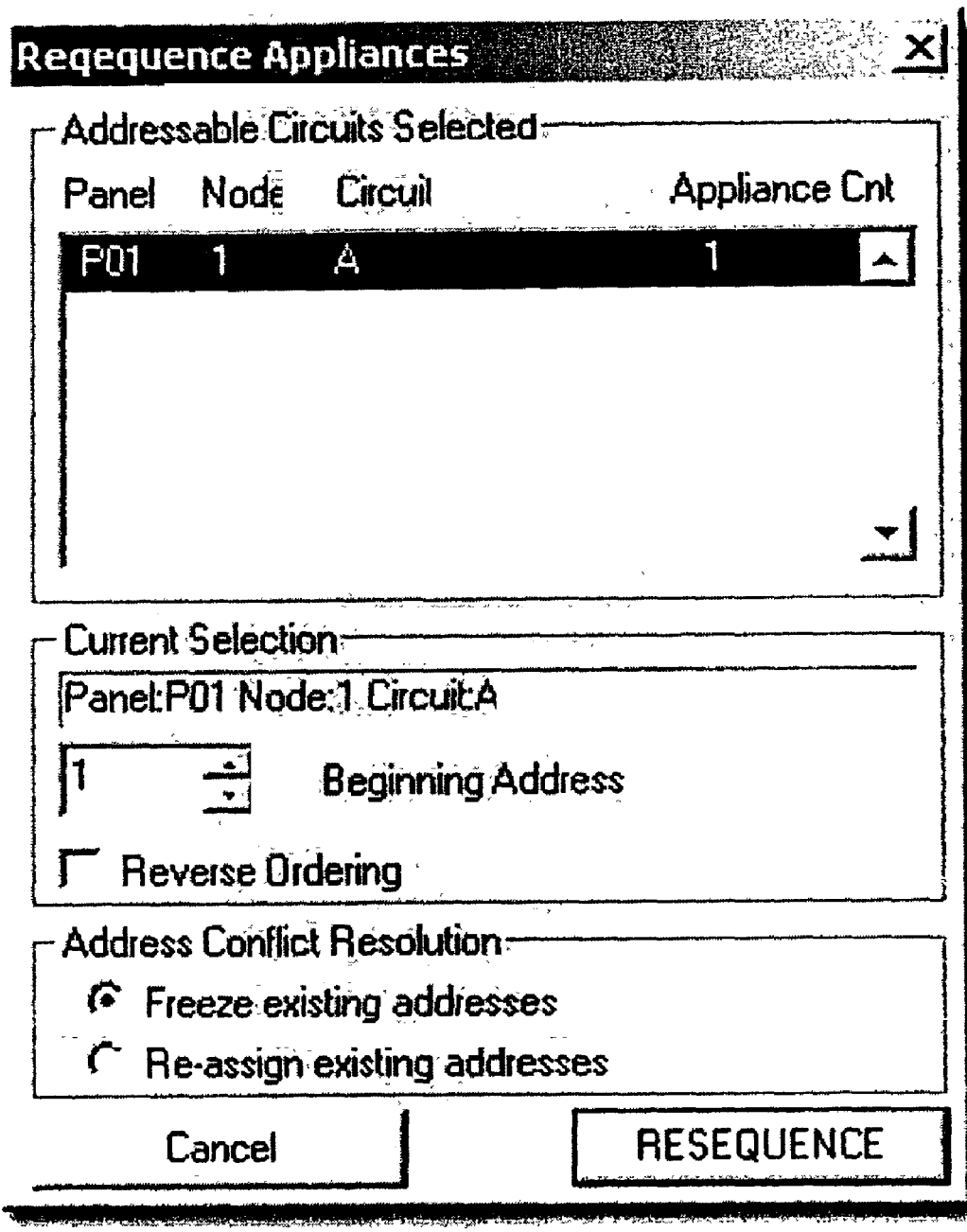
FIG. 7 is a screen-shot of a "Resequence Appliances" window.

A "Re-sequence Selected Appliance" tool changes the designations of all devices that are currently selected. With one or more circuits in the drawing selected, the user may choose "Resequence Selected Appliance" from the "Commands" menu. The "Panel," "Node," and "Circuit" assignment for the chosen device(s) are listed in an "Resequence Appliances" window (FIG. 7). Next, the user may enter the number to assign to the chosen device (or the first device in the series). The user may also check the "Reverse Ordering" box to assign the entered number to the select device and successive numbers to any selected devices that precede it in the sequence according to their relative position.

Figure 8:
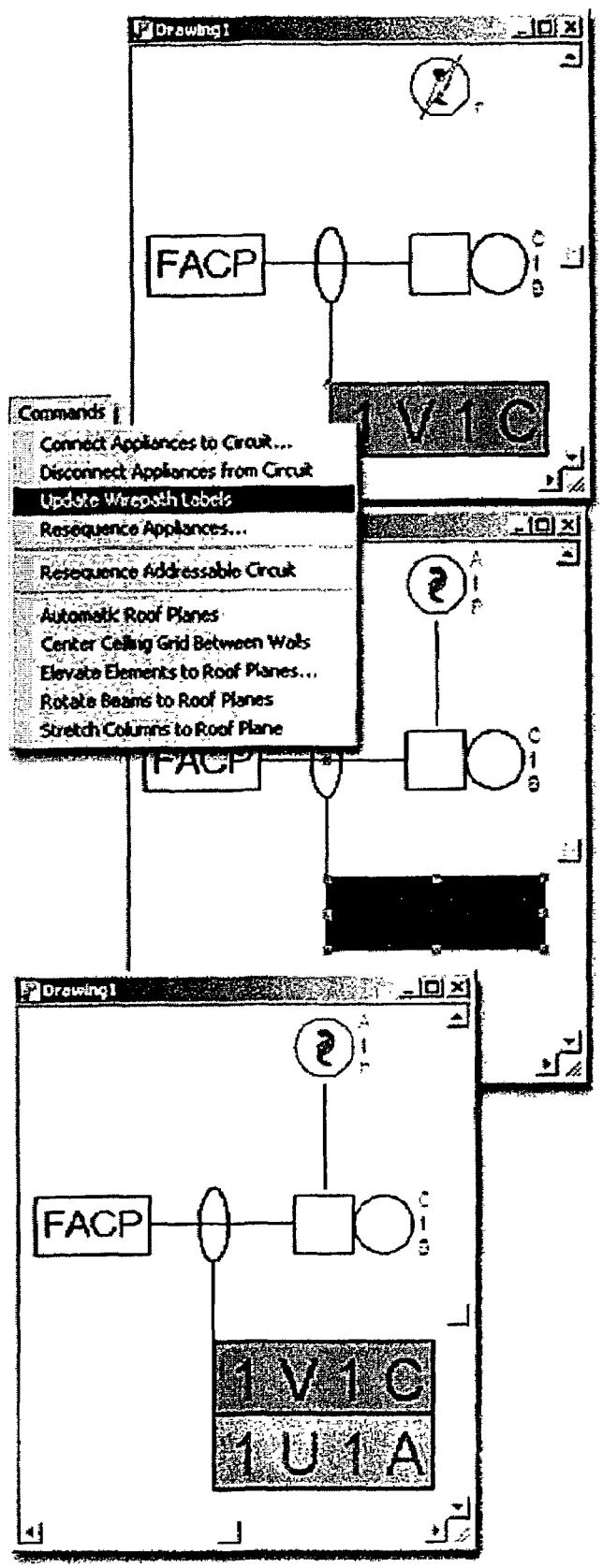
FIG. 8 is screen-shots of a "Update Wirepath Labels" operation.

An "Update Wirepath Labels" tool evaluates cable properties and revises information presented on the wirepath label to reflect current conditions. In the drawing field, the user may select a wirepath label to be revised and choose "Update Wirepath Labels" from the "Commands" menu (FIG. 8).

Figure 9:
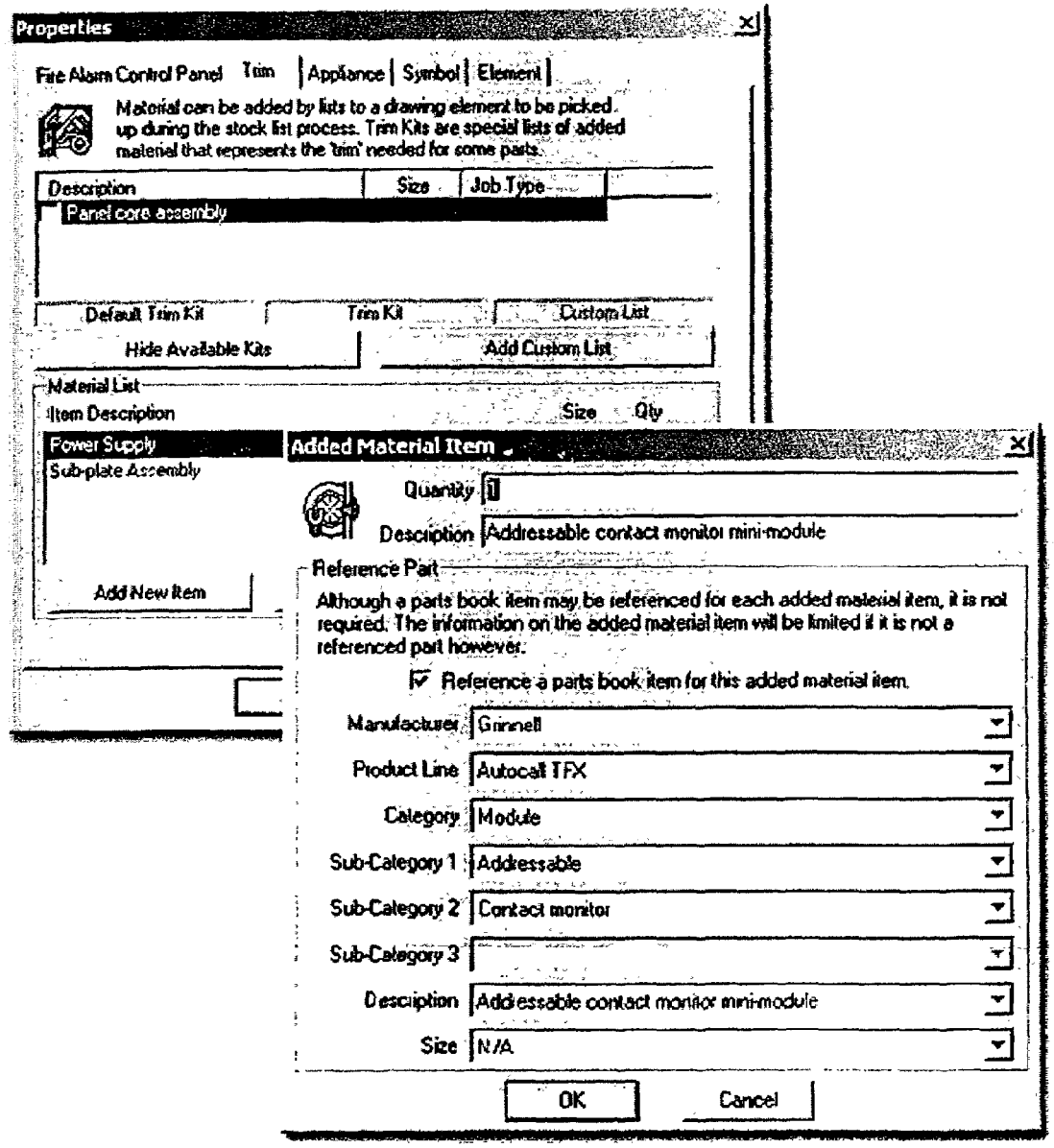
FIG. 9 is a screen-shot of a "Trim" tab of a "Properties" window and an "Added Material Item" window.
Figure 10:
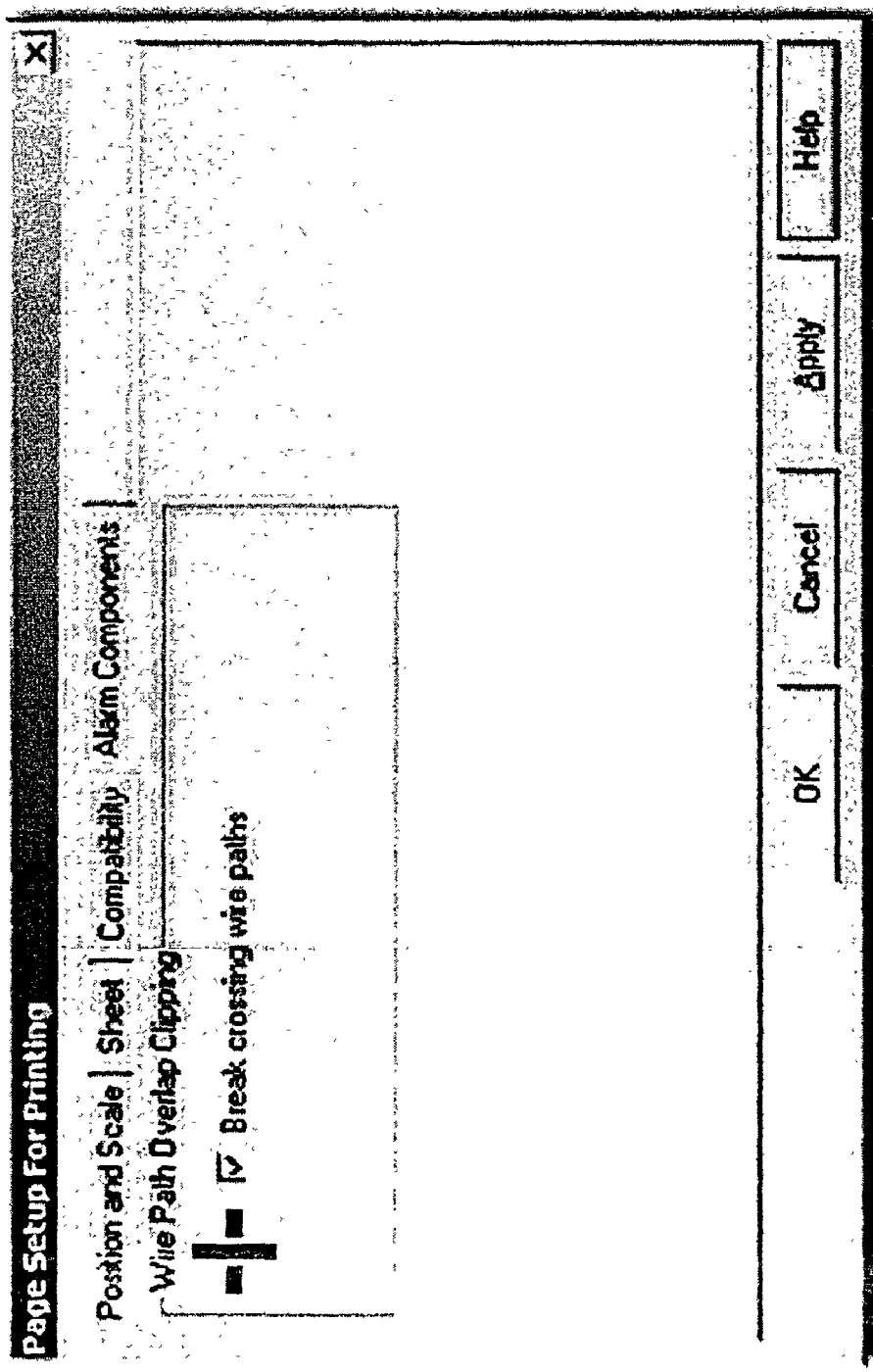
FIG. 10 is a screen-shot of a "Alarm Components" tab of a "Page Setup For Printing" window.

A "Trim" tab allows the user to assign peripherals to selected elements. For example, a "Fire Alarm Control" panel comes with a "Panel Core Assembly" that includes a "Power Supply" and a "Sub-plate Assembly" (FIG. 9). The components of a kit appear in the "Material List" window. New parts can be added to the list with an "Add new parts" button, and parts selected in the "Materials List" window can be customized with an "Edit parts" button. Both the "Add new parts" and the "Edit parts" buttons open a "Added Material Item" page. Checking the "Reference a parts book . . . " box draws item characteristics from the parts database. If the user wants to include an item not found in the "Parts Book," the user may uncheck the box and describe the item on the lines provided. In order to make wire paths nearer the viewer appear in front of those further away, the user may check a "Break crossing wire paths" box under "Wire Path Overlap Clipping" on the "Alarm Components" tab (FIG. 10).

Figure 11:
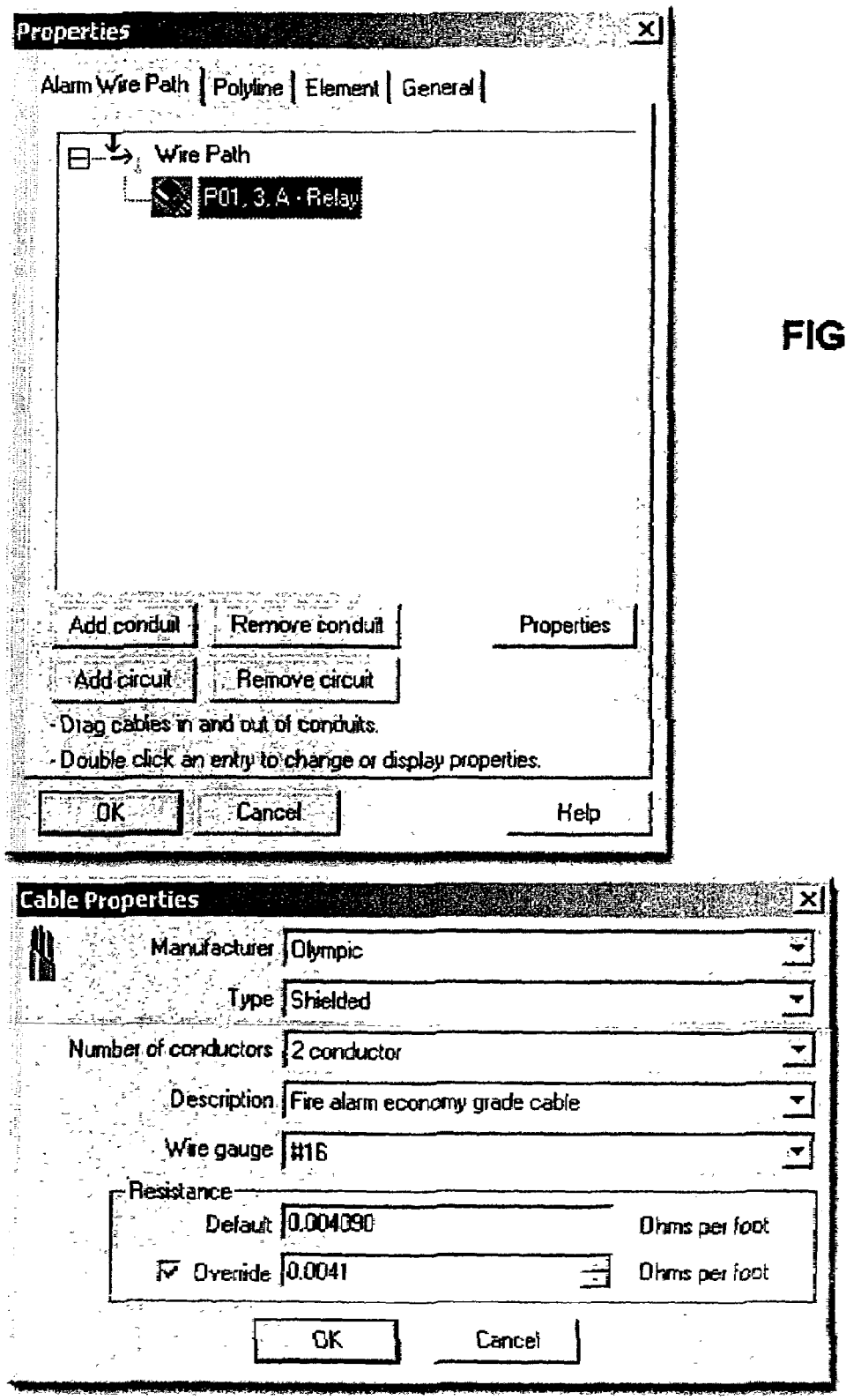
FIG. 11 is a screen-shot of a "Cable Properties" window.

The operation of the "Wire Path" tool depends on the items connected by the wire path being operated on. If the cursor is equipped with the wire path tool and used in an open space with no appliances or panels involved, the result is a wire path without any cable properties. However, if the wire path equipped cursor is used to connect an appropriately provisioned panel to a relay device, clicking the "Cable" icon on the "Circuit Properties" page opens a "Cable Properties" dialog (FIG. 11). To alter cable properties, the user may choose from the variables listed on the "Manufacturer," "Type," "Number of Conductors," "Description," and "Wire Gage" drop downs. Under "Resistance," checking the "Override" box allows the user to edit the Ohms per foot ratio associated with the cable.

Figure 12:
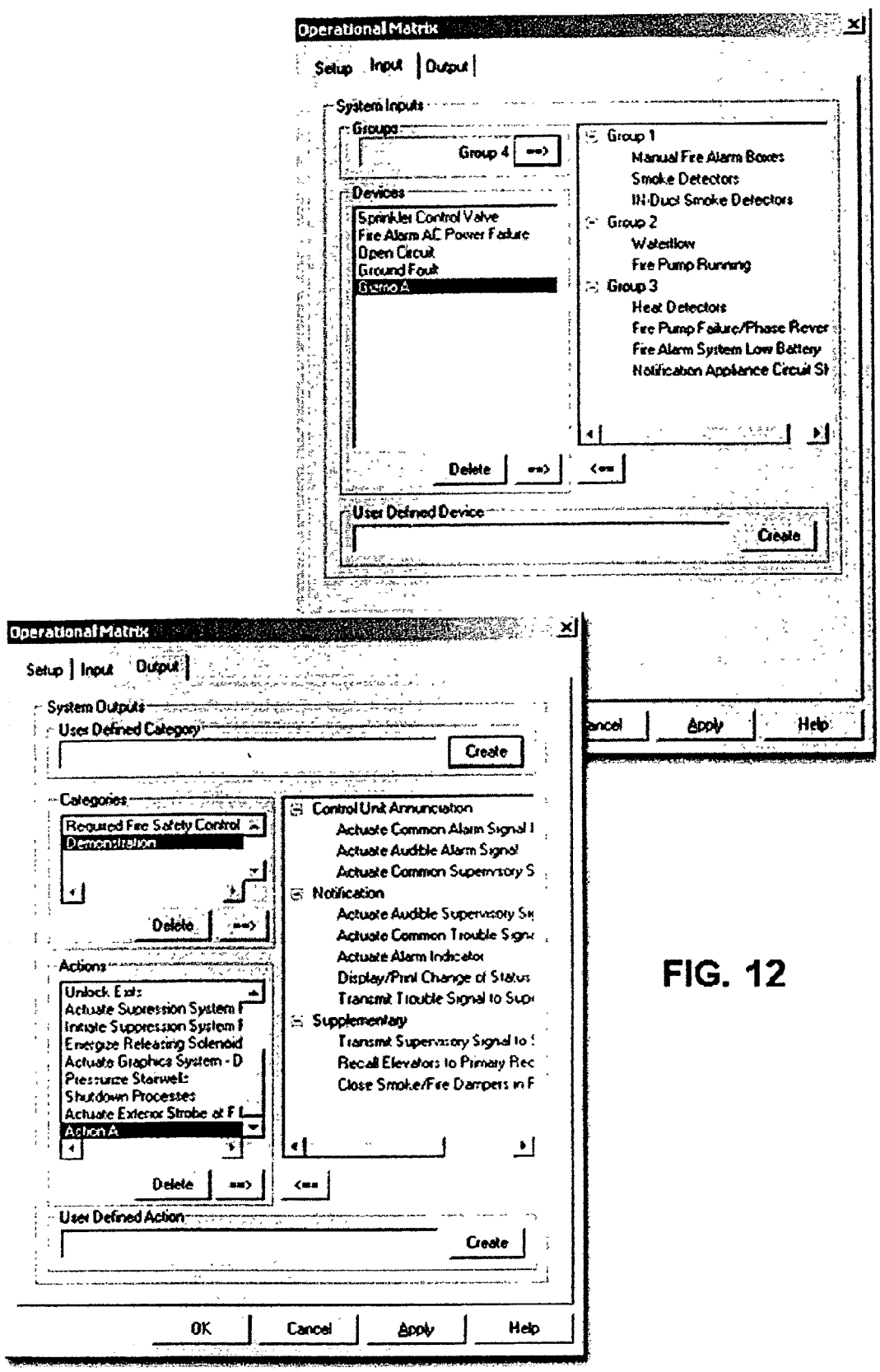
FIG. 12 is screen-shots of an "Operational Matrix" window.

The "Matrix" tool allows the user to define a sequence of operations by relating system inputs to system outputs in a relational grid. To use the "Matrix" grid, the user may open the "Tools" menu and choose "Matrix" then, on the submenu, choose "Operational Matrix." On the "Setup" tab of the "Operational Matrix" dialog the user may give the grid a name in a "Title" box. Under "System Inputs" on a "Input" tab, the user may divide the devices into groups by establishing a "Group" in the window with the arrow key and double-clicking the available device names (FIG. 12). To add a device to the list, the user may enter a name for the device in the "User Defined Device" window and then click "Create." The user may also double-click on a new addition in the "Devices" window to add the device to the desired group. On the "Output" tab, the user may use the arrow key to set "Categories" for devices selected on the "Input" tab. Under "Action", the user may select from the listed measurement actions.

Figure 13:
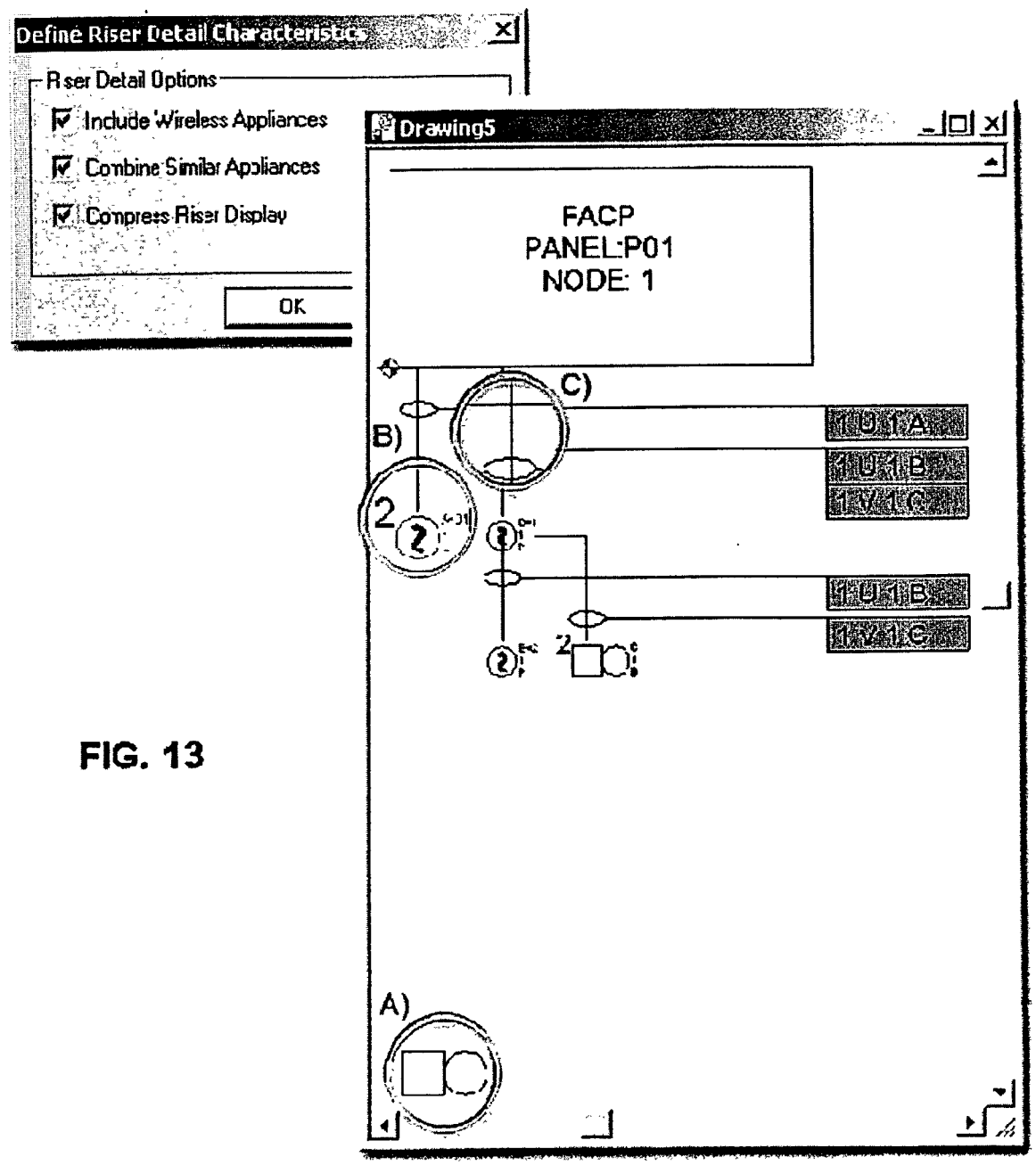
FIG. 13 is a screen-shot of a "Define Riser Details Characteristics" window and a riser detail "Drawing" window.

The "Riser Detail" tool creates a separate schematic (rather than diagrammatic) presentation of a drawing. To generate this schematic view, the user may choose "Riser Detail" from the "Tools" menu. Three options are available on the "Define Riser Details Characteristics" dialog (FIG. 13) If there are appliances manually connected to panels without wire paths (i.e., using the "Connect appliances" button on the "Alarm Circuit" toolbar) in the drawing that the user wants to appear in the "Riser Detail," the user may check "Include Wireless Appliances." "Combine Similar Appliances" places the number of appliances next to a symbol for that appliance group for each circuit. "Compress Riser Display" removes excess space between items, reducing the area consumed by the schematic. Activating "Riser Detail" opens a new view of the drawing. If the drawing field is maximized to full screen display, the "Riser Detail" window will also open in full screen mode. To view the original drawing window, the user may click either the "Restore Down" or "Minimize" icons in the Windows frame. Note that changes made to the "Riser Detail" do not appear in the original drawing and vice versa. To add items to the "Riser Detail," the user may edit the original drawing and generate a new "Riser Detail."

Alarm System Design Toolbars

Icons may serve as shortcuts for frequently used tools and commands. These icons are sometimes gathered when they invoke related commands in groups called toolbars. Toolbars can be moved around the screen for convenience and space considerations. They can also be turned on and off (made visible or hidden) as desired. "Tool Tips" appear on the "Status" bar when the cursor lingers over an icon button.

A "Circuit" toolbar controls device connection methods within the drawing field. "Global Properties" tools are used to define default properties for all subsequently drawn elements. An "Input Box" is used for entering specific points on the X, Y, Z axes. A "Main Toolbar" contains many basic Windows functions in addition to a "Layer Manager" and a "Show/Hide parts tree" button. A "Parts Tree" is an area between the vertical toolbars and the drawing window, where the user can store pieces of drawings for use at a later time. A "Product Line" toolbar displays manufacturer, product line and part number information for an insertion tool. A "Render" toolbar shifts a drawing's appearance from a "wire" display mode to a "Shaded" display mode and vice versa. A "Select" toolbar controls the cursor arrow, the benchmark location and the "Rectangular Selection with Crossing" functions. A "Tools" toolbar activates various functions to aid in alarm system design. This includes such functions as drawing walls, lines and shapes. A "Camera" toolbar is a condensed version of the "View Tools" commands.

Figure 14:
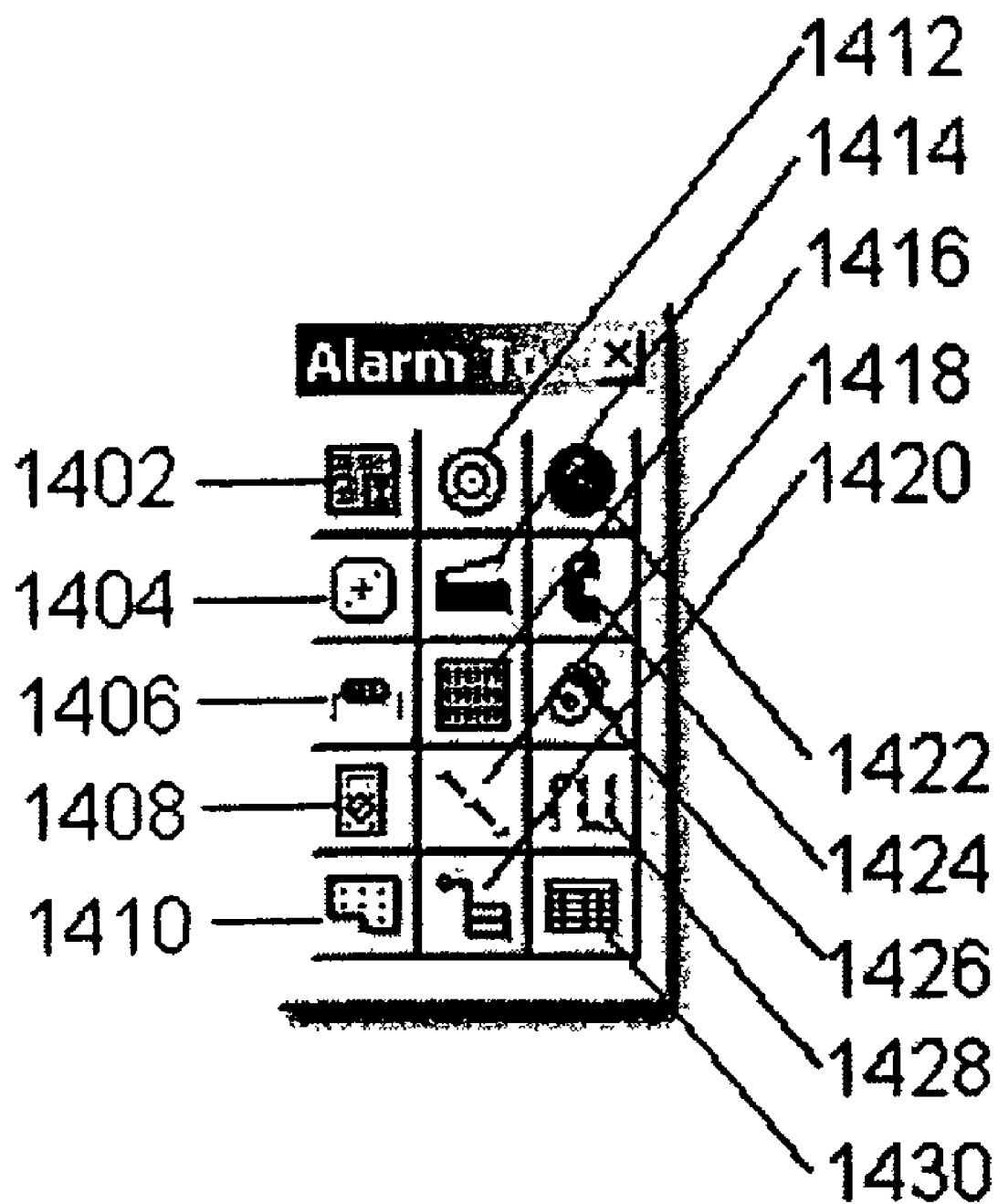
FIG. 14 is a screen-shot of an "Alarm Tools" toolbar.

An "Alarm Tools" toolbar includes a plurality of icons used to place a variety of alarm components on the drawing field (FIG. 14). Clicking any of the icons in the "Alarm Tools" toolbar activates the corresponding tool. Dialog boxes emerge with the activation of several of the tools, presenting essential characteristics of the elements to be implemented. With a dialog adjusted to user's liking, or if none appears, the user may move the cursor to the desired location within the drawing and left-click to place the selected alarm component.

A "Panel" icon 1402 equips the cursor to place a main or local panel into the drawing field. A "Module" icon 1404 equips the cursor to place a contact monitor, a detector monitor or a line isolator into the drawing field. An "EOL Device" icon 1406 equips the cursor to place an end line resistor element into the drawing field. An "Ohm Meter" icon 1408 equips the cursor to place a measuring device on any appliance in the drawing field. A "Software Zone" icon 1410 is a boundary tool that creates area designations for control panel programming.

An "Initiator" icon 1412 equips the cursor to place a smoke detector, heat sensor or manually activated alarm element into the drawing field. A "Relay Device" icon 1414 equips the cursor to place a relay device into the drawing field. A "Power Supply" icon 1416 equips cursor to place an energy source into the drawing field. A "Line of Appliances" icon 1418 is a quick way to layout a string of connected initiators, notifiers, and/or modules. A "Wire Path Label" icon 1420 equips the cursor to place a tag baring relevant location and assignment information anywhere along a stretch of cable.

A "Notifier" icon 1422 equips the cursor to place bells, strobes, horns or chimes into the drawing field. A "Communications Telephone" icon 1424 equips the cursor to place a communications telephone element into the drawing field. A "Wire Path" icon 1426 equips the cursor to connect panels, appliances, and/or layout wire(s). A "Grid of Appliances" icon 1428 is a quick way to layout a network of connected initiators and/or modules. A "Reports" icon 1430 offers a number of information gathering and presentation options.

Alarm System Design Reports

Figure 15:
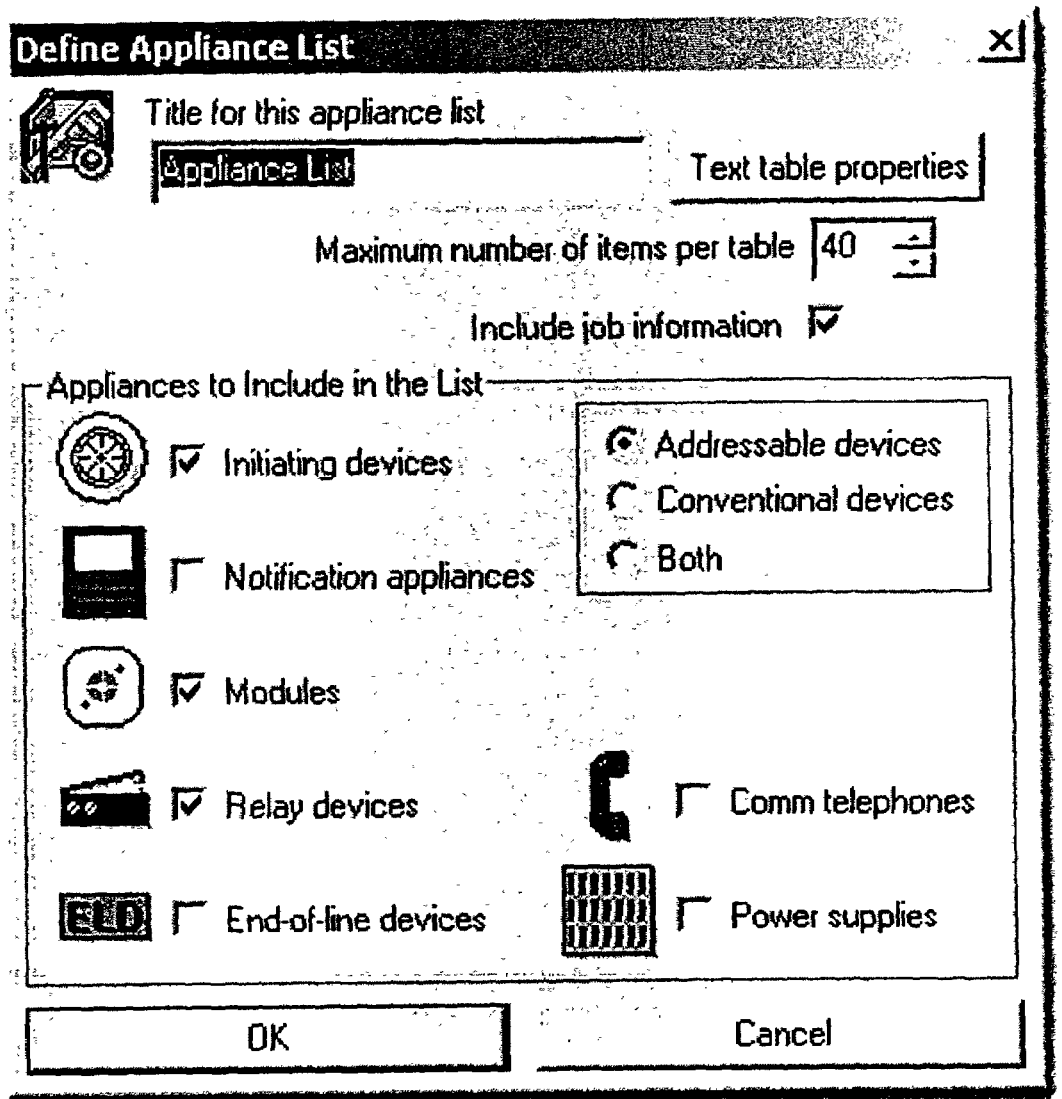
FIG. 15 is a screen-shot of a "Define Appliance List" window.
Figure 16:
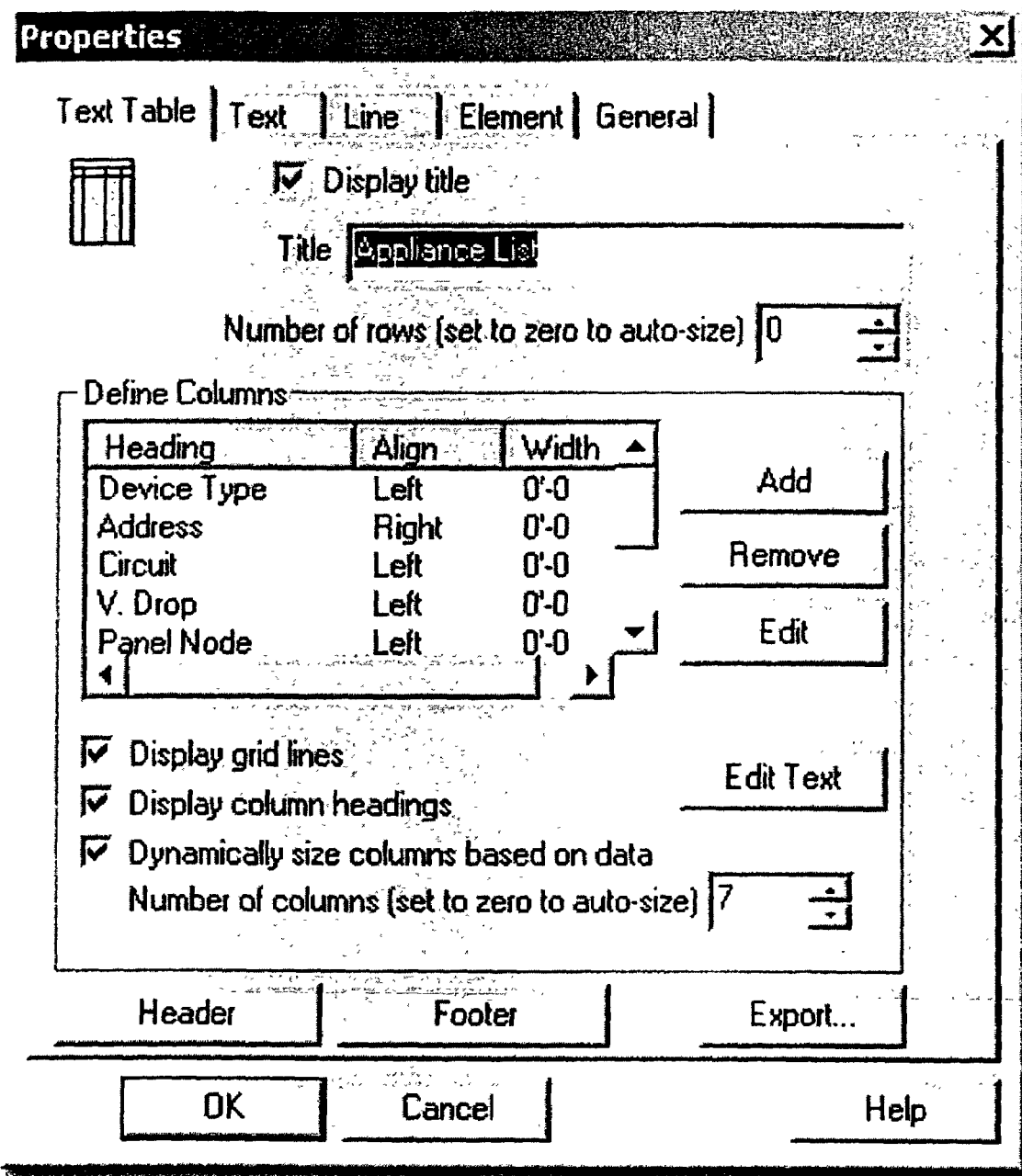
FIG. 16 is a screen-shot of a "Text Table" tab of a "Properties" window.

The user may have one or more reports generated by the CAD system. To generate an "Appliance List" report, the user may use an "Appliance List" tool. The "Appliance List" tool compiles location and assignment information for each Initiator, Notifier, Module, Relay Device, EOL Device and Comm Phone in the drawing before equipping the cursor to place the data, in chart form, into the drawing. To use the "Appliance List" tool, the user may choose "Appliance List . . . " from the "Tools" menu. On the "Define Appliance List" dialog, the user may check the appliances to be included (FIG. 15). On a "Text Table" tab, the user can change the title of the chart and add or remove information from the display (FIG. 16). Next, the user may left-click in the drawing to place the chart (FIG. 17). A ghost image of the chart follows the cursor to help the user locate the information in best possible position. Once the chart is placed, it can be dragged to a new location and/or modified.

Figure 18:
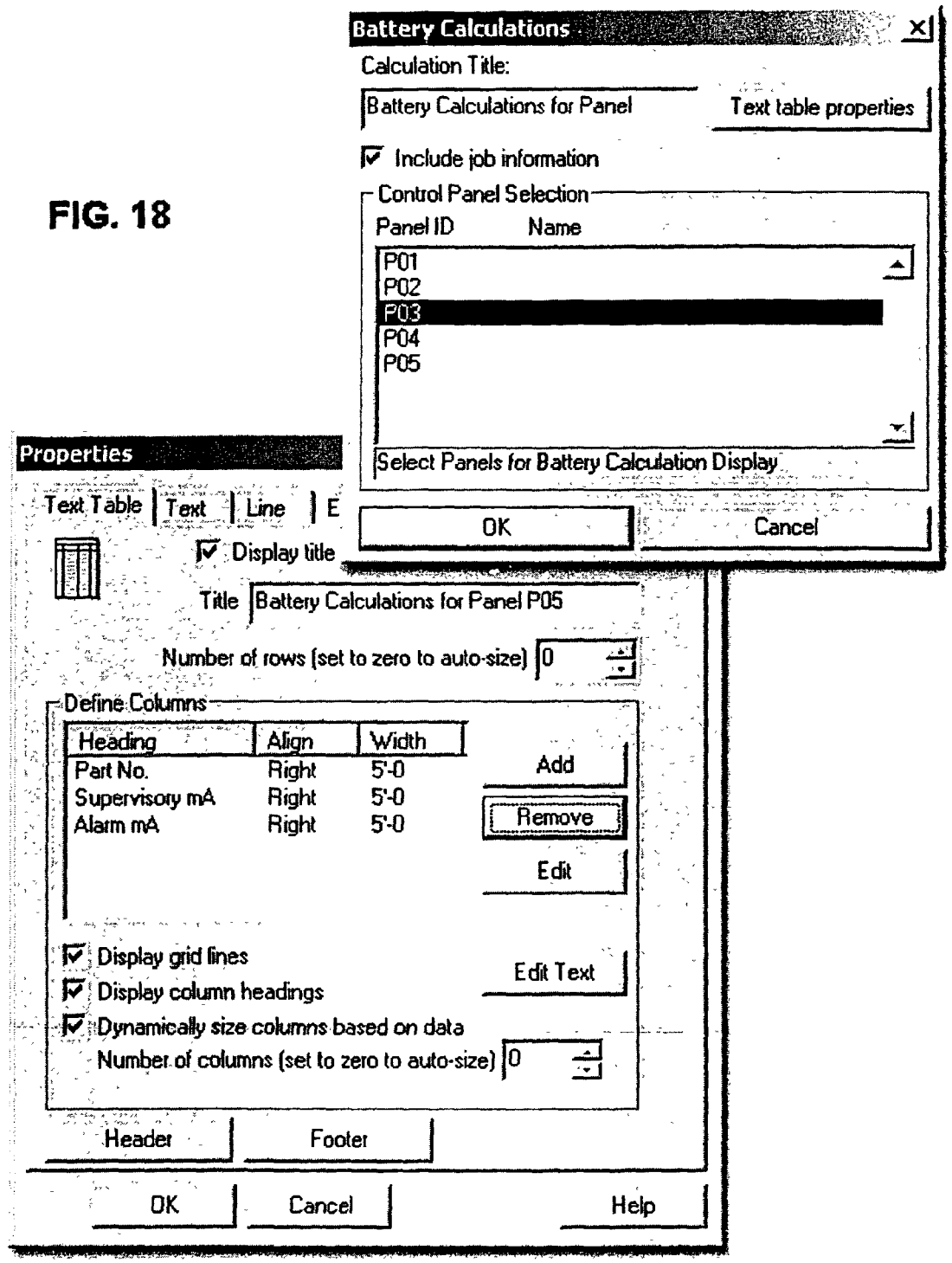
FIG. 18 is a screen-shot of a "Battery Calculations" window.

To generate a "Battery Calculations" report, the user may use a "Battery Calculations" tool. The "Battery Calculations" tool compiles parts information and computes electrical current requirements for a given alarm panel before equipping the cursor to place the data, in chart form, into the drawing. From the "Tools" menu, the user may choose "Battery Calculations." On a "Battery Calculations" dialog, the user may choose the desired panel(s) from the "Control Panel Selection" window (FIG. 18). On a "Text Table" tab change the title of the chart and add or remove information from the display. Finally, the user may left-click in the drawing to place the chart (FIG. 19).

To generate a "Bill of Materials" report, the user may open the "Print Alarm Reports" submenu from the "File" menu and choose "Bill of Materials . . . . " A "Bill of Materials" report compiles a wide variety of product information for each item implemented in the drawing. On a "Define B.O.M. Characteristics" dialog, the user may check the manufacturers and fields to be included, then give the list a specific title (FIG. 20). In addition, the user may click the "Text table properties" button to change the title of the chart and add or remove information from the display.

Figure 21:
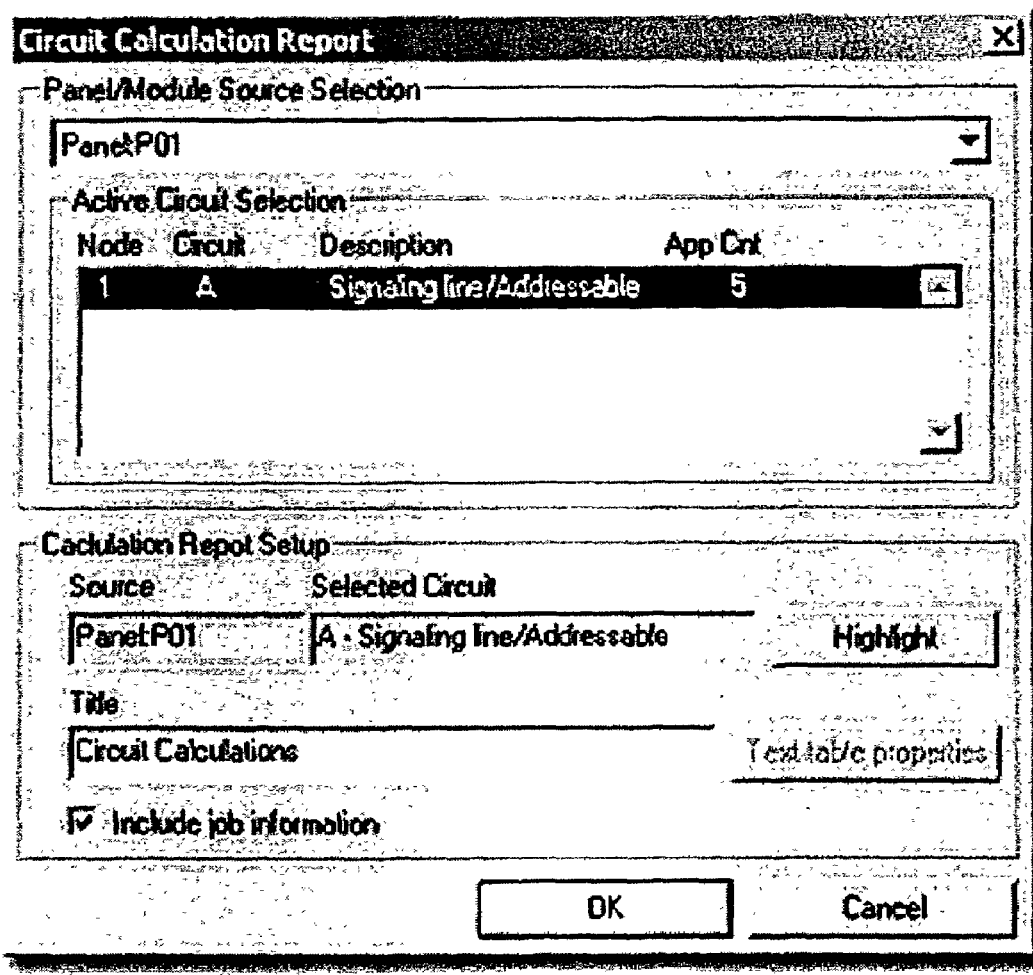
FIG. 21 is a screen-shot of a "Circuit Calculations Report" window.

To generate a "Circuit Calculations Report," the user may open the "Print Alarm Reports" submenu on the "File menu and choose "Circuit Calculations . . . . " A "Circuit Calculations Report" is a print-ready compilation of the "Part Number," "Appliance Description," and "Distance" from each appliance to the control panel in addition to the "Current," "Voltage," and "Voltage Drop" of each device sharing the selected circuit. On a "Circuit Calculations Report" dialog, the user may choose the desired panel from the "Panel/Module Source Selection" drop-down (FIG. 21). From the "Active Circuit Selection" window, the user may choose the circuit(s) he wants to include in the calculation and then click a "Highlight" button to confirm the choice. If the highlighted circuit is incorrect, the user may choose another circuit from the window above. On the "Text Table" tab, the user may change the title of the report and add or remove information from the display. Subsequently, the chart may be placed on the drawing (FIG. 22).

Figure 23:
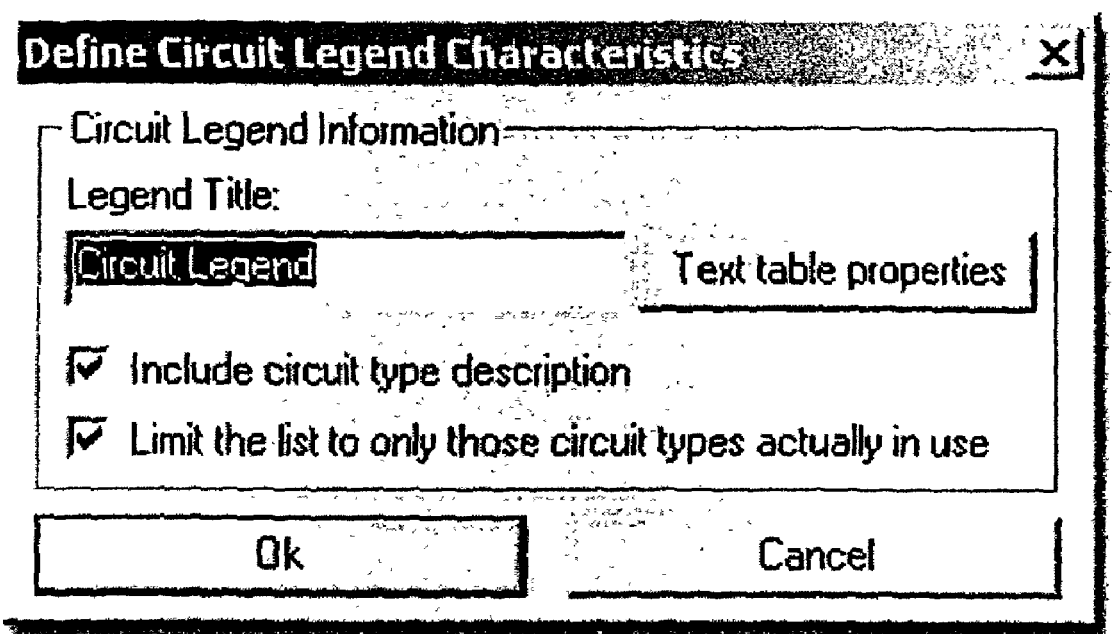
FIG. 23 is a screen-shot of a "Define Circuit Legend Characteristics" window.
Figure 24:
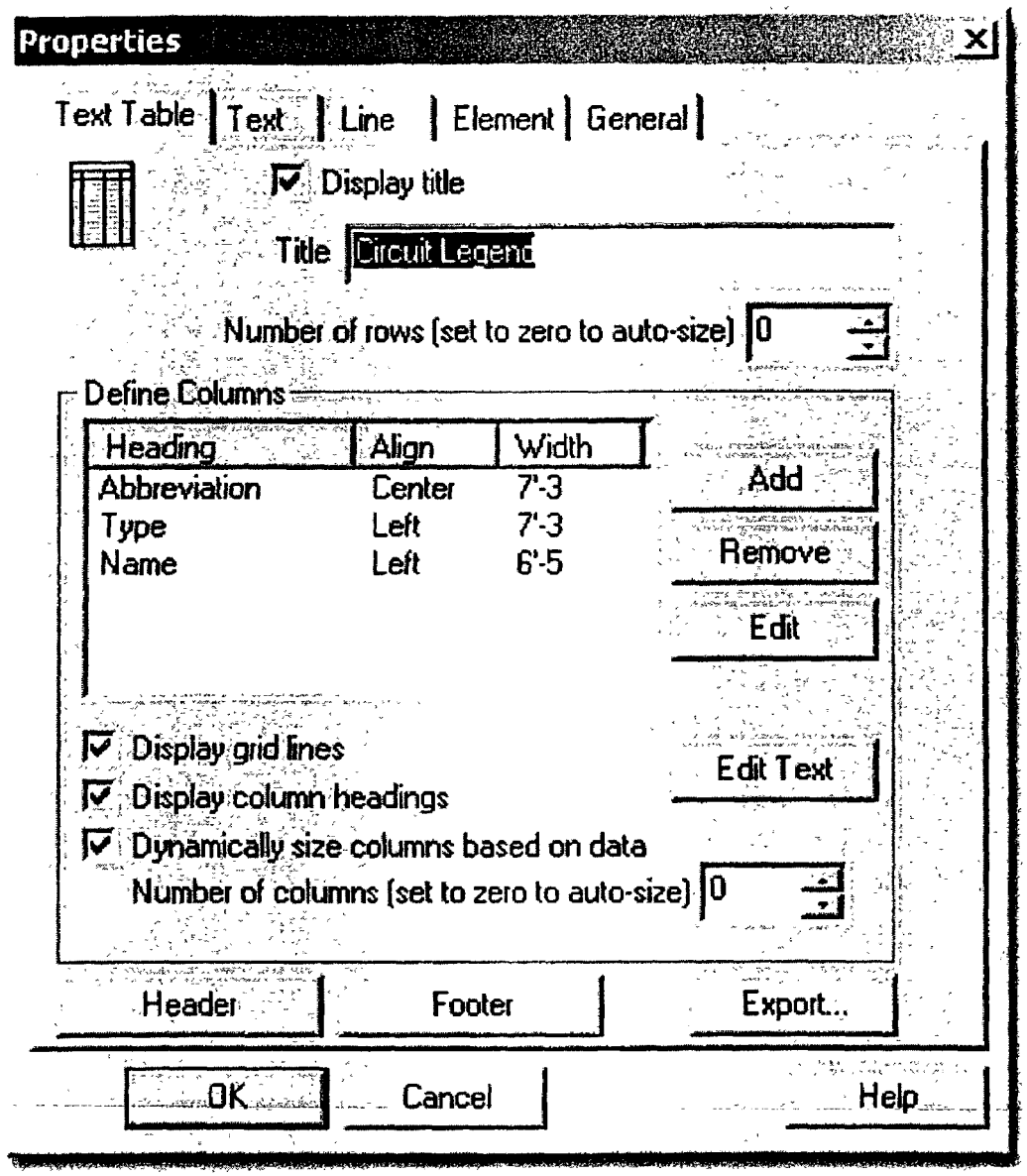
FIG. 24 is a screen-shot of a "Properties" window.

To generate a "Circuit Legend" report, the user may open the "Print Alarm Reports" submenu from the "File" menu and choose "Circuit Legend . . . . " A "Circuit Legend" report is a compiled "Abbreviation," "Name" and "Type" of each circuit implemented in the drawing. On the "Define Circuit Legend Characteristics" dialog, the user may check inclusion and limit parameters and then give the list a specific title (FIG. 23). In addition, the user may click the "Text table properties" button to change the title of the chart and add or remove information from the display (FIG. 24).

Figure 25:
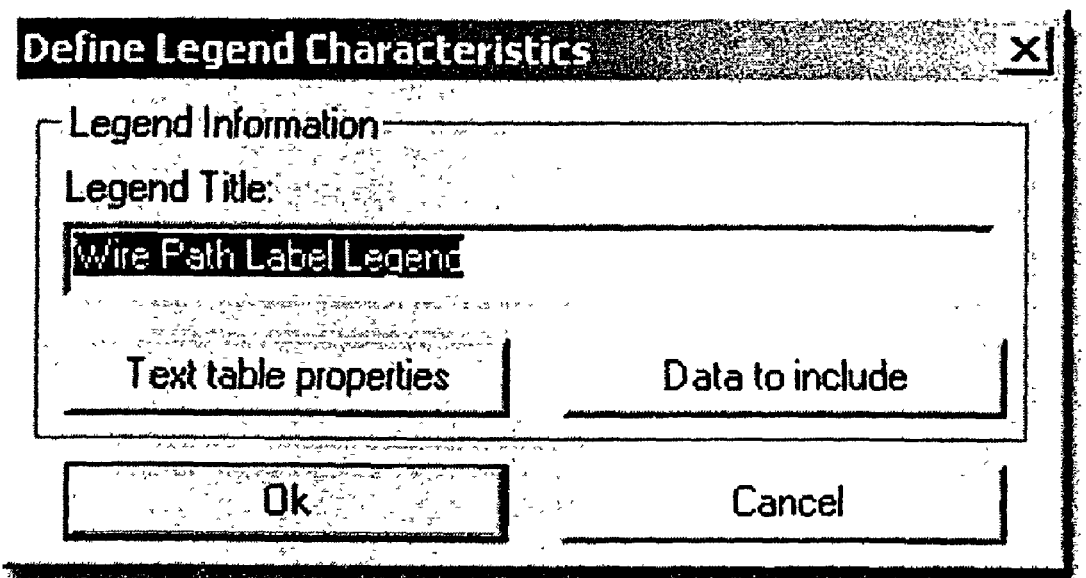
FIG. 25 is a screen-shot of a "Define Legend Characteristics" window.
Figure 26:
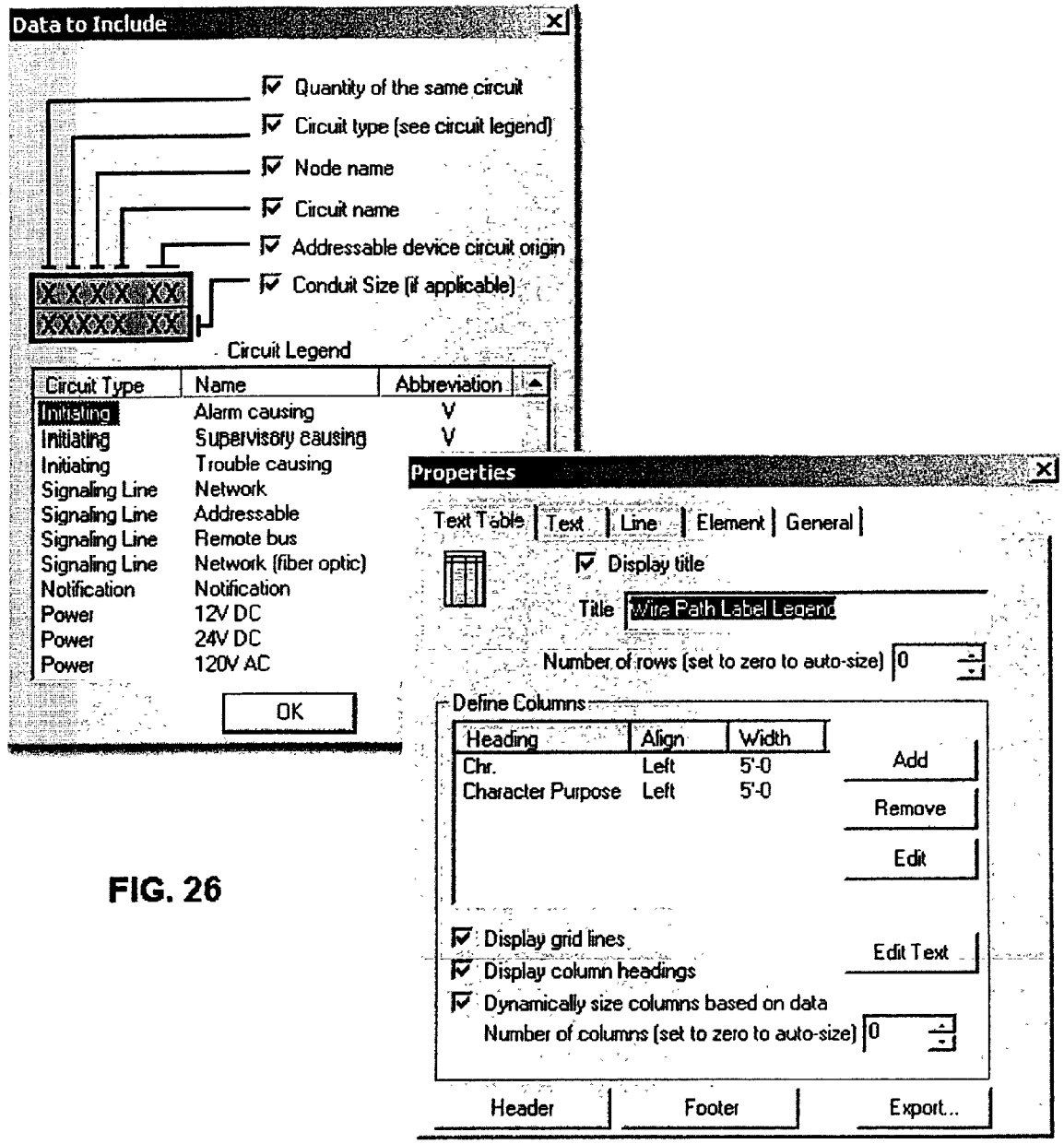
FIG. 26 is a screen-shot of a "Data to Include" window.

To generate a "Wire Path Label Legend" report, the user may open the "Print Alarm Reports" submenu from the "File" menu and choose "Wire Path Label Legend . . . . " A "Wire Path Label Legend" report includes the purpose of each wire path label implemented in the drawing. On a "Define Legend Characteristics" dialog, the user may give the report a specific title (FIG. 25). The "Data to Include" dialog defines a key which relates abbreviation placement information to circuit characteristics (FIG. 26). The user may check the boxes on the top half of the dialog to include or exclude symbol locations from wire path labels. "Circuit Types," their "Names," and the corresponding "Abbreviations" are listed. In addition, the user may click the "Text table properties" button to change the title of the chart and add or remove information from the display.

Figure 27:
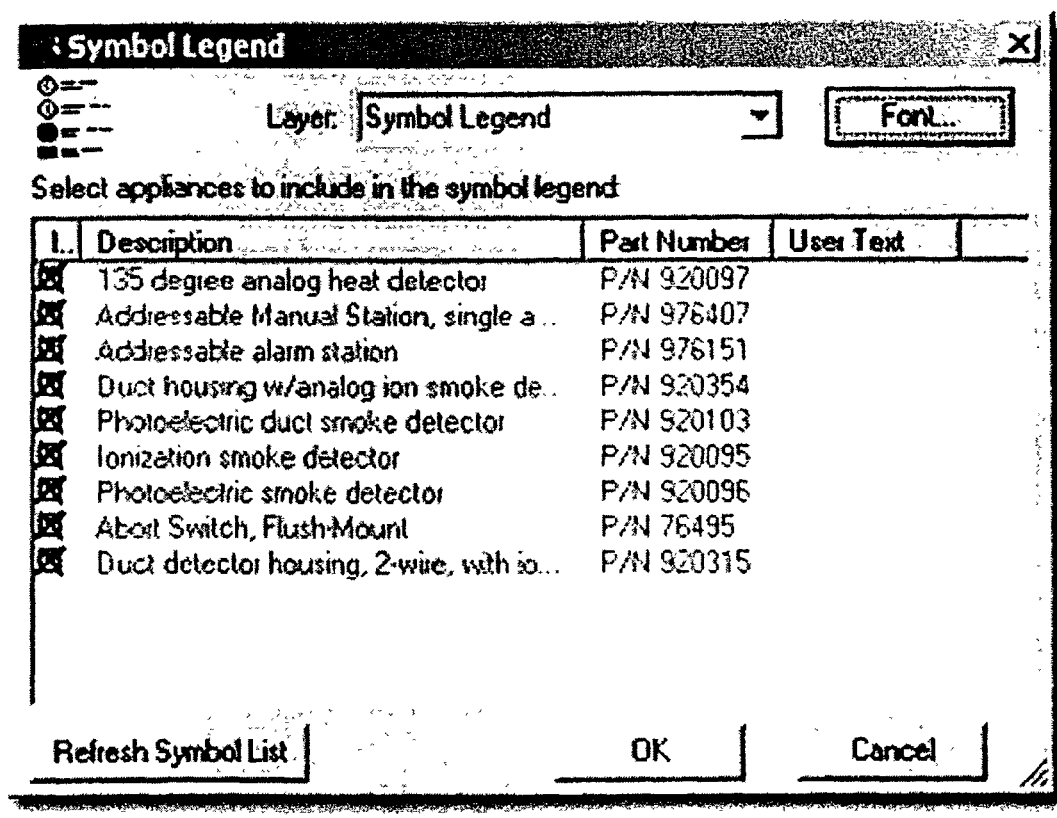
FIG. 27 is a screen-shot of a "Symbol Legend" window.

A "Symbol Legend" tool searches for all unique device symbols, finds a part number and description for each in the "Parts Database," and equips the cursor to place the compiled information into the drawing. To generate a "Symbol Legend," the user may open the "Tools" menu and choose "Symbol Legend" (FIG. 27). If the user does not want the legend located on the default layer, the user may choose another layer from a "Layer" drop-down. A "Font . . . " button allows the user to change the appearance of "Product Descriptions," "Parts Numbers," and "User" in the drawing. Under "Select appliances to include in the symbol legend," the user may check boxes in the "Include" column to establish which device symbols will appear on the legend. The user may click on any of the "Descriptions," "Parts Numbers," or "User Text" and key in any changes or additions he wants to make.

Alarm System Design Properties

Figure 28:
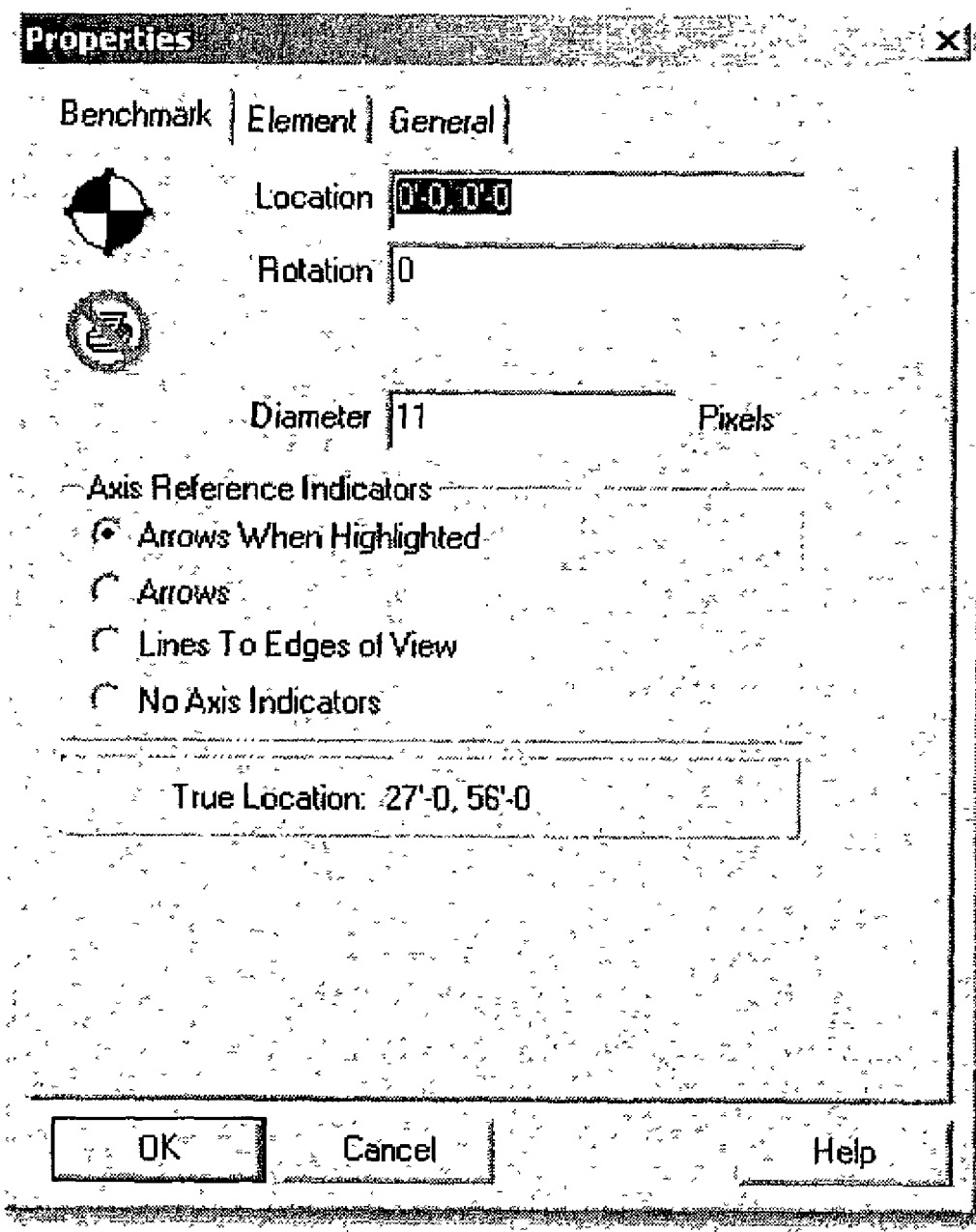
FIG. 28 is a screen-shot of another "Properties" window.

Most of the elements in a drawing are associated with certain device "properties" which may be modified by the user and stored in the data structure(s). The "Properties" page for any element displays various characteristics unique to that element (FIG. 28). Features like height, width, length, color, shape, etc. can be altered from a properties page. To access the properties page for a given element, the user may (i) double-click on the element; (ii) right-click on the element and choose "Properties;" (iii) select the element and press the "Properties" button on the "Actions" toolbar; (iv) select the element, drop down the "Settings" menu and choose "Properties . . . ;" or (v) select the element and strike the key combination "Alt+Enter."

Figure 29:
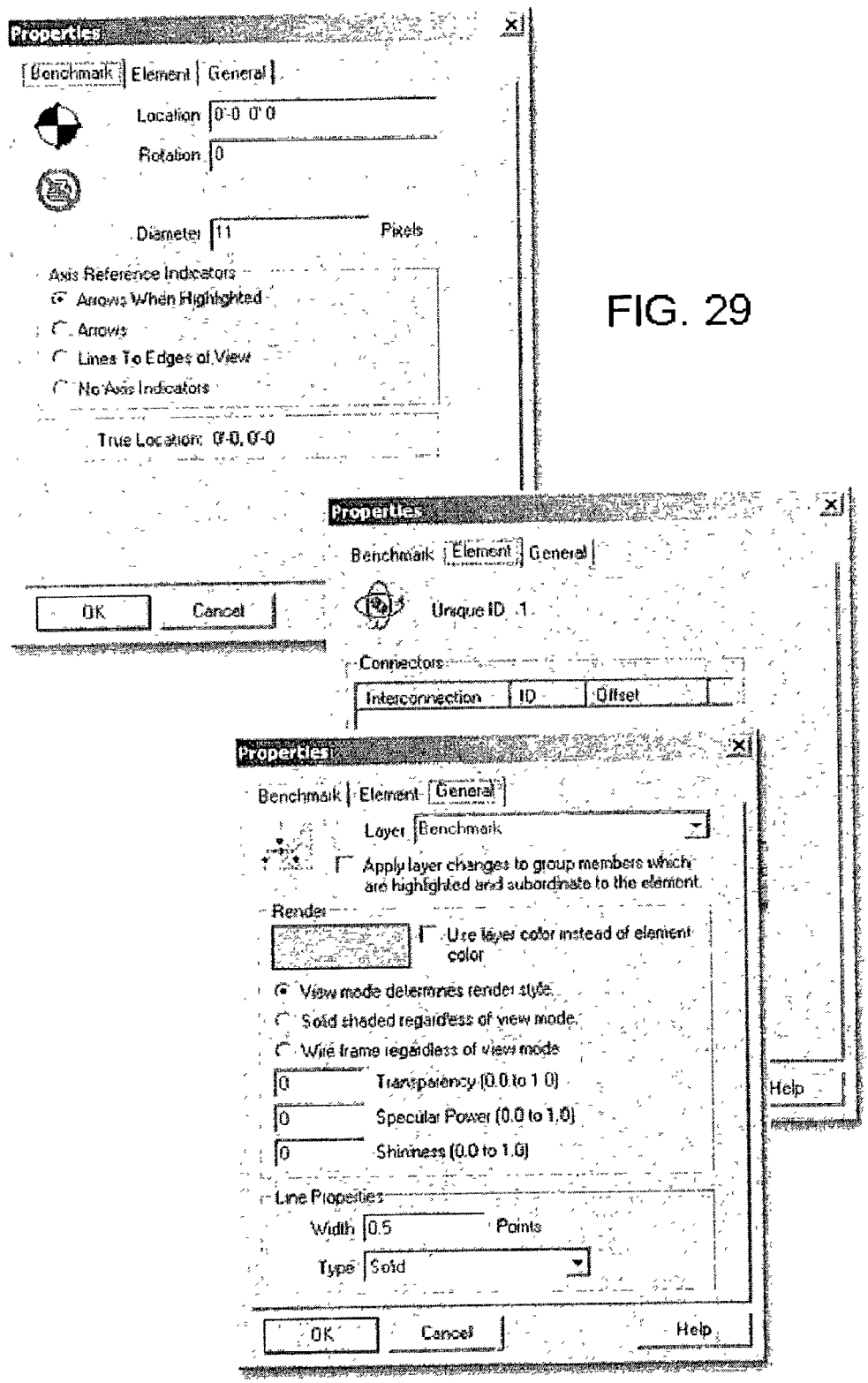
FIG. 29 is screen-shots of a "Benchmark" tab, an "Element" tab, and a "General" tab of a "Properties" window.
Figure 30:
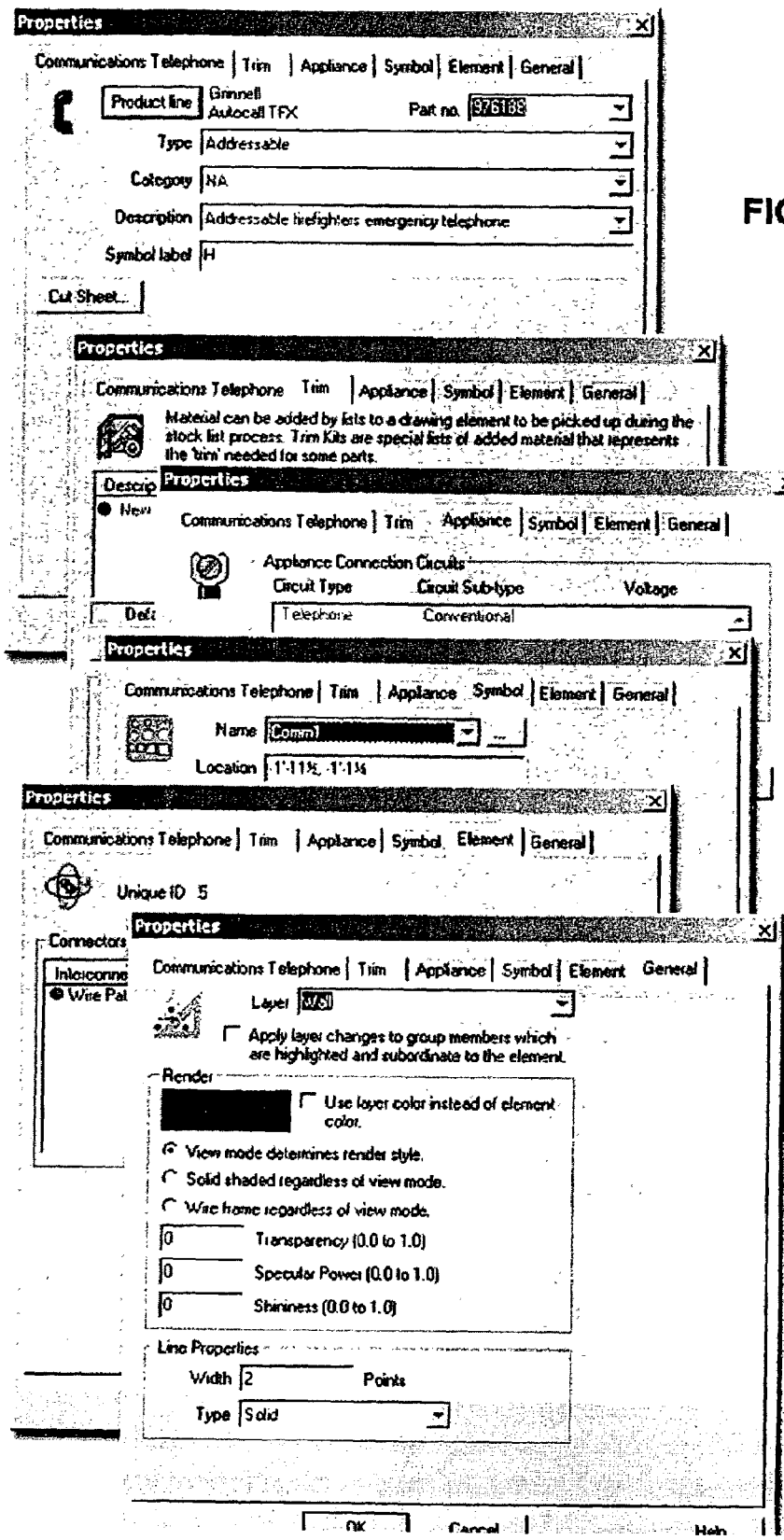
FIG. 30 is screen-shots of various tabs of a "Comm Phone Properties" window.
Figure 31:
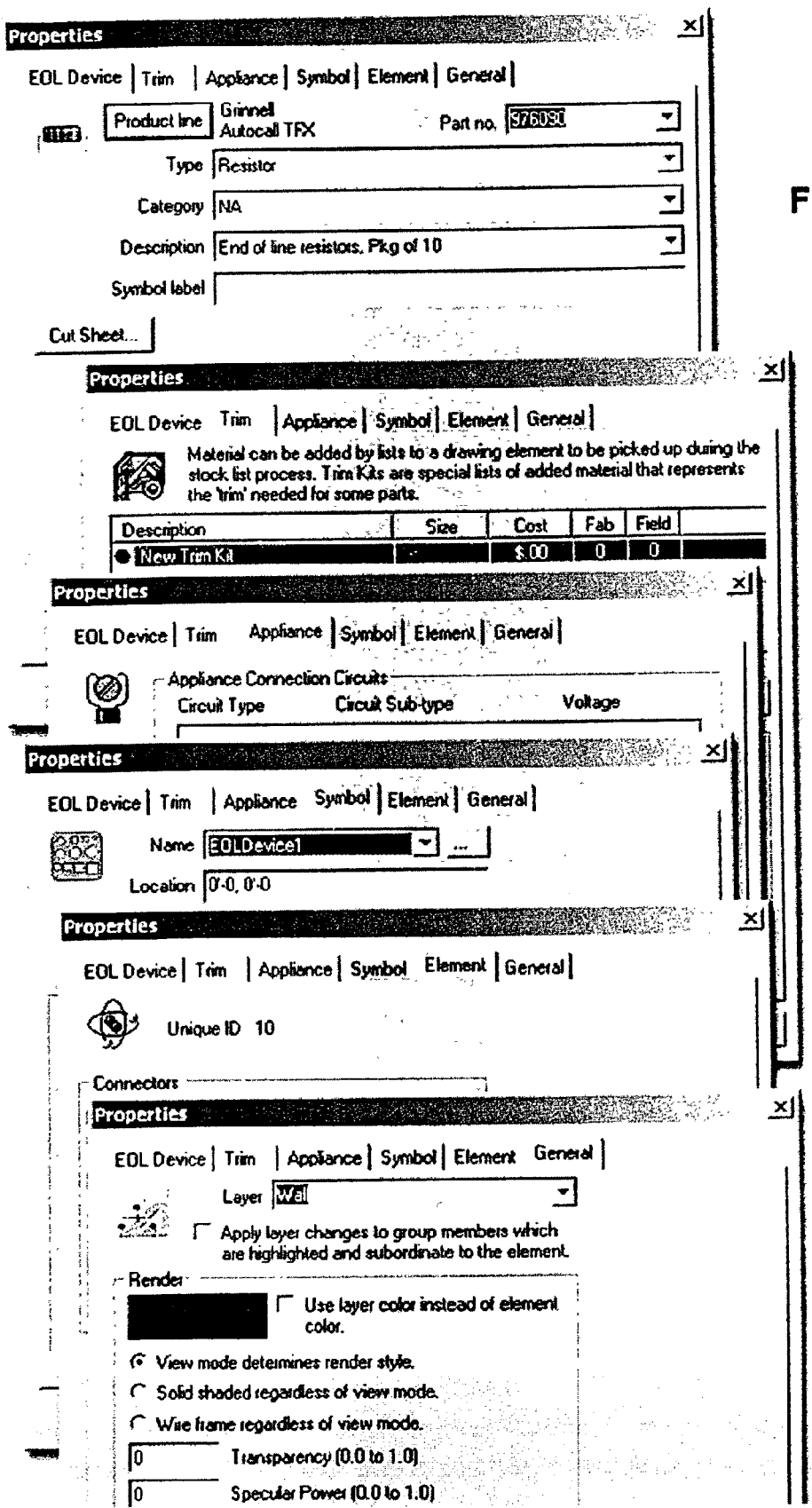
FIG. 31 is screen-shots of various tabs of an "End of Line Device Properties" window.
Figure 32:
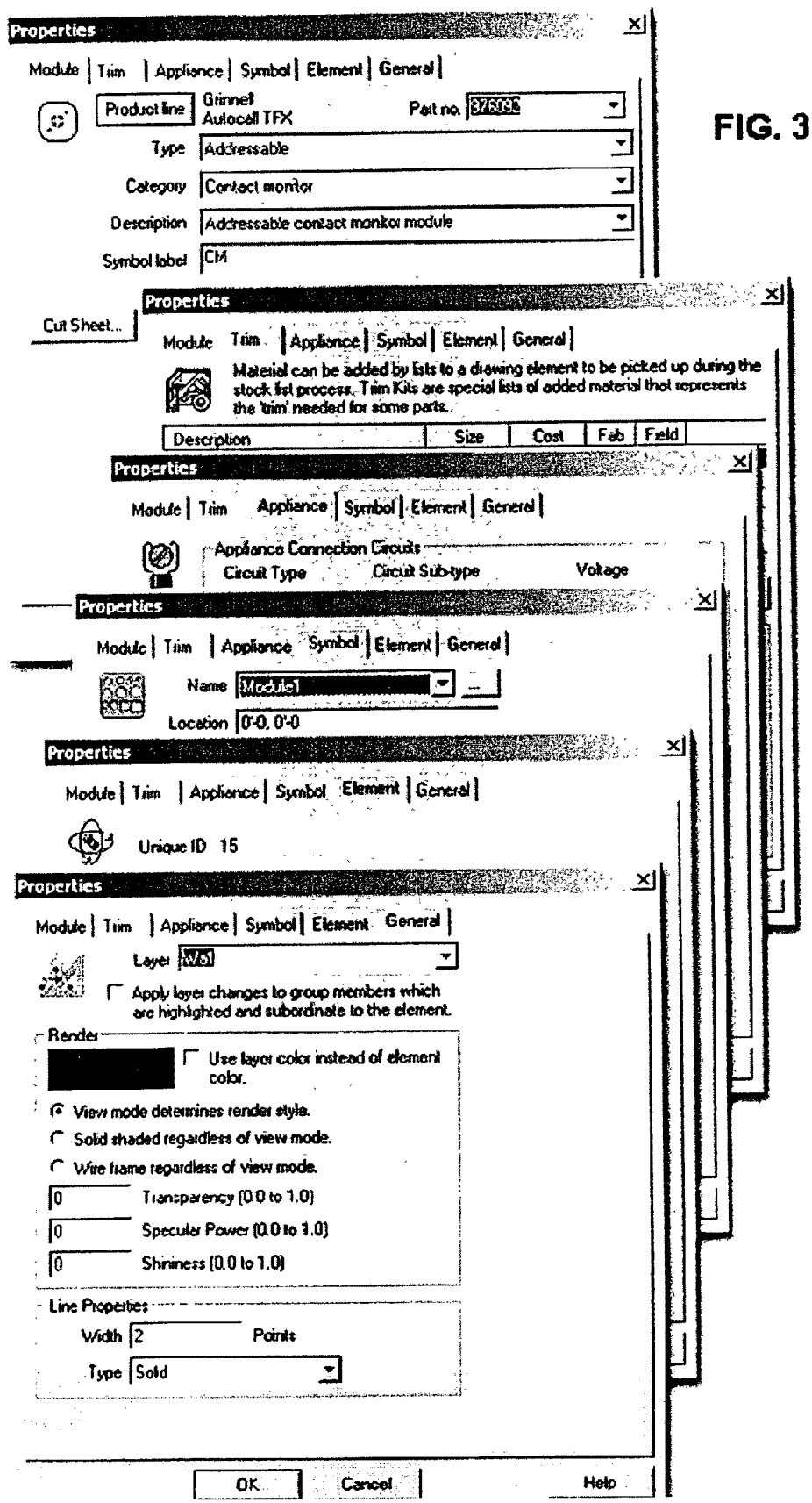
FIG. 32 is screen-shots of various tabs of a "Module Properties" window.
Figure 33:
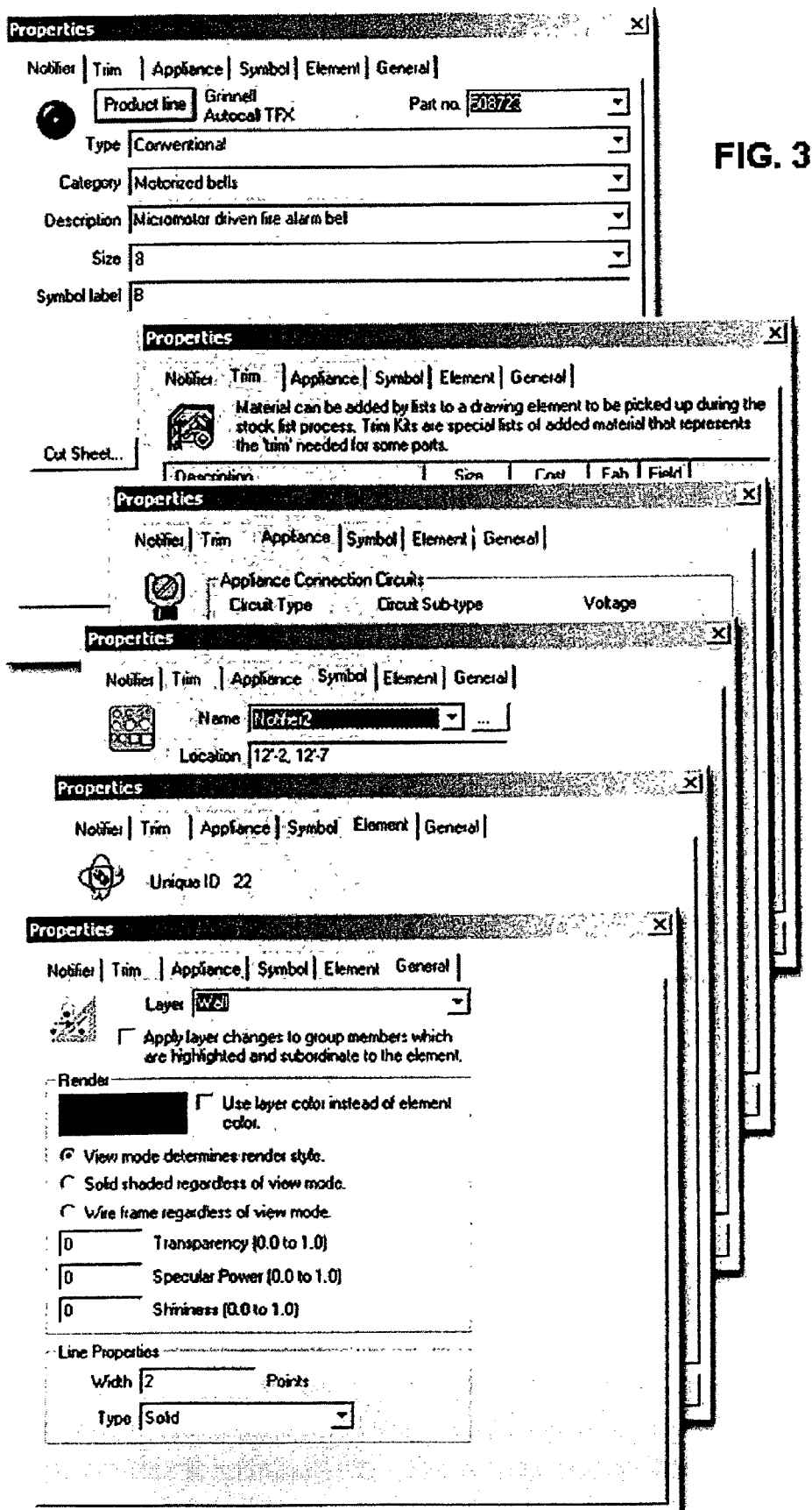
FIG. 33 is screen-shots of various tabs of a "Notification Appliance Properties" window.
Figure 34:
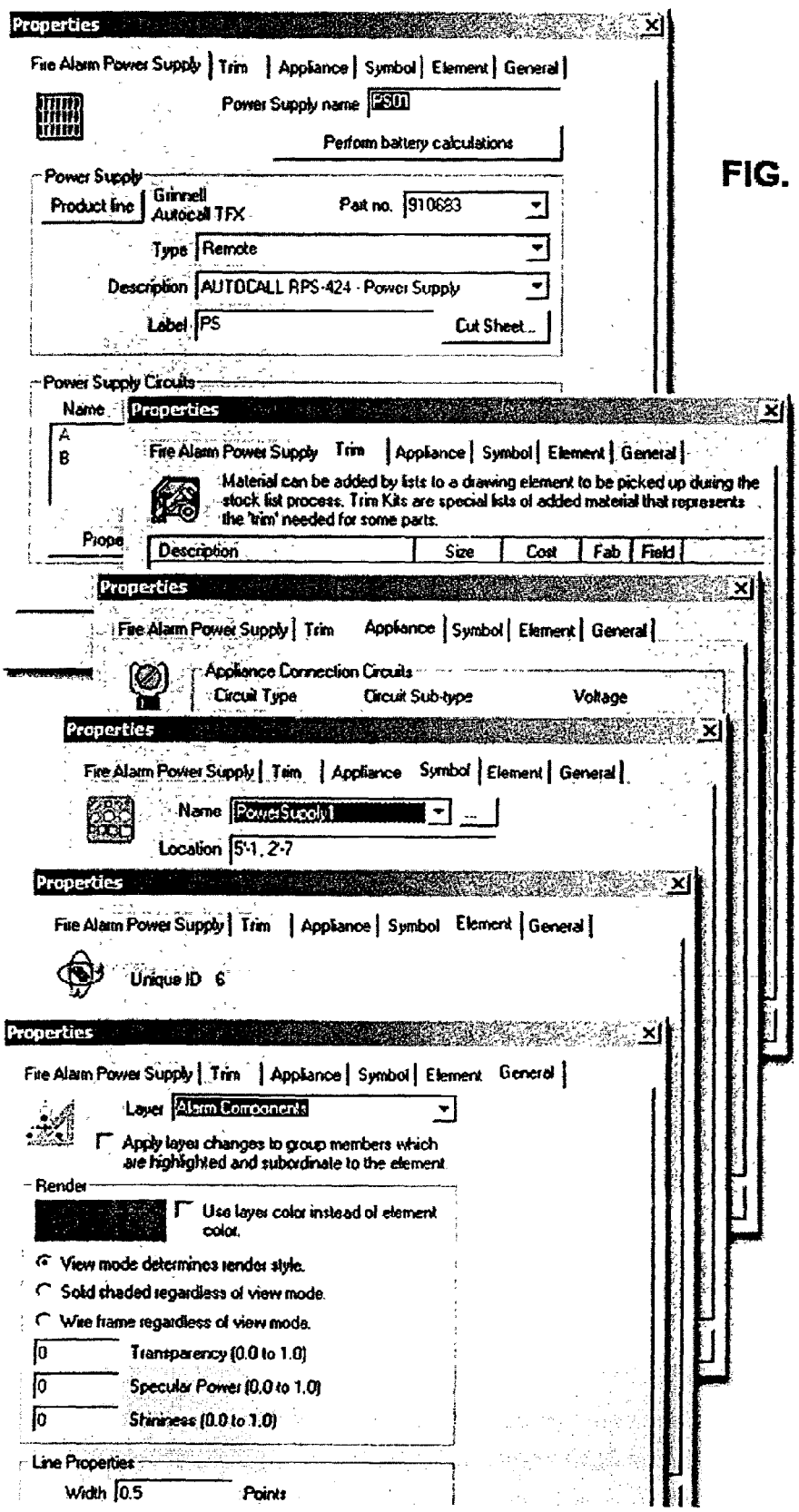
FIG. 34 is screen-shots of various tabs of a "Power Supply Properties" window.
Figure 35:
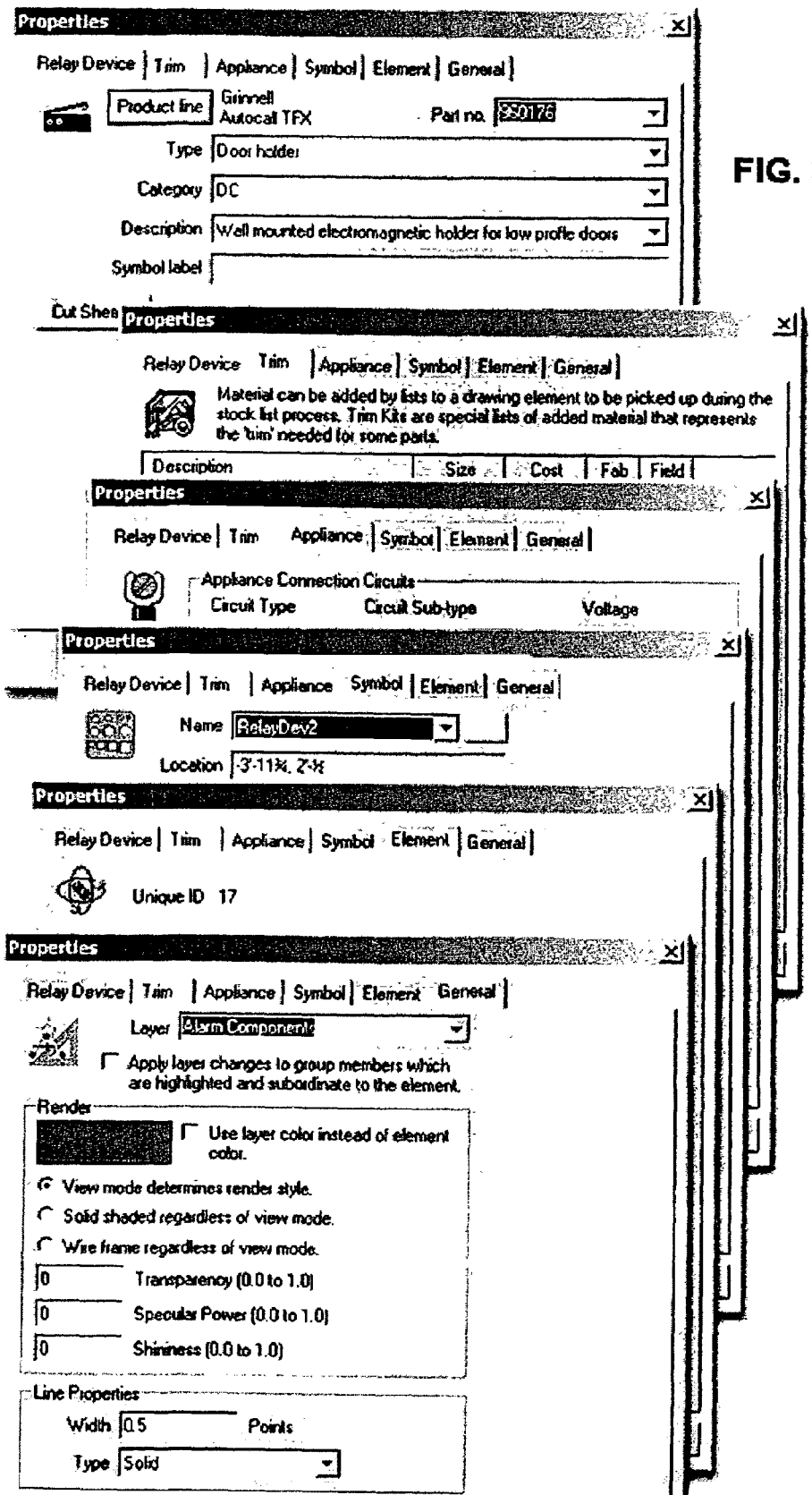
FIG. 35 is screen-shots of various tabs of a "Relay Device Properties" window.

The "Benchmark" tab of some "Properties" dialogs may give characteristics and settings unique or essential to the specific element (FIG. 29). For example, location and rotation properties may appear on a "Benchmark" tab. The "Element" tab gives limited information such as an element's unique ID number, a list of elements to which it is connected, the identification numbers of those elements, and any offset distances. The "General" tab allows the user to assign an element to a layer and customize the appearance of an element. The "Render" section of the "General" tab contains presentations aspects such as color, transparency and view modes. "Line" properties at the bottom of the "General" tab govern the appearance of the lines that form the element.

The user may adjust the properties of a comm phone, an end of line (EOL) device, a module, a notification appliance, a power supply, or a relay device via an associated "Properties" page (FIGS. 30, 31, 32, 33, 34 and 35). If the user knows the part number of the specific device he wants to use, he may choose the part number from a "Part no." drop-down menu. Alternatively, the user may enter "Type," "Category," and/or "Description" variables to determine a desired part. The user may also click the "Cut sheet" button to open an Adobe Reader PDF file with the manufacturer's specs. "Trim," "Appliance," Symbol," "Element," and "General" tabs of each "Properties" page control presentation and association aspects of the element. On the "Trim" tab, additional materials, such as handsets or enclosures for a comm phone, can be incorporated into the element for stock listing or reports. The "Appliance" tab presents "Connection Data," "Requirements," and "Circuit" load in addition to "Network Circuit Data." The user may refine the on-screen presentation of an element's appearance, location, rotation and scale via a "Symbol" tab. An "Element" tab displays the element's Unique ID number and lists other elements to which it is joined. On a "General" tab, the user may change an element's color, layer, line properties and rendered characteristics.

Figure 36:
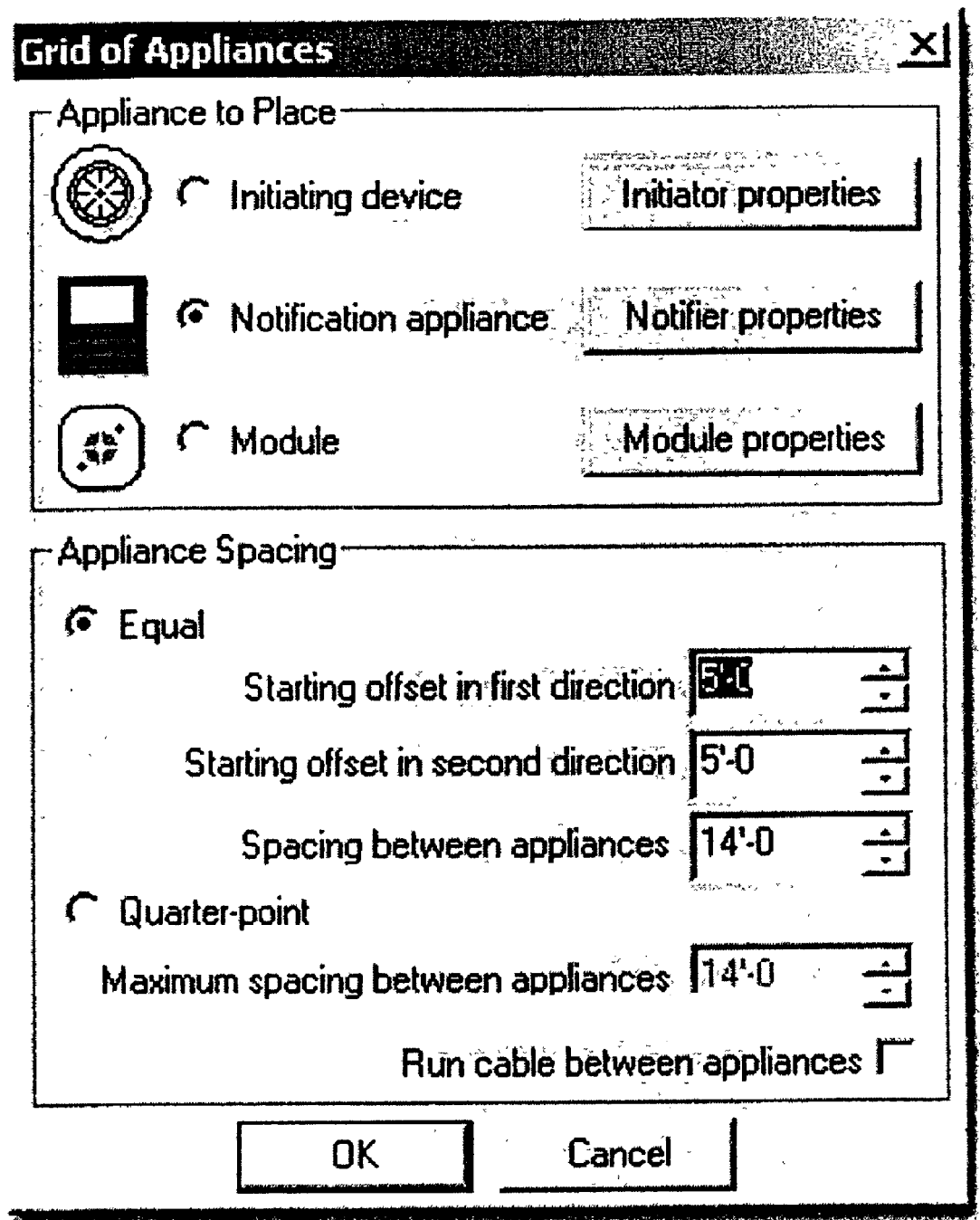
FIG. 36 is a screen-shot of a "Grid of Appliances Properties" window.

The user may adjust the properties of a "Grid of Appliances" via another properties page (FIG. 36). Under "Appliance Spacing," the user may set the offset spacing or check "Quarter Point Spacing." If the user does not want a wire path to appear between appliances, the user may un-check the "Run cable between Appliances" box. After establishing appliance and spacing parameters, the user may click "OK" and left-click in the drawing field to place the insertion point, click again to set the span of the grid, move the cursor to stretch a box to encompass the desired area, and then left-click once more to place the grid of appliances.

Figure 37:
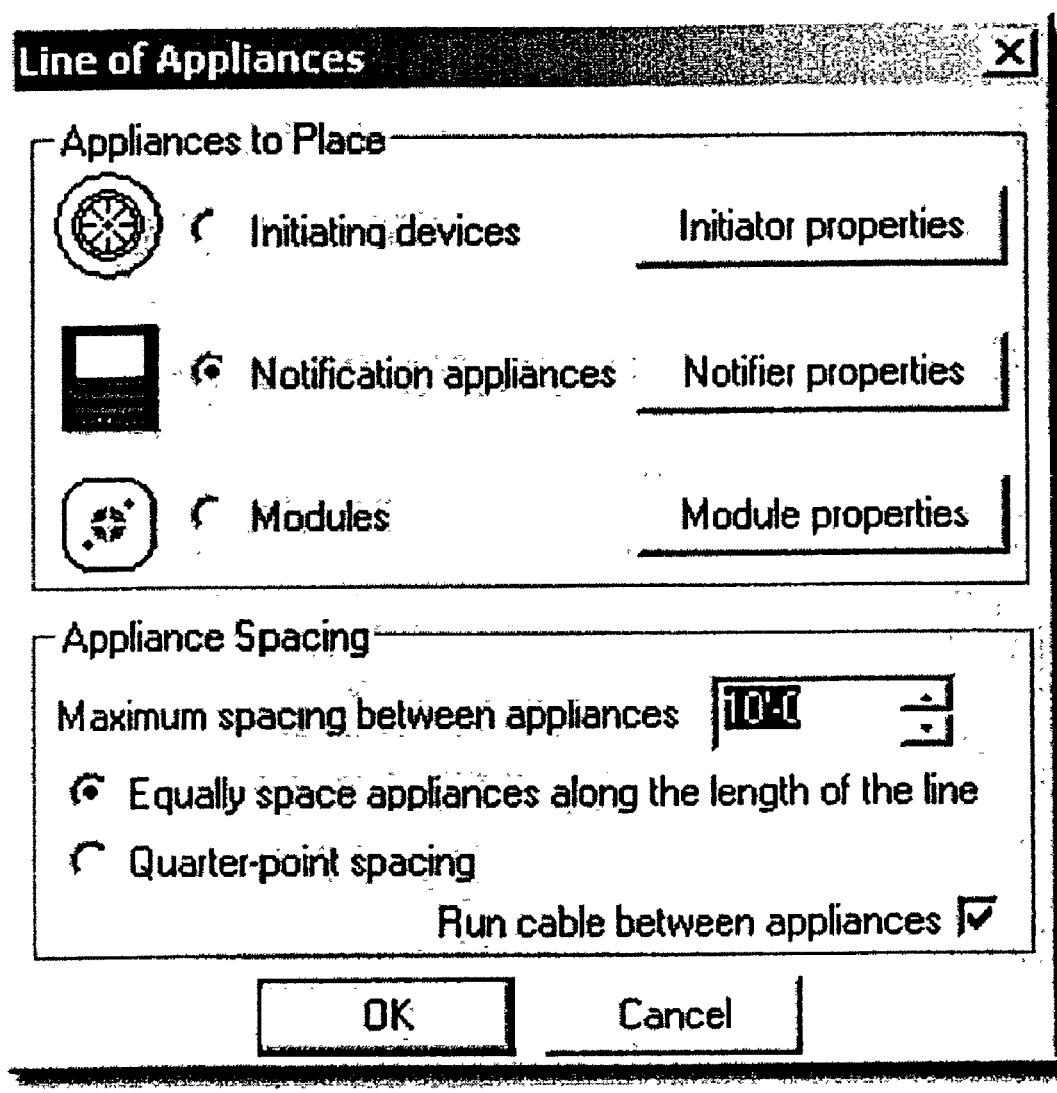
FIG. 37 is a screen-shot of a "Line of Appliances Properties" window.

Similarly, the user may adjust the properties of a "Line of Appliances" (FIG. 37). Under "Appliance Spacing" the user may set the "Maximum Spacing between Appliances" or check "Quarter Point Spacing." Again, if the user does not want a wire path to appear between appliances, the user may un-check the "Run Cable between Appliances" box. Next, the user may click "OK", left-click in the drawing field to set the origin point, move the cursor to stretch a line to the desired length, and then left-click again.

Figure 38:
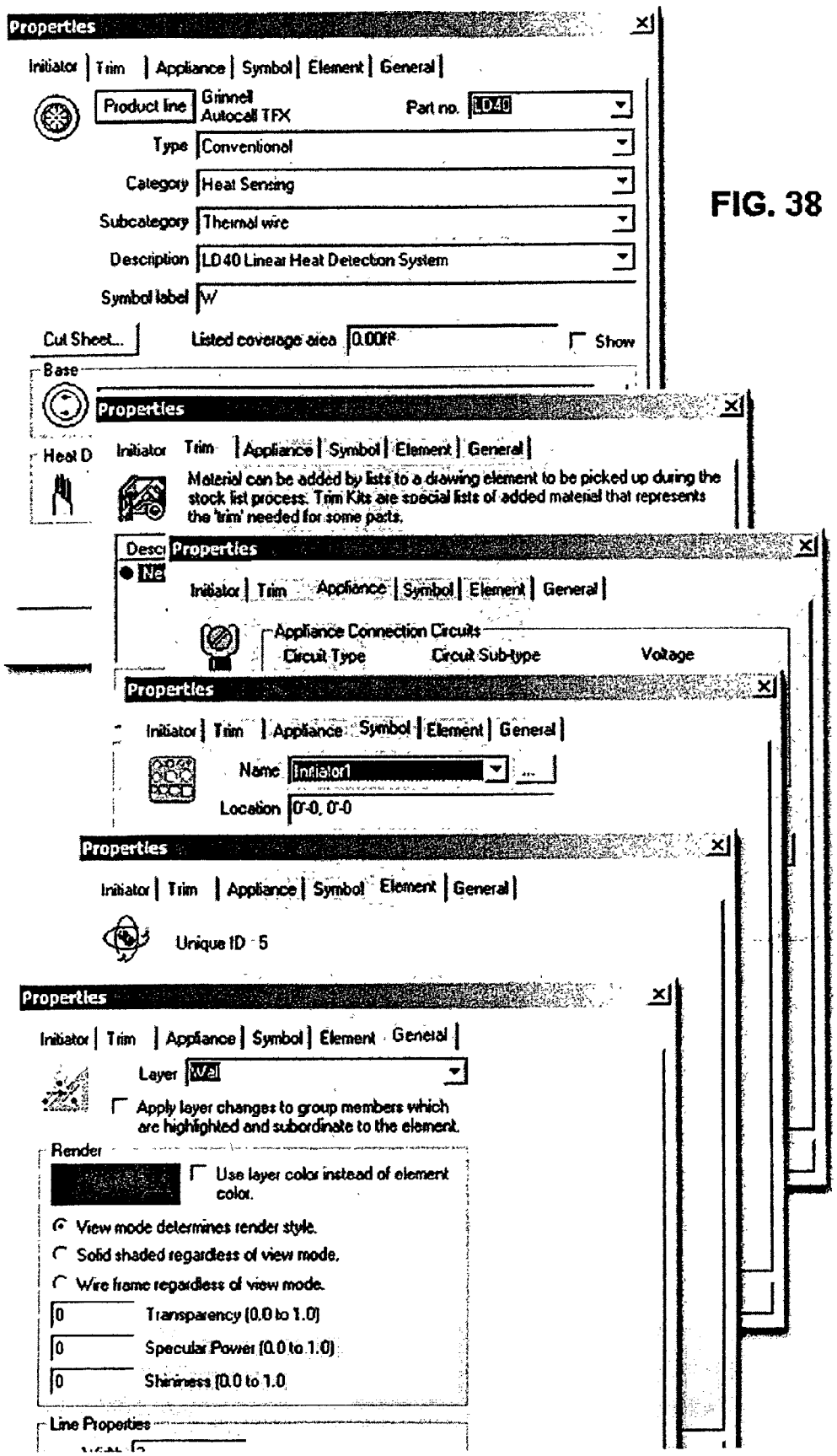
FIG. 38 is screen-shots of various tabs of an "Initiator Device Properties" window.

The user may adjust the properties of an "Initiator" device via yet another properties page (FIG. 38). The user may click the "Cut sheet" button to open an Adobe Reader PDF file with the manufacturer's specs. If the user knows the part number of the specific Initiator he wants to use, the user may choose it from the "Part no." drop-down menu. Alternatively, the user may use the "Type," "Category," "Subcategory," and "Description" variables to determine the desired part. For initiators that require a base, an "Appliance Base" dialogue may be accessed via an ellipses button to the right of a listed default base. Again, the user may use either the specific "Part no." of the desired appliance base, or choose from the available "Types" and "Descriptions" options. For initiators that require a "Heat Detection Wire," the user may click a "Heat wire properties" button to open a "Heat Properties" page. Next, the user may alter the wire's path by inserting or deleting vertices listed in the window, and clicking the cable icon to access the "Cable Properties" page. "Trim," "Appliance," "Symbol," "Element," and "General" tabs of the "Initiator Properties" page controls presentation and association aspects of the element. On the "Trim" tab, additional materials can be incorporated into the Initiator equipment for stock listing or reports. The "Appliance" tab presents "Connection Data," "Requirements," and "Circuit" load in addition to "Network Circuit Data." The user may also refine the on-screen presentation of the Initiator marker's appearance, location, rotation and scale on the "Symbol" tab. The "Element" tab displays the Initiator's Unique ID number and lists other elements to which it is joined. On the "General" tab, the user may change an element's color, layer, line properties and rendered characteristics.

Figure 39:
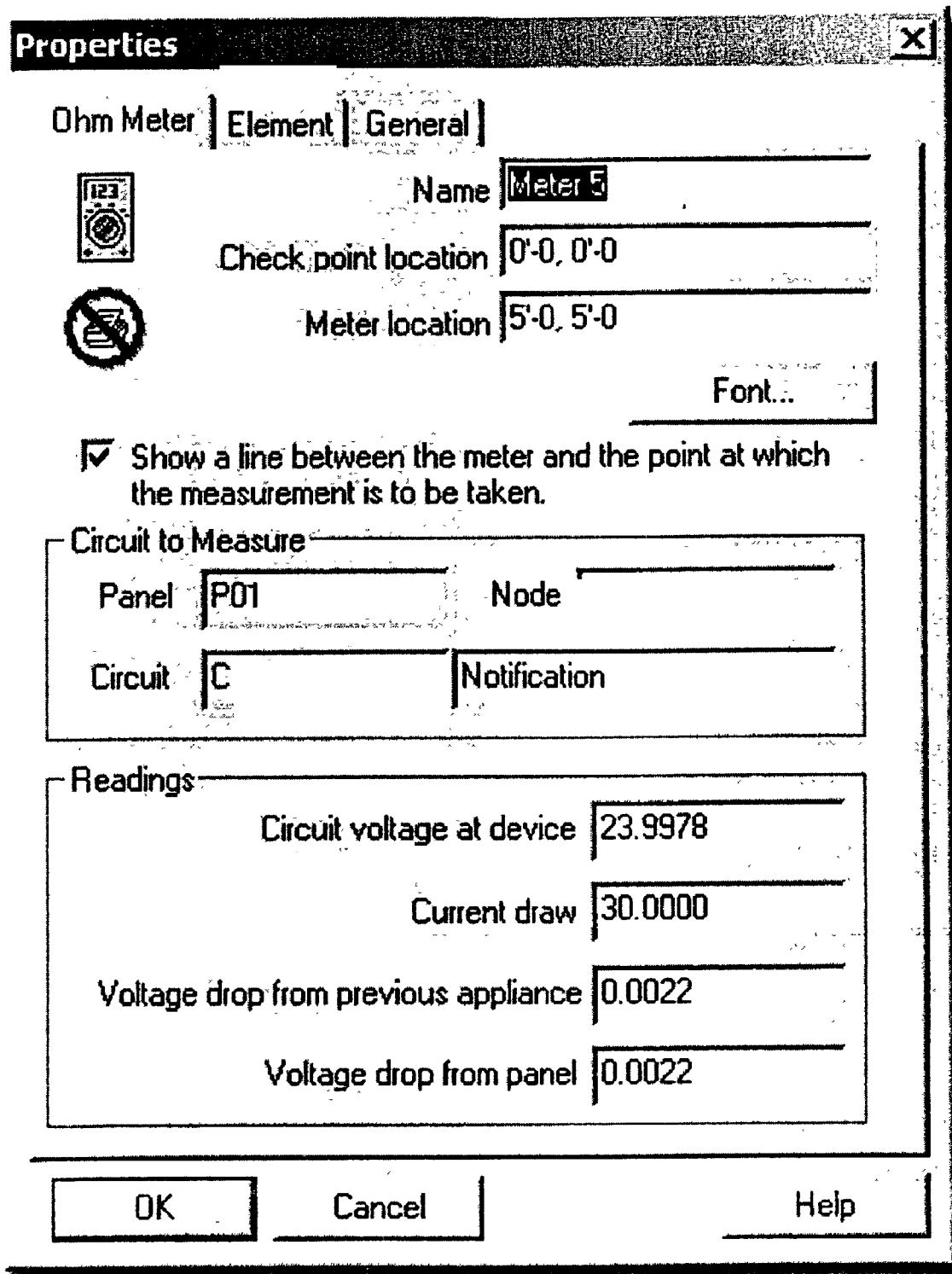
FIG. 39 is a screen-shot of an "Ohm Meter Properties" window.

The user may also adjust the properties of an "Ohm Meter" via yet another properties page (FIG. 39). On the "Ohm Meter Properties" page, the user can change the "Name," "Check Point Location," or "Meter" label location. Note that both "Check Point" and "Meter" label locations are relative to the current position of the benchmark. The user may click the "Font" button to alter the appearance of the text on the "Meter" label. The meter's "Panel," "Node," and "Circuit" assignments are listed in addition to the electrical current and voltage drop "Readings."

Figure 40:
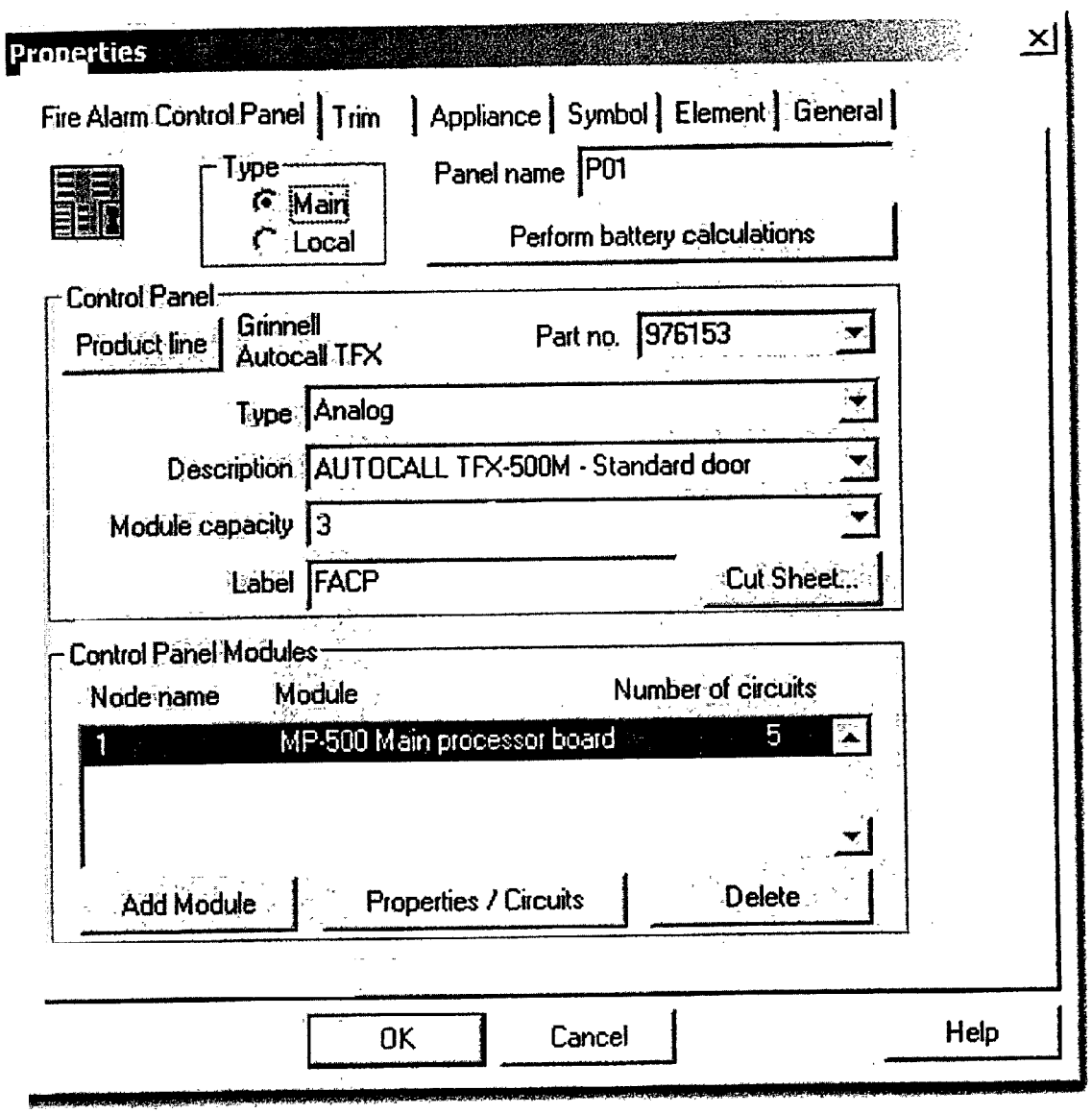
FIG. 40 is a screen-shot of a "Panel Properties" window.
Figure 41:
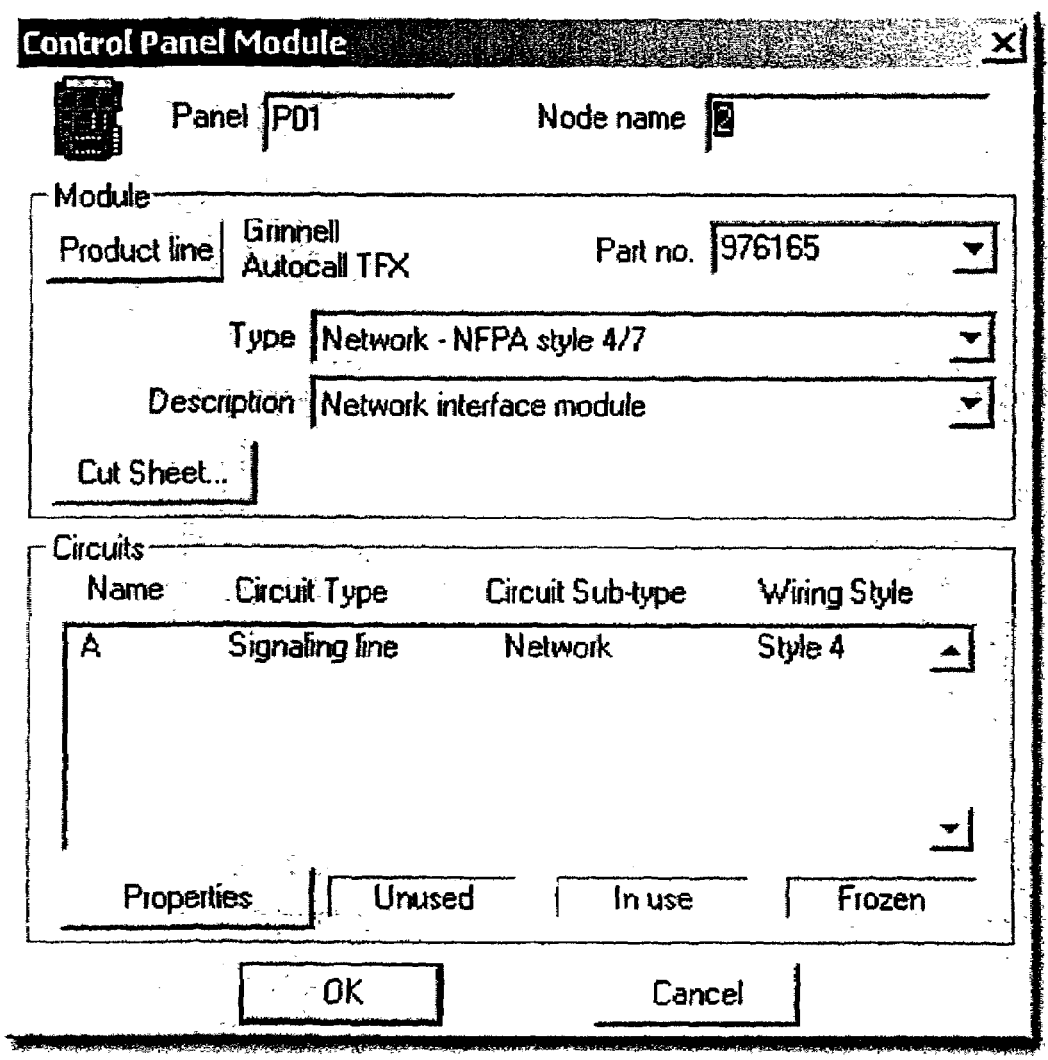
FIG. 41 is a screen-shot of a "Control Panel Module" window.
Figure 42:
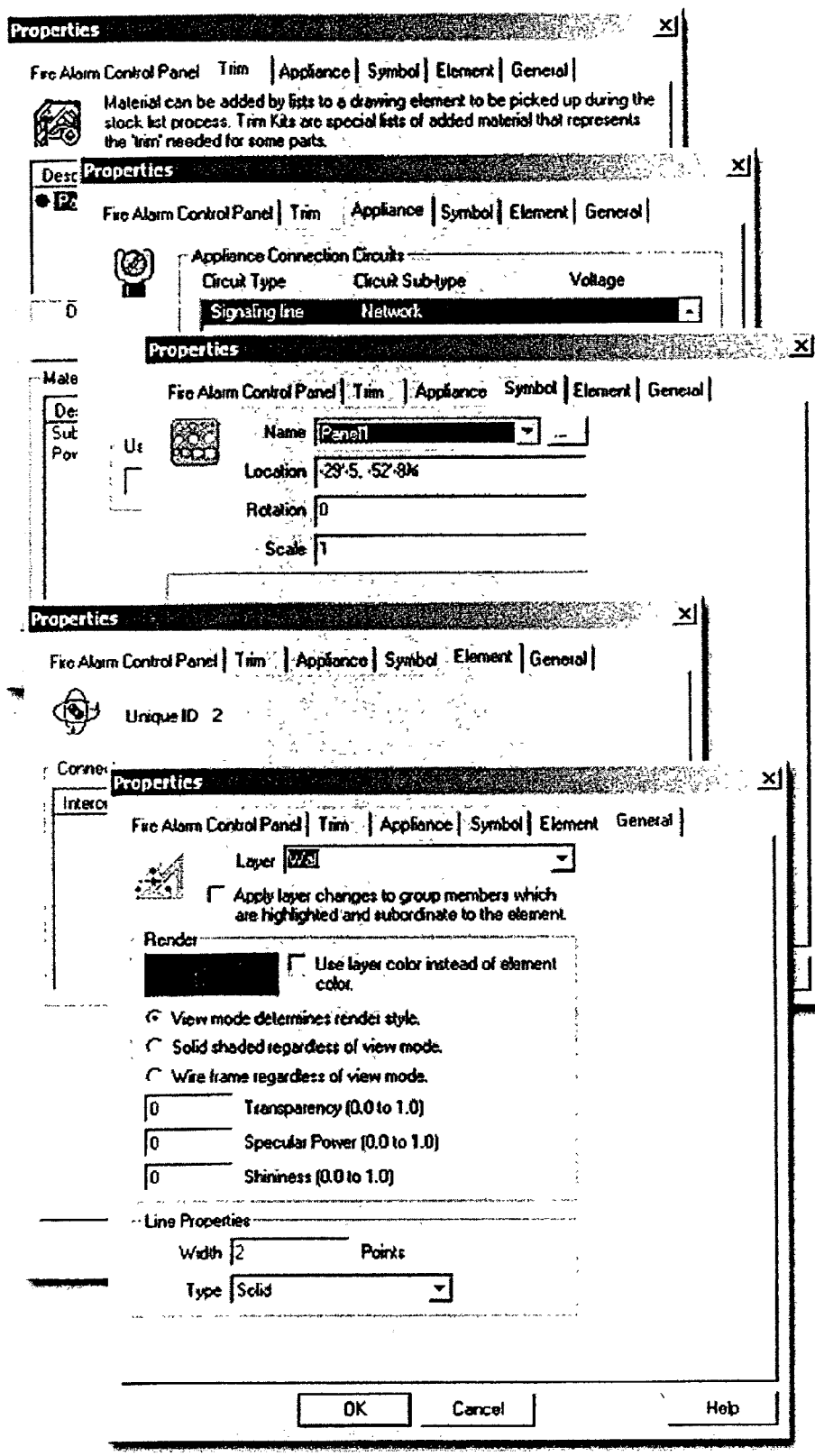
FIG. 42 is screen-shots of various tabs of a "Panel Properties" window.

The user may also adjust the properties of a "Panel" via another properties page (FIGS. 40 and 42). If the user knows the part number of the specific panel he wants to use, he may choose it from the "Part no." drop-down menu. Alternatively, the user may use the "Type," "Category," and "Description" variables to determine the desired part. Under "Control Panel Modules," the modules currently allocated to the control panel are listed. To include additional modules, the user may click "Add Module." To view the properties of a selected module, the user may click "Properties/Circuit." Clicking the "Delete" button removes a selected module from the list. Clicking a "Perform battery calculations" button compiles parts information and computes electrical current requirements for a given panel before equipping the cursor to place the data, in chart form, into the drawing. The user may also click a "Cut sheet" button to open an Adobe Reader PDF file with the manufacturer's specs. The user may access a "Control Panel Module" dialog (FIG. 41) by selecting "Add Module" on a "Panel Properties" page. On the "Control Panel Module" dialog, a "Node Name" may be given. To modify the module, the user may choose from the options on the "Type" and "Description" drop-down menus. Individual circuits and their properties can be accessed and altered by choosing from the list in the "Circuits" window.

"Trim," "Appliance," "Symbol," "Element," and "General" tabs of the "Panel" properties page control presentation and association aspects of the element (FIG. 42). On the "Trim" tab, additional materials can be incorporated into the panel equipment for stock listing or reports. The "Appliance" tab presents connection data, requirements and circuit load in addition to network circuit data. The user may refine the onscreen presentation of the panel marker's appearance, location, rotation and scale via the "Symbol" tab. The "Element" tab displays the device unique ID number and lists other to which it is joined. On the "General" tab, the user may change an element's color, layer, line properties and rendered characteristics.

Figure 43:
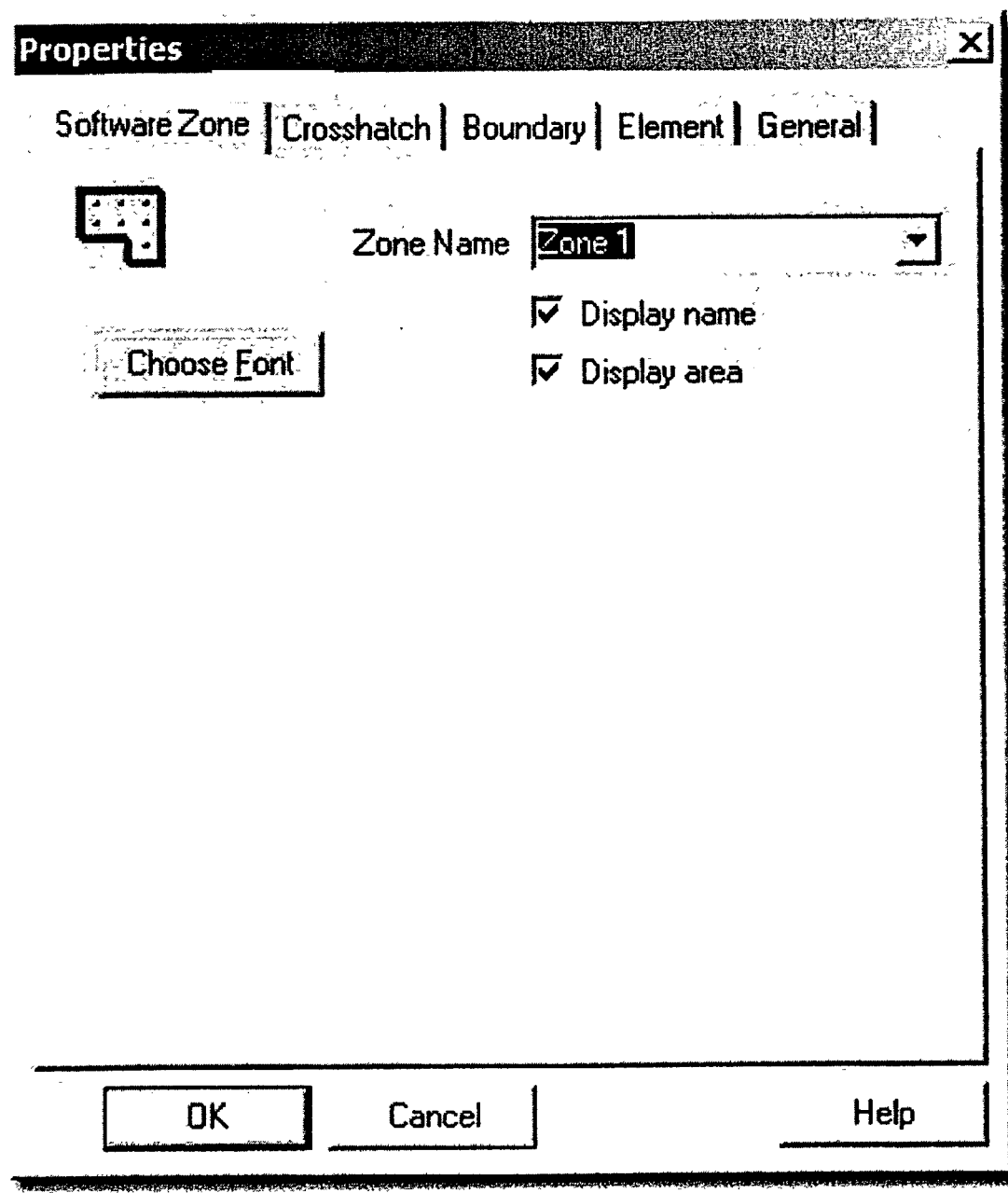
FIG. 43 is a screen-shot of a "Software Zone Properties" window.

The user may adjust the properties of a "Software Zone" via yet another properties page (FIG. 43). On the "Properties" page, the user may give a zone a name. By checking a "Display name" box, the user may include the title in the visible drawing field, and by checking a "Display area" box the user may add the square footage to the drawing field. A "Crosshatch" tab allows a crosshatch pattern to be added to further illustrate the selected zone. A "Boundary" tab gives vertex locations relative to the current benchmark. An "Element" tab displays the Software Zone's Unique ID number and lists other elements to which it is joined. On the "General" tab, the user may change an element's color, layer, line properties and rendered characteristics. After setting the properties, the user may left-click in the drawing field to set the origin point of the boundary. Next, the user preferably clicks in strategic locations to define the shape of the Zone. When the boundary encompasses the desired items, the user may right-click to free the cursor of the "Software Zone" tool.

Additional Alarm System Commands

In addition to the tools and reports described above, many other commands are available to the user. To include something new in the "Parts Database," the user may choose "Add New Item" from the "Parts Database" menu. The "Add New Item" command opens a submenu listing item categories. "Appliances," "Modules," "Power Supplies," "Appliance Bases," "Batteries," "Cable," "Panels," "Panel Modules," and other "Miscellaneous" items may be created with a customized set of properties. On the "Add New Item" submenu, the user may click the category that best fits the item he wants to include. As a result, a new item dialog appears with multiple tabs specific to item category selected. The user may examine the settings in each available box, altering them as he moves through the tabs. With the correct properties specified, the user may click "Save" to store the new item for future use or click "Close" to cancel the procedure and close the dialog.

To alter a previously created device in the "Parts Database," the user may choose "Modify Existing Item" from the "Parts Database" menu. On the "Modify Existing Item" submenu, the user may click the category that best fits the item he wants to include. Categories may be presented in submenu listings such as "Appliances," "Appliance Bases," "Batteries," "Cable," "Panels," etc. At this point, an existing item dialog will appear with multiple tabs specific to the item category selected. The user may click the button at the bottom of the dialog and examine the settings in each available box, altering them to his liking as he moves through the tabs. With the correct properties specified, the user may click "Save" to store the alterations for future use or "Cancel" to abort the procedure and close the dialog.

Figure 44:
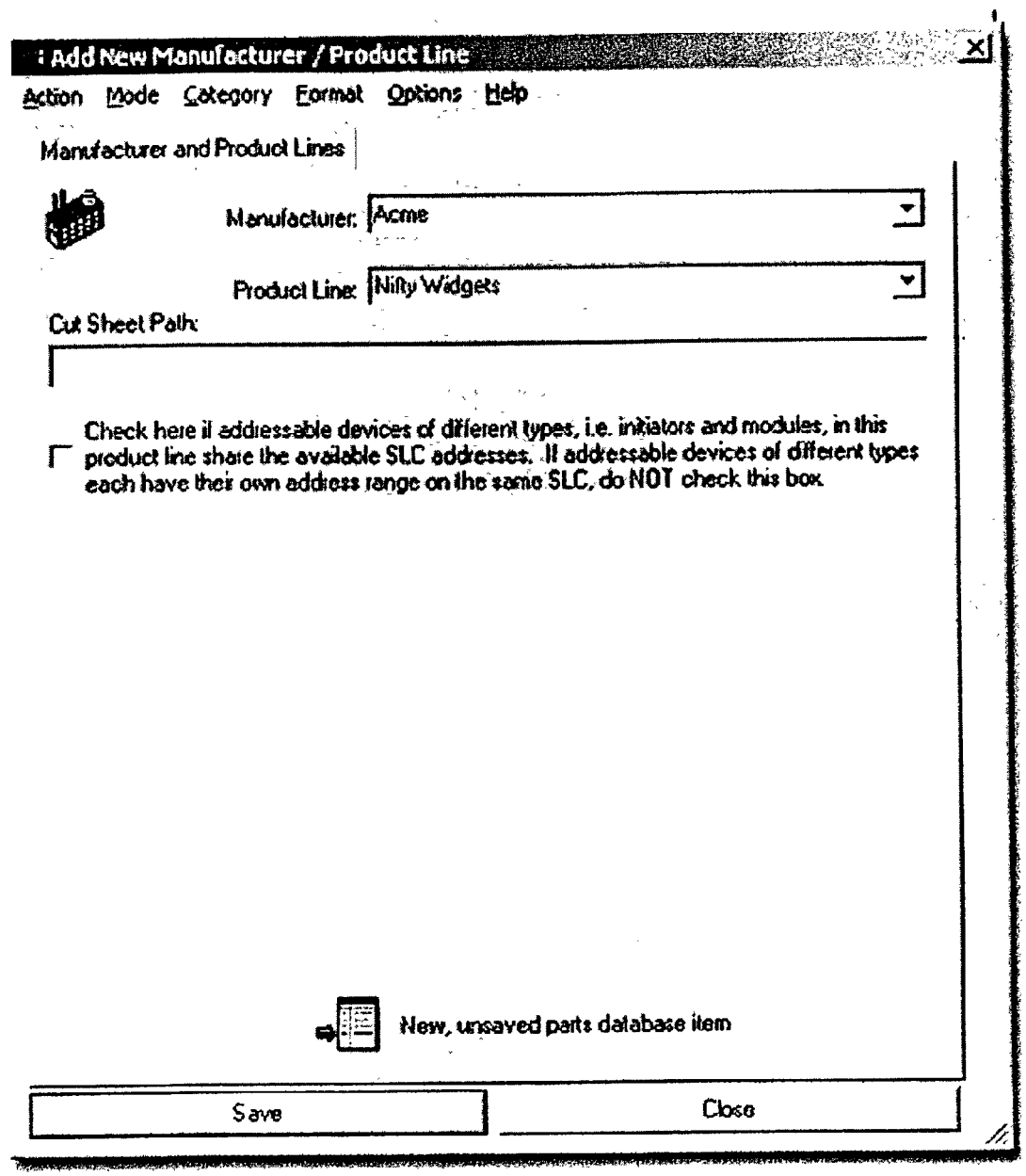
FIG. 44 is a screen-shot of an "Add New Manufacturer/Product Line" window.

To add a new product source, the user may enter a manufacturer's name in a "Manufacturer" box, and a new brand name into a "Product Line" box (FIG. 44). Similarly, if the user wants to add a new brand to existing manufacturer, the user may select a manufacturer from the "Manufacturer" drop-down and then enter the title of the new line in the appropriate box. If a page description file (PDF) is available online for the new manufacturer or product line, the website address may be entered in the "Cut Sheet Path" box.

Figure 45:
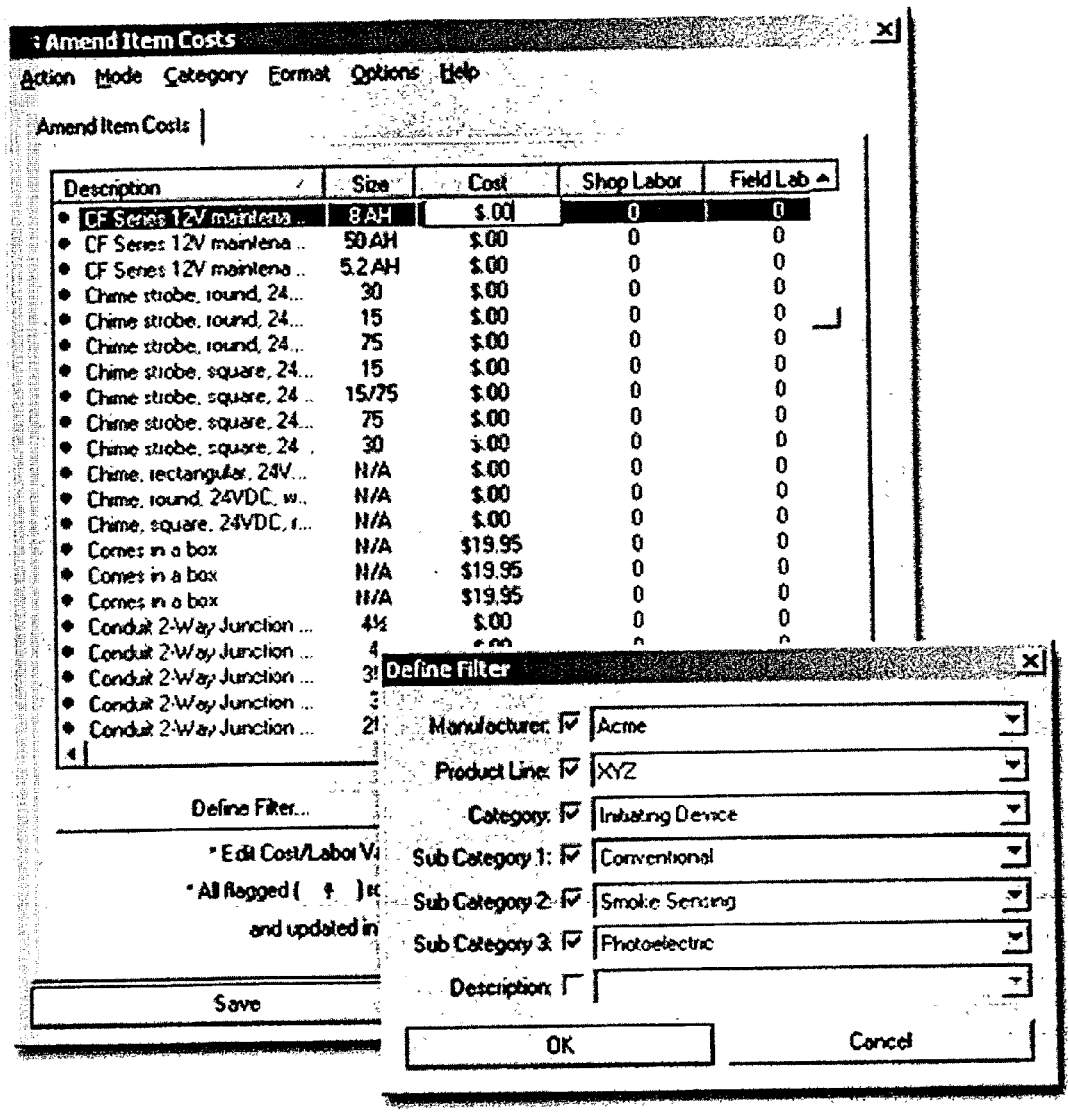
FIG. 45 is a screen-shot of an "Amend Item Costs" window and a "Define Filter" window.

The "Amend Item Costs" command offers quick access to the "Cost," "Shop Labor," and "Field Labor" properties of a specified "Parts Database" devices. The first step in modifying an expense figure of an item is finding the item in the "Amend Item Costs" dialog (FIG. 45). The user may click any of the column headers to reorganize the data in an alphabetical or numeric order, either first to last or last to first depending on the direction of the arrow in the column header. If simple reorganization is not enough, the user may use the "Define filter" button to bring up only items that fit specified manufacturer, product line, catalog or description parameters. To return to the complete "Parts Database," the user may click "Remove Filters." Once the user locates the device he wants to change, the user may double-click a "Shop Labor" or "Field Labor" column, make the appropriate modifications, and click "Save" to record the alterations. Alternatively, the user may click "Close" to cancel the procedure and return to the drawing field.

Figure 46:
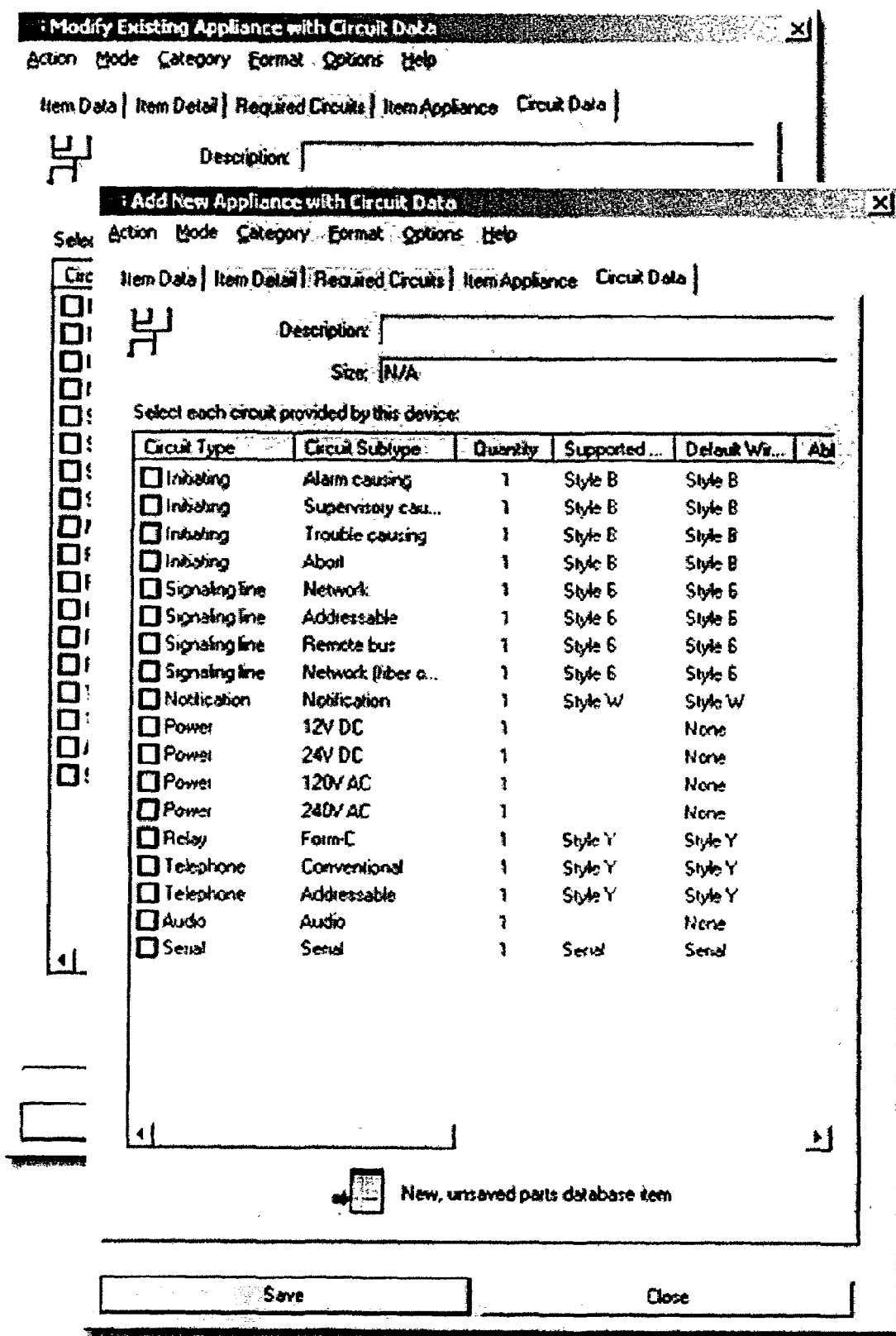
FIG. 46 is a screen-shot of a "Circuit Data" tab of an "Add New Appliance with Circuit Data" window and a "Modify Existing Appliance with Circuit Data" window.
Figure 47:
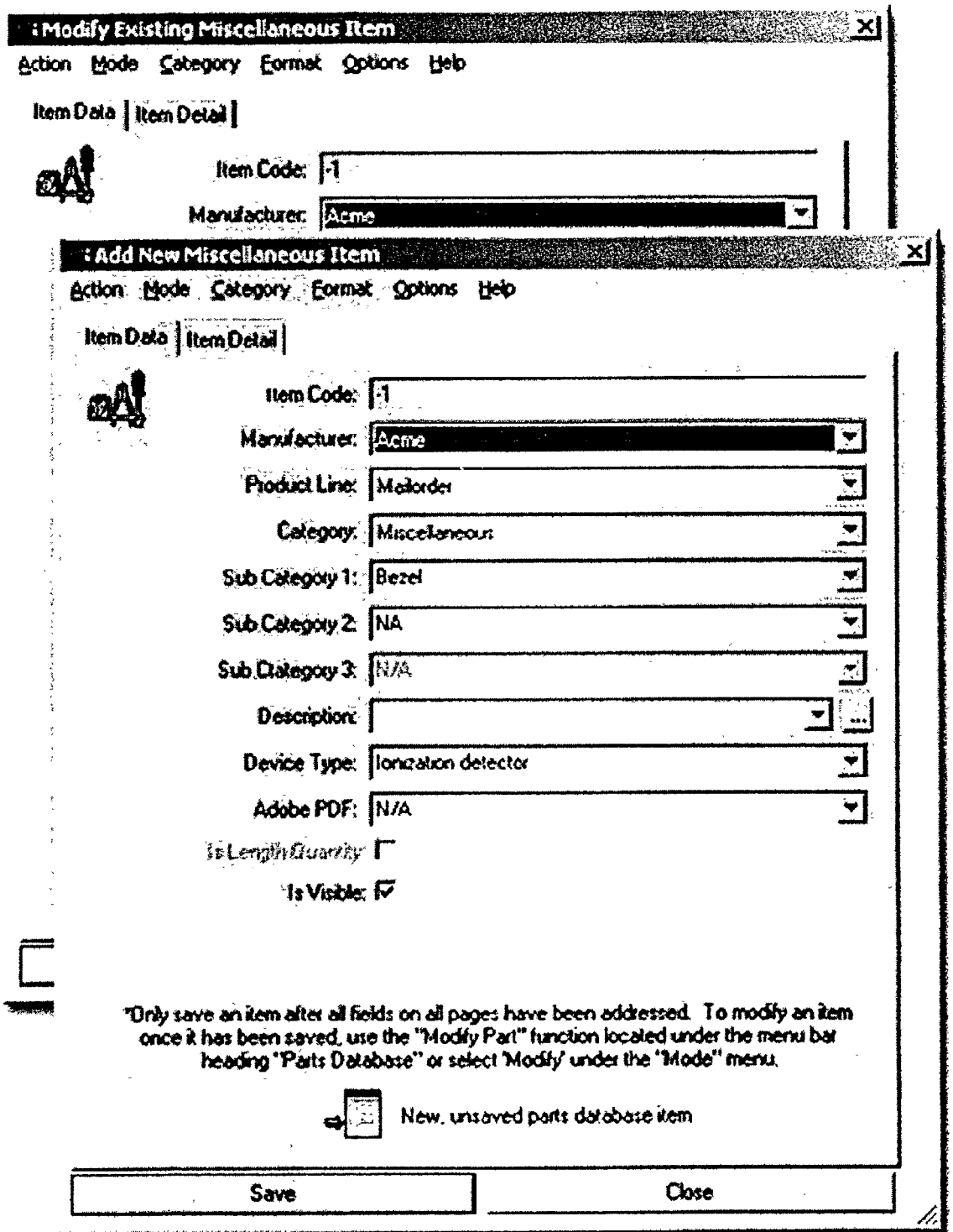
FIG. 47 is a screen-shot of an "Item Data" tab of an "Add New Appliance" window and a "Modify Existing Appliance" window.

The user may view potential lines for a device to supply via a "Circuit Data" tab (FIG. 46). Specifically, the user may select circuits for an appliance by checking the appropriate boxes in the "Circuit Type" column. The "Item Data" tab on both the "Add New Appliance" and "Modify Existing Appliance" dialogs for all devices contains "Manufacturer," "Product Line," "Category," and "Description" options (FIG. 47). In addition, the "Item Detail" tab contains "Model," "Parts Number," "Base Cost," "Lab or Hours," and "Approval" options. To alter any characteristics on the "Item Data" tab, the user may select the available options in each drop-down. The "Category" chosen has particular influence over the availability of other characteristics.

Figure 48:
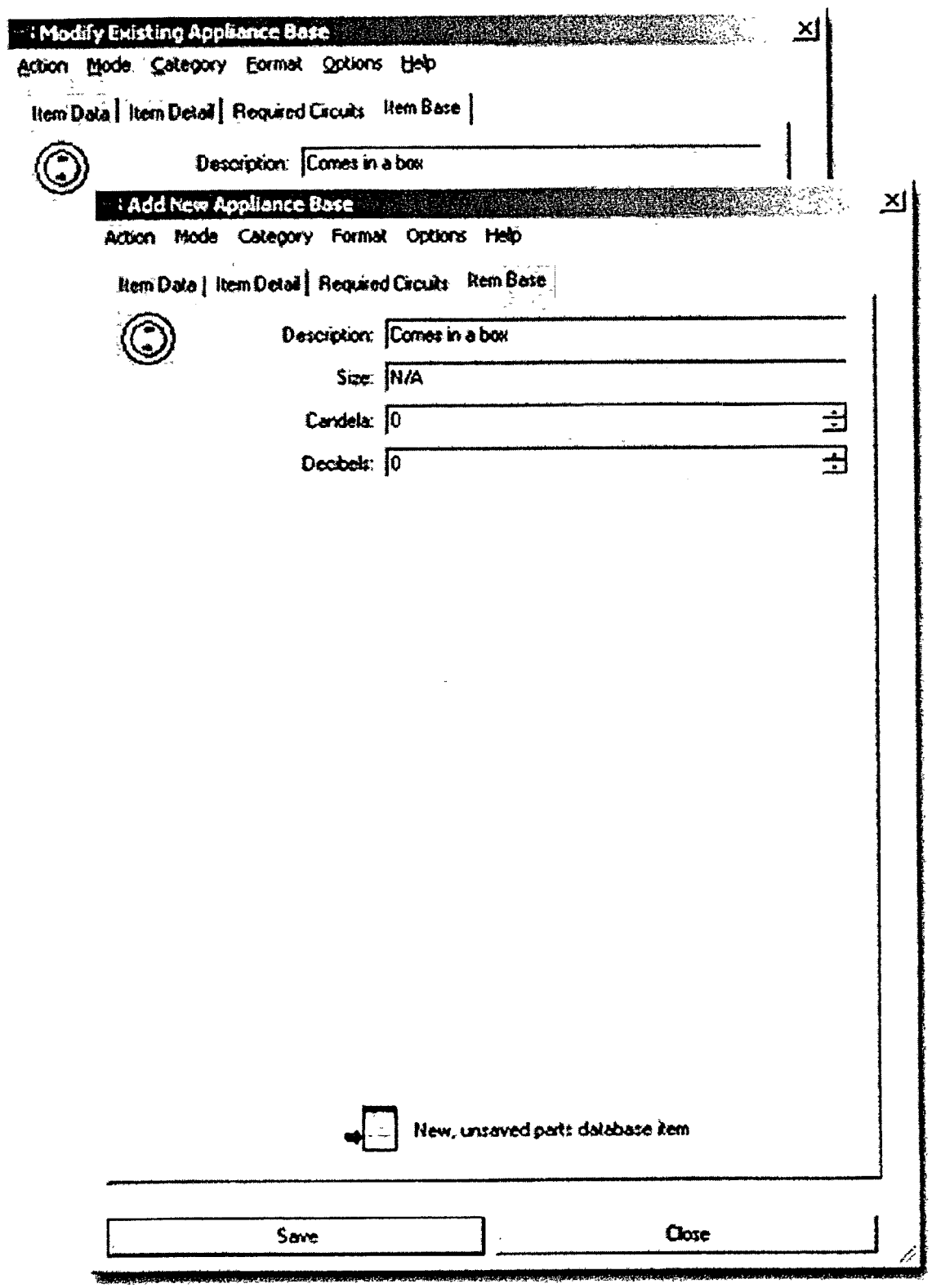
FIG. 48 is a screen-shot of an "Item Base" tab on a "Add New Appliance Base" window and a "Modify Existing Appliance Base" window.

The "Item Base" tab on both the "Add New Appliance Base" and "Modify Existing Appliance Base" dialogs contains current settings, notification properties and circuit options (FIG. 48). To alter any characteristics presented on the "Item Base" tab, the user may select from the available options in each drop-down. Once the settings are selected, the user may click "Save" to store a new item or the alterations to an existing item for future use.

Figure 49:
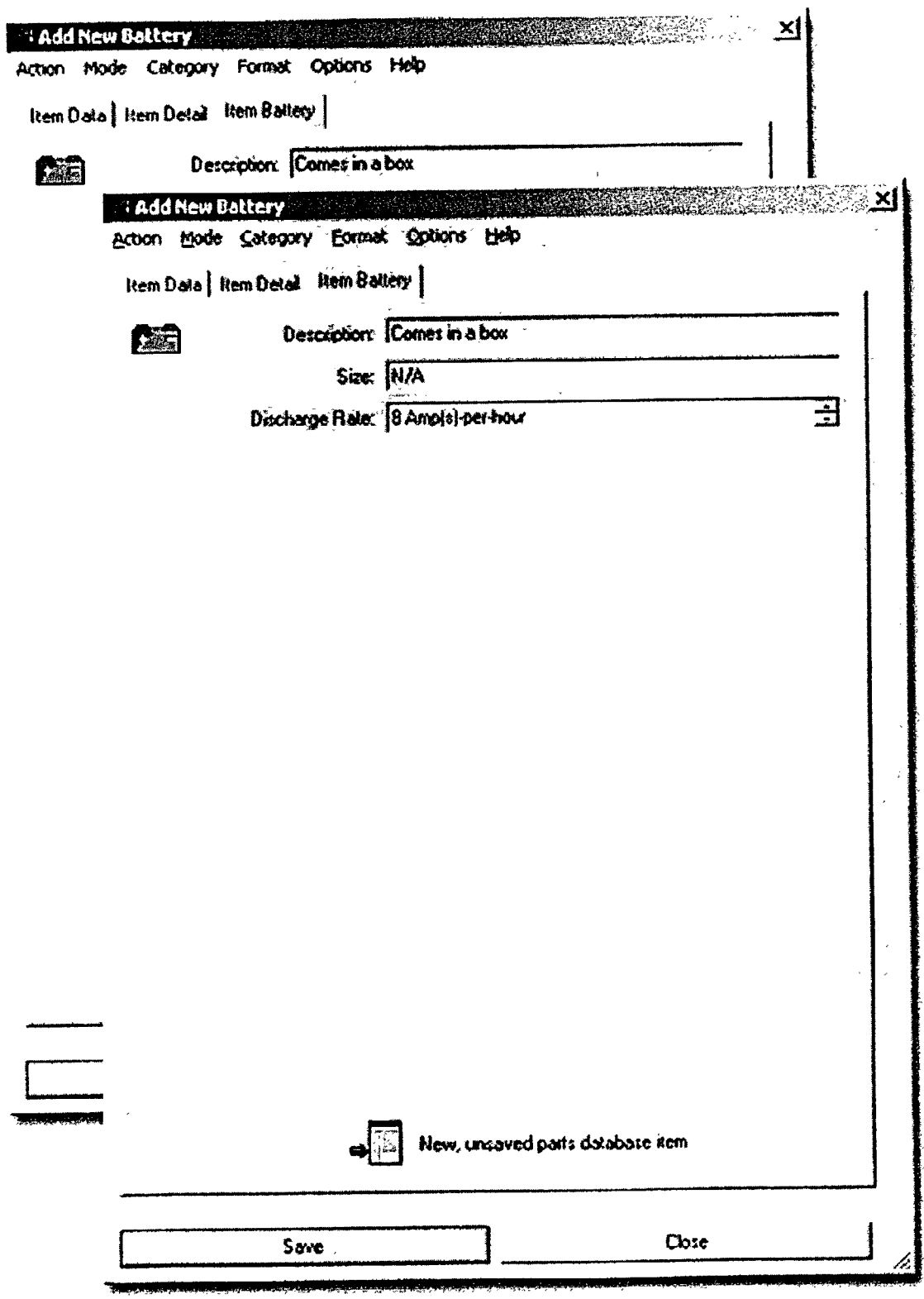
FIG. 49 is a screen-shot of an "Item Battery" tab on a "New Battery" window and a "Modify Existing Battery" window.

The "Item Battery" tab on both the "New Battery" and "Modify Existing Battery" dialogs contains a "Discharge Rate" box (FIG. 49). To alter any characteristics presented on the "Item Battery" tab, the user may select from the available options in the "Discharge Rate" box. Once the settings are selected, the user may click "Save" to store a new item or the alterations to an existing item for future use.

Figure 50:
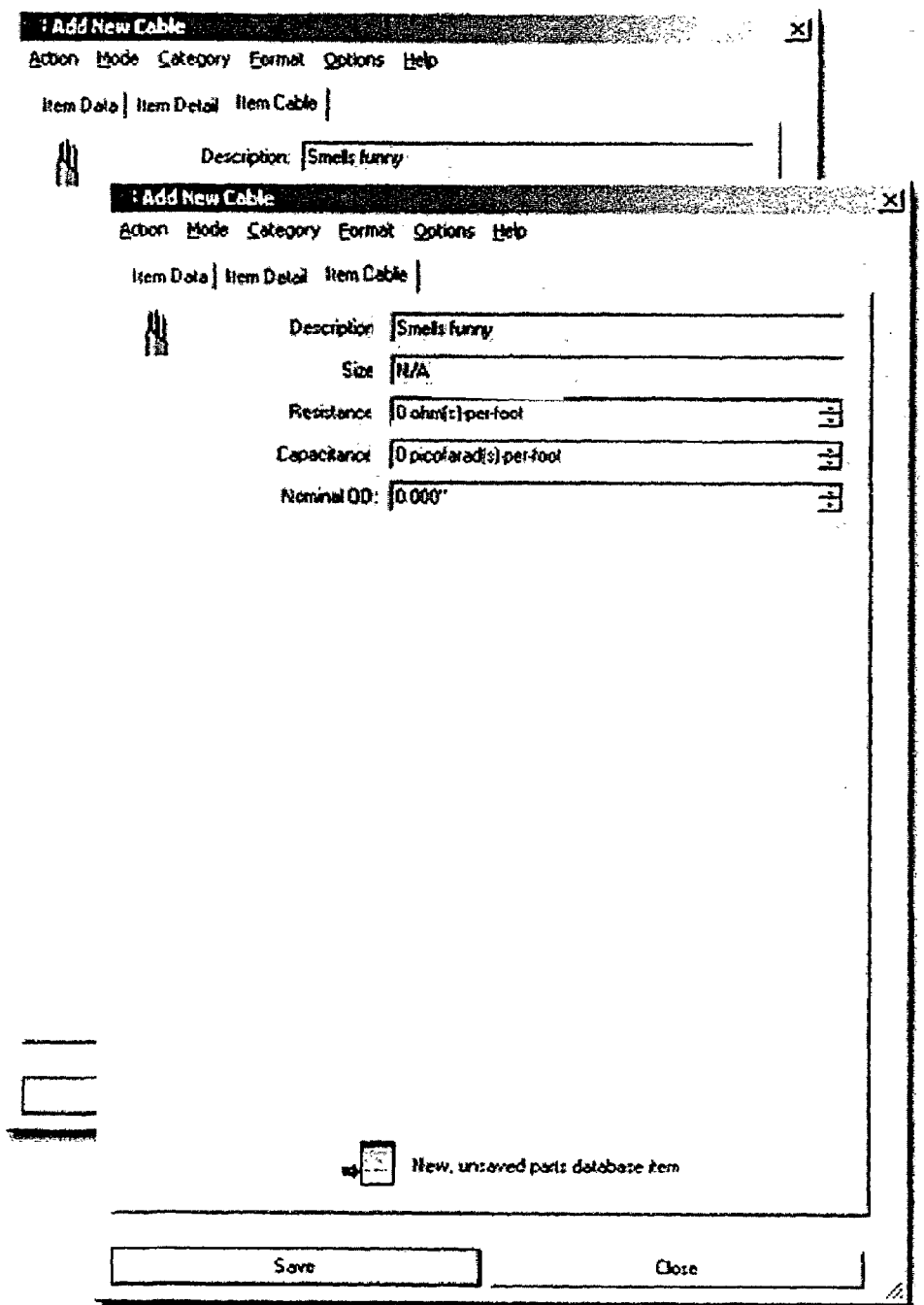
FIG. 50 is a screen-shot of an "Item Cable" tab on a "Add New Cable" window and a "Modify Existing Cable" window.

The "Item Cable" tab on both the "Add New Cable" and "Modify Existing Cable" dialogs contains "Resistance," "Capacitance," and "Nominal OD" options (FIG. 50). To alter any characteristics presented on the "Item Cable" tab, the user may select the available options in each box. Once the settings are selected, the user may click "Save" to store a new item or the alterations to an existing item for future use.

Figure 51:
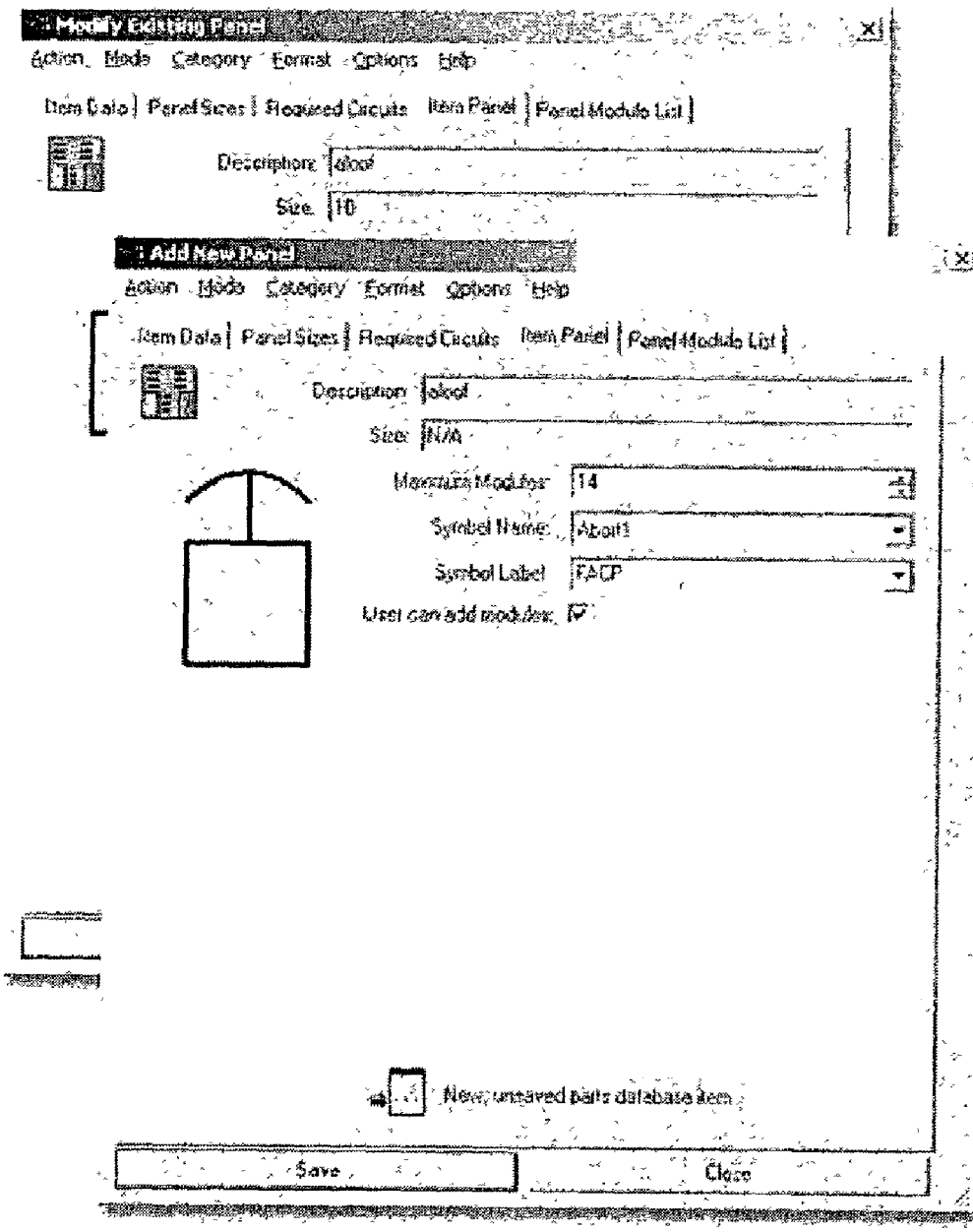
FIG. 51 is a screen-shot of an "Item Panel" tab on a "Add New Panel" window and a "Modify Existing Panel" window.

The "Item Panel" tab on both the "Add New Panel" and "Modify Existing Panel" dialogs contains current settings, symbol properties and panel module options (FIG. 51). To alter any characteristics presented on the "Item Panel" tab, the user may select from the available options in each drop-down. Once the settings are selected, the user may proceed to the "Panel Module List" tab or click to abort the procedure.

Figure 52:
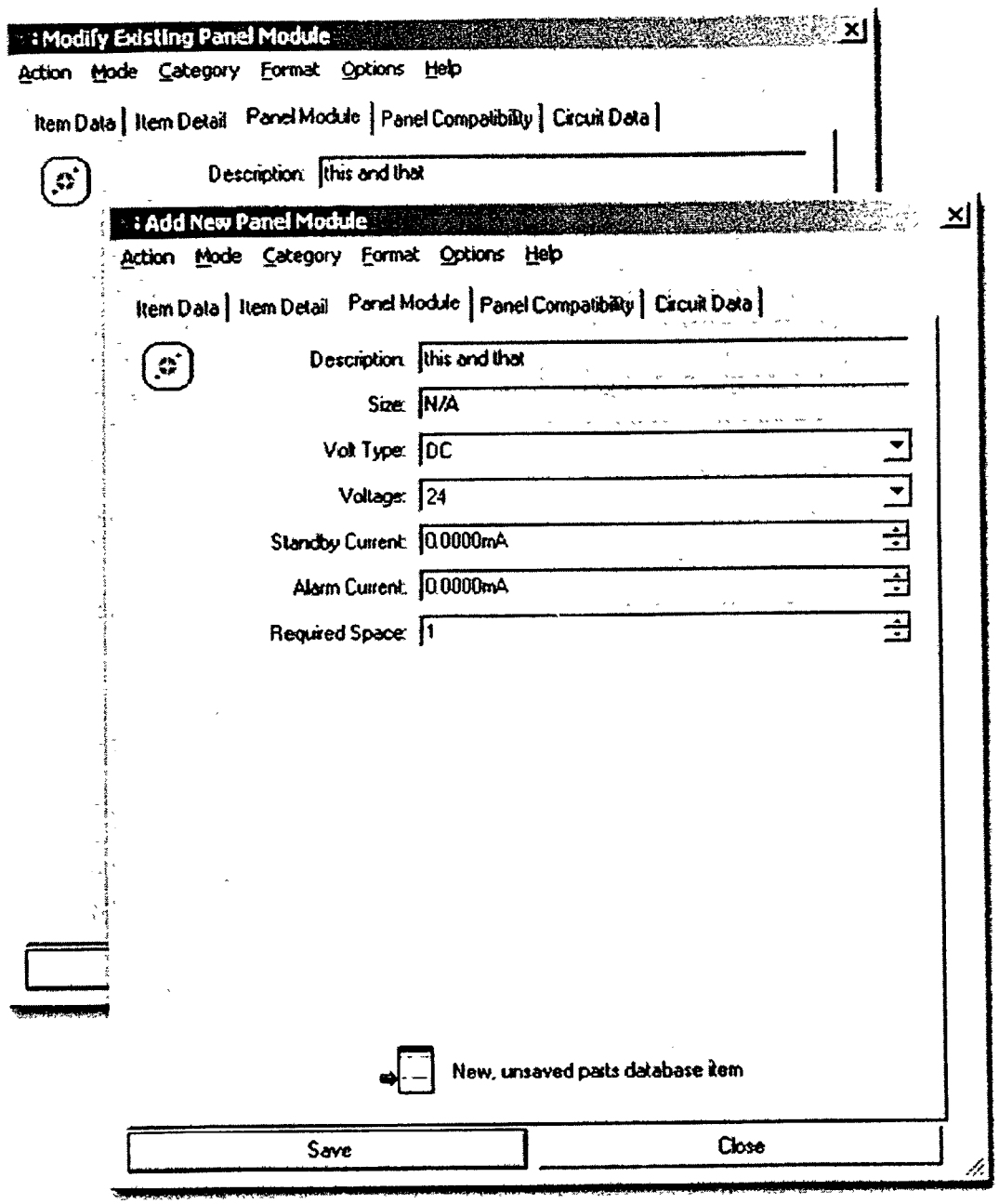
FIG. 52 is a screen-shot of a "Panel Module" tab on a "Add New Panel Module" window and a "Modify Existing Panel Module" window.

The "Panel Module" tab on both the "Add New Panel Module" and "Modify Existing Panel Module" dialogs contains voltage and current settings in addition to space requirements (FIG. 52). After making adjustments on the "Item Data" and "Item Detail" tabs, the user may move on to "Item Panel Module." To alter any characteristics presented on the "Item Panel Module" tab, the user may select from the available options in each drop-down. Once the settings are selected, the user may move on to "Panel Compatibility" tab or click "Close/Cancel" to abort the procedure.

Figure 53:
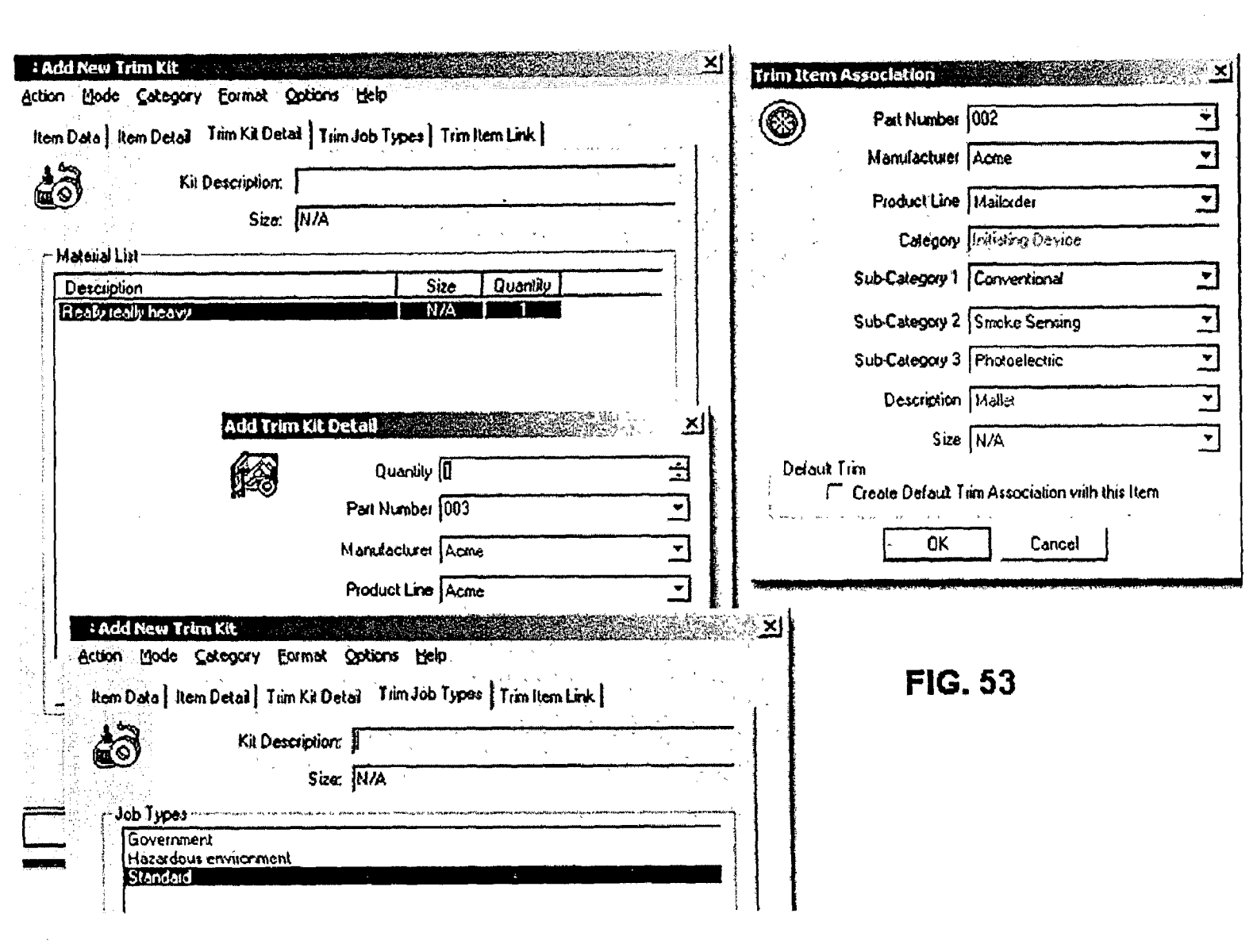

An "Add New Trim Kit" command and a "Modify Existing Trim Kit" command allow the user to alter peripheral assignments for specific elements. For example, a "Fire Alarm Control" panel comes with a "Panel Core Assembly" that includes a "Power Supply" and a "Sub-plate Assembly." The user may wish to add or remove one or more of those items. Both an "Add New Parts" and an "Edit parts" buttons open a "Trim Kit Detail" dialog (FIG. 53). The user may specify the item(s) he wants to include in the trim kit using the drop-down menus. On a "Trim Job Types" tab, the user may select any combination of the classifications listed. A "Restore list" button reestablishes the default settings and a "Select All" button highlights all classifications. The job type or combination job types determine the number in a "Job Type" box.

A "Trim Item Link" tab lets the user restrict the association of trim kit to specific items. The "Add new association" button opens the "Trim Item Association" dialog where the user may select characteristics of the item to which the trim kit will be associated from the available drop-downs. The chosen item(s) appear in an "Associated Parts" window, and additional items may be added by repeating the process. Entered items may be modified by selecting them in the window and clicking the "Edit association" button. To remove an item from the list of associated parts, the user may select it in the window and click "Delete Association." To change the properties of an existing Trim Kit, the user may click the "Modify" button and customize the settings on the "Item Data" and "Item Detail" tabs before proceeding to "Trim Kit Detail." On the "Trim Kit Detail" tab, the components of the kit appear in the "Materials Listing" window. New parts can be added to the list with the "Add new parts" button, and parts selected in the "Materials Listing" window can be customized with the "Parts" button.

Figure 54:
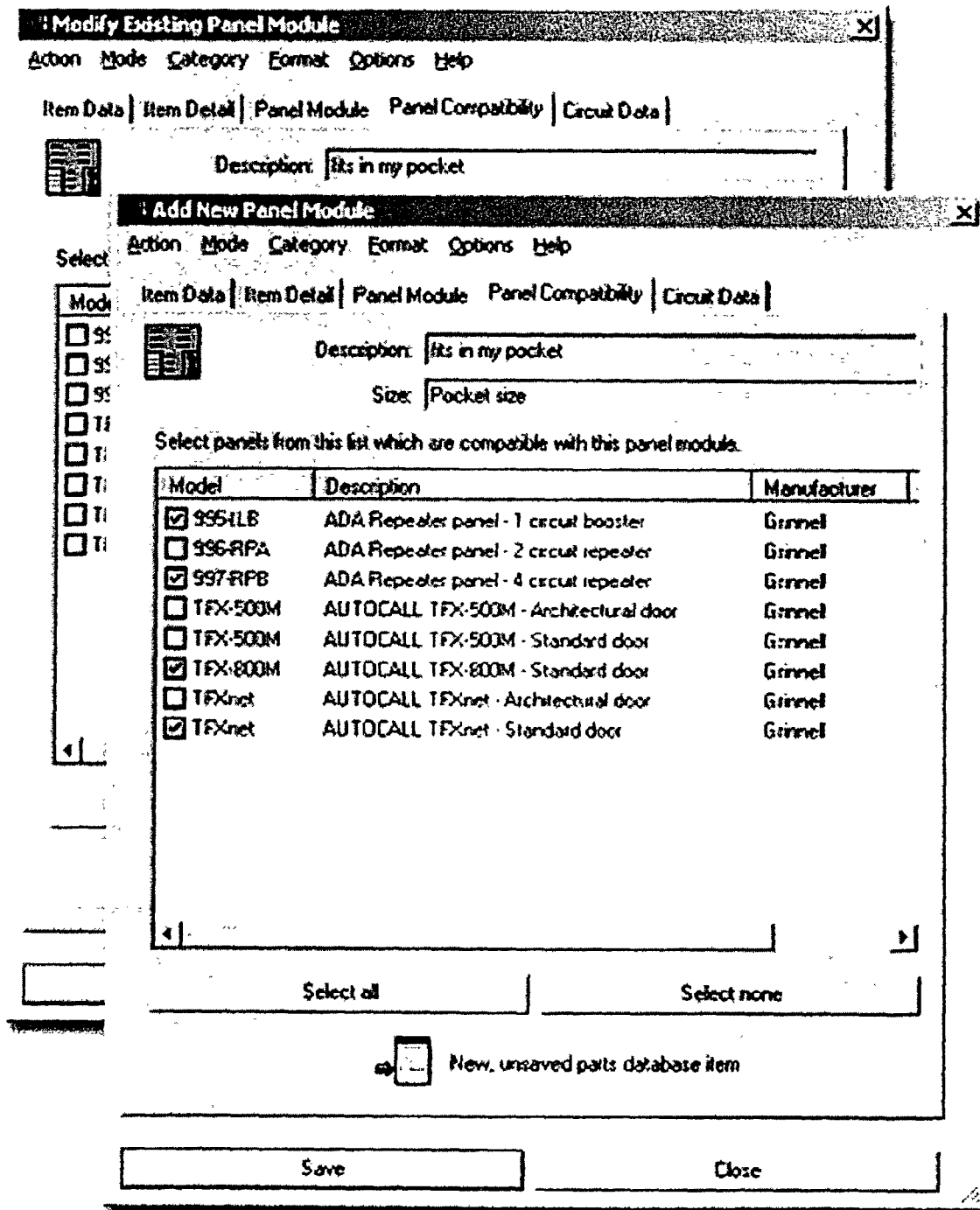
FIG. 54 is a screen-shot of a "Panel Compatibility" tab on a "Add New Panel Module" window and a "Modify Existing Panel Module" window.

A "Panel Compatibility" tab provides a list of available control panels. By "Model," "Size," and "Part Number" (FIG. 54) To establish a module as acceptable for a particular panel, the user may check the box corresponding to the appropriate row. To set a module compatible with all of the panels listed, the user may click the "Select all" button below the window, or eliminate compatibility with all selected panels by clicking the "Select none" button. With only the panels the user wants to establish as compatible for the module checked, the user may proceed to the "Circuit Data" tab or abort the procedure.

Figure 55:
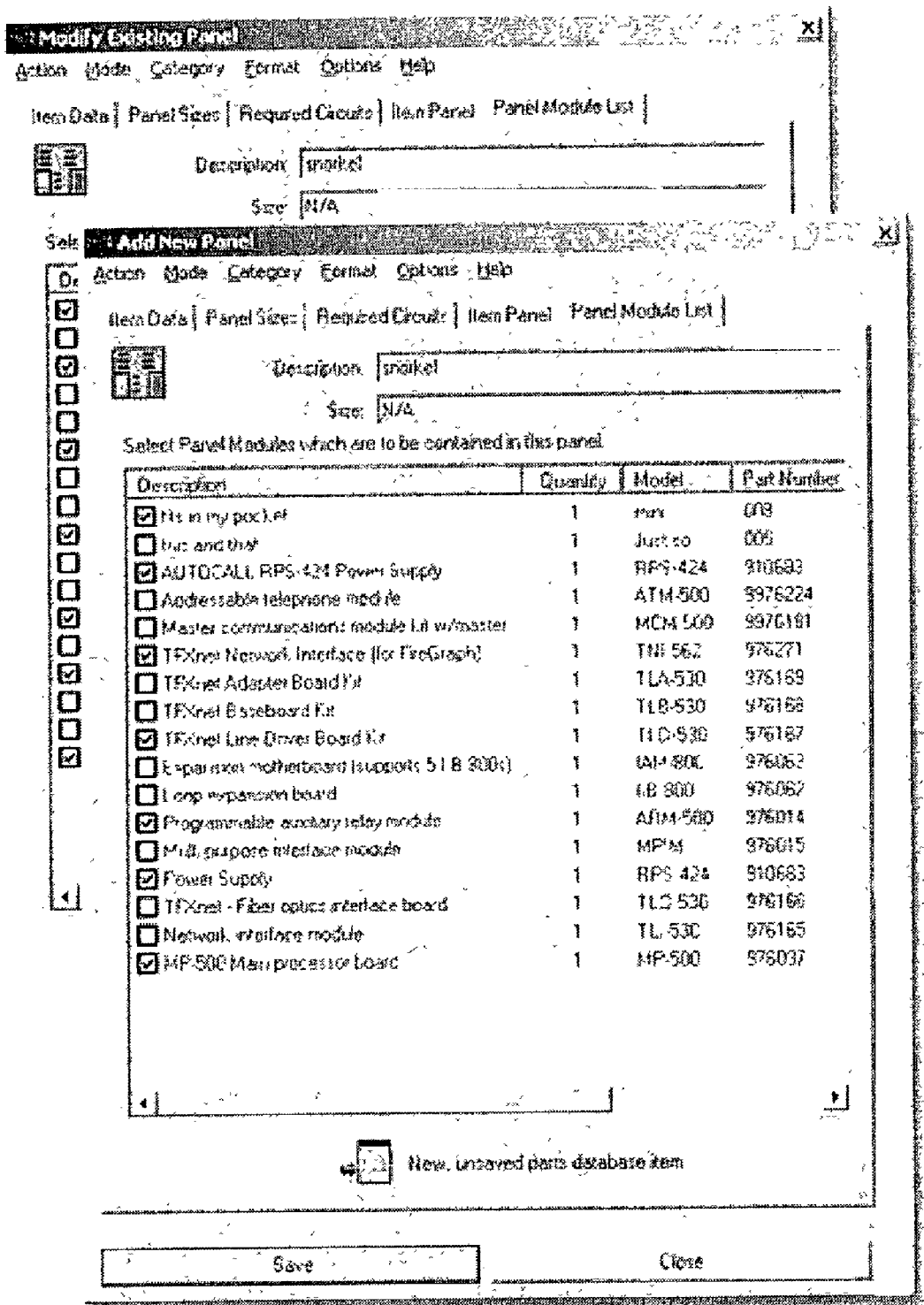
FIG. 55 is a screen-shot of a "Panel Module List" tab on a "Add New Panel" window and a "Modify Existing Panel" window.

In a window on the "Panel Module List" tab, the user may check the modules he wants to include in new panel he is adding to the "Parts Database" (FIG. 55). If the user needs more than one of a given panel, the user may click on the listed quantity and key in the number desired. The user may add modules to the list via the "Add New Panel Module" dialog.

Figure 56:
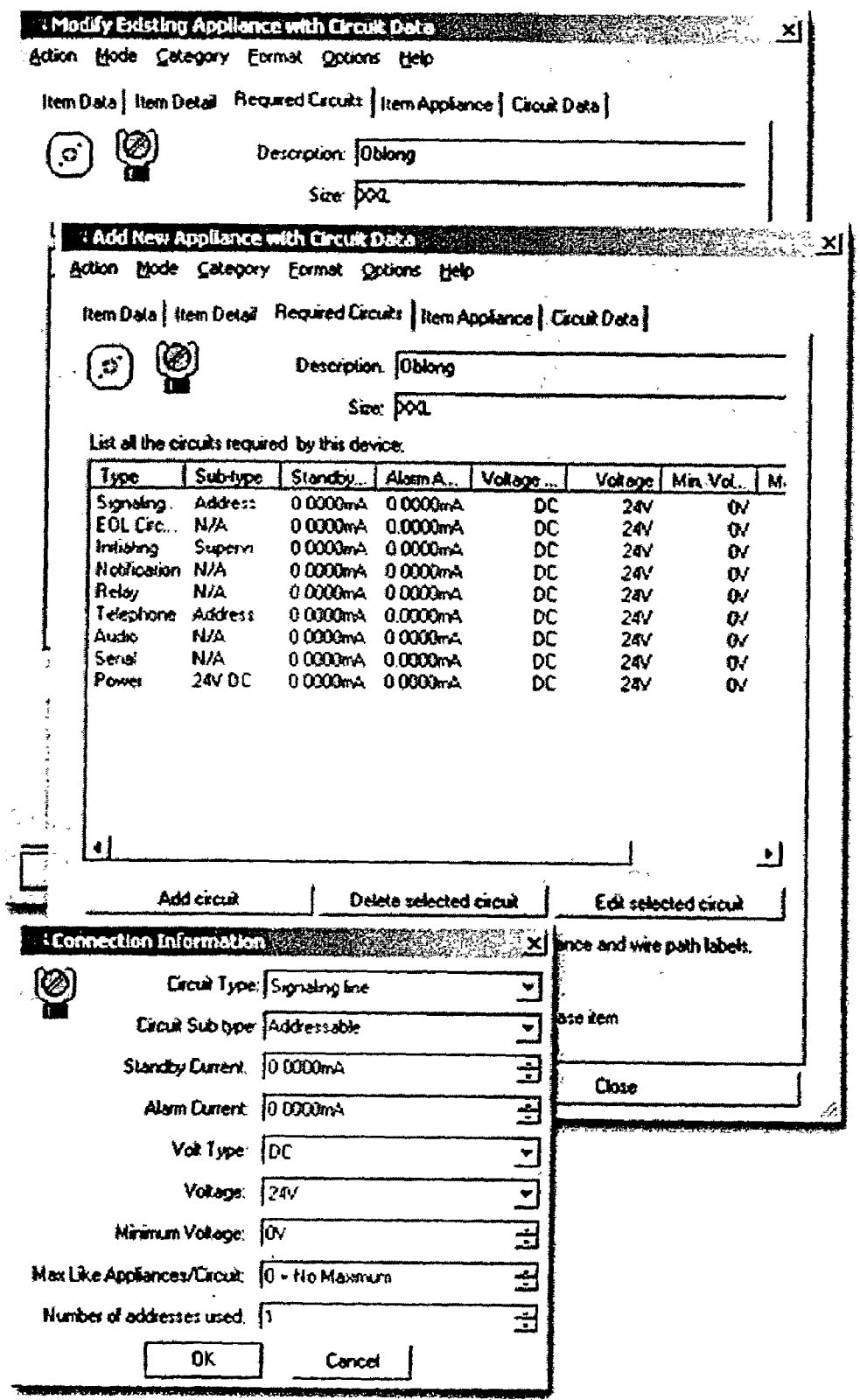
FIG. 56 is a screen-shot of a "Required Circuits" tab on an "Add New Appliance with Circuit Data" window and a "Modify Existing Appliance with Circuit Data" window.

A "Required Circuits" tab may be used to designate circuit lines that must be in place for a device to operate (FIG. 56). The user may include lines needed by a device in the "List" window by clicking an "Add circuit" button. On a "Connection Information" dialog, the user may choose the circuit type, electrical current and voltage properties, as well as the electrical lines the user wants to add from the available drop-down menus. Subsequently, the user may click "OK" to place the new information in the "List" window or the user may click "Cancel" to close the window. In addition, the user may use a slide bar at the base of the window on the "Required Circuits" tab to examine columns of circuit characteristics not currently visible. Once a circuit line is added to the list, the user may click on its row to select it and then click "Edit selected circuit" to make changes to the circuit or click "Delete selected circuit" to remove the circuit from the list.

A "Select by Circuit Assignment" command readies all elements that share a single circuit path to participate in an action to follow.

Figure 57:
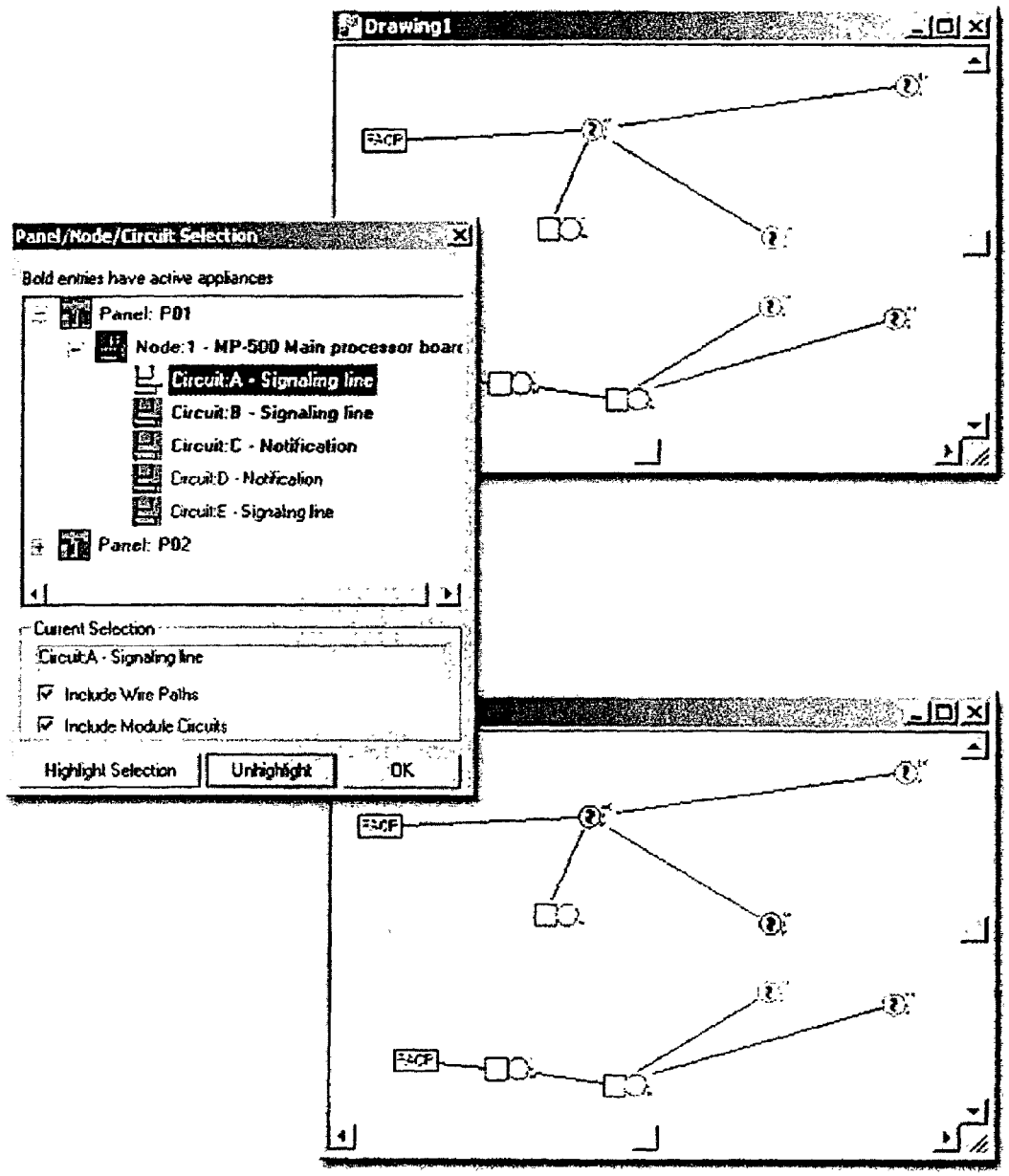
FIG. 57 is a screen-shot of a "Panel/Node Circuit Selection" window and a "Drawing" window.

From the "Select" menu, the user may choose "Select by Circuit Assignment," and then on a "Panel/Node Circuit Selection" dialog, the user may choose the desired panel, node and circuit (FIG. 57). In addition, under "Current Selection," the user may check an "Include Wire Paths" checkbox to add a cable linking the appliances along a specified path. In addition the user may check an "Include Module Circuits" checkbox to add devices running from a particular module to the selection. The user may also click a "Highlight Selection" button to see which items will be selected under the parameters currently established. An "Unhighlight" button cancels the selection parameters.

Figure 58:
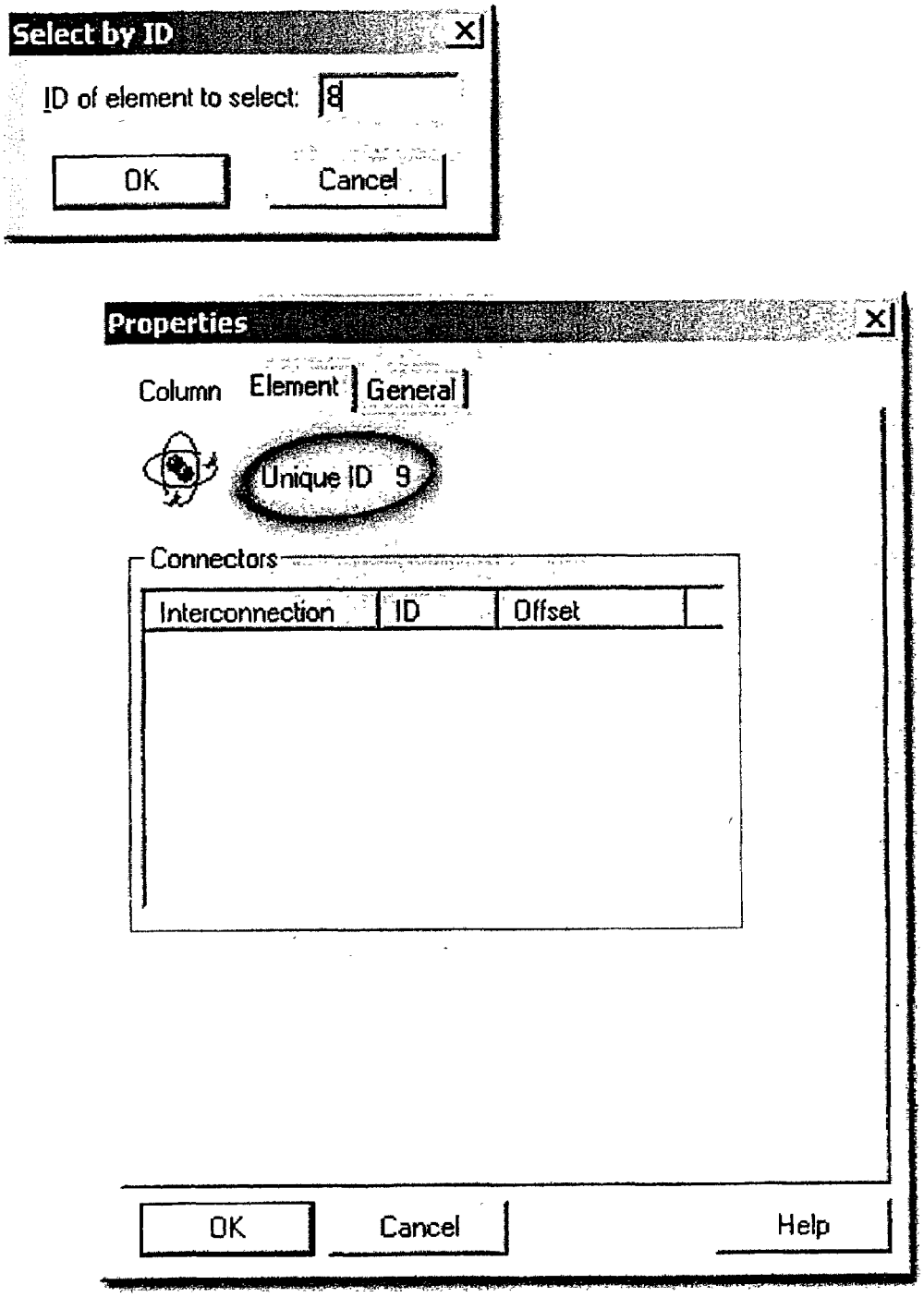
FIG. 58 is a screen-shot of a "Select by ID" window.

To ready a specific element for a subsequent action, the user may choose "Select by ID . . . " from a "Select" menu. The user may then enter the elements "Unique ID" number on the "Select by ID" dialog and hit the "OK" button (FIG. 58). The "Unique ID" number of any element is displayed on the "Element" tab of that element's "Properties" page (FIG. 58).

Alarm System Auto-wiring Process

Figure 59:
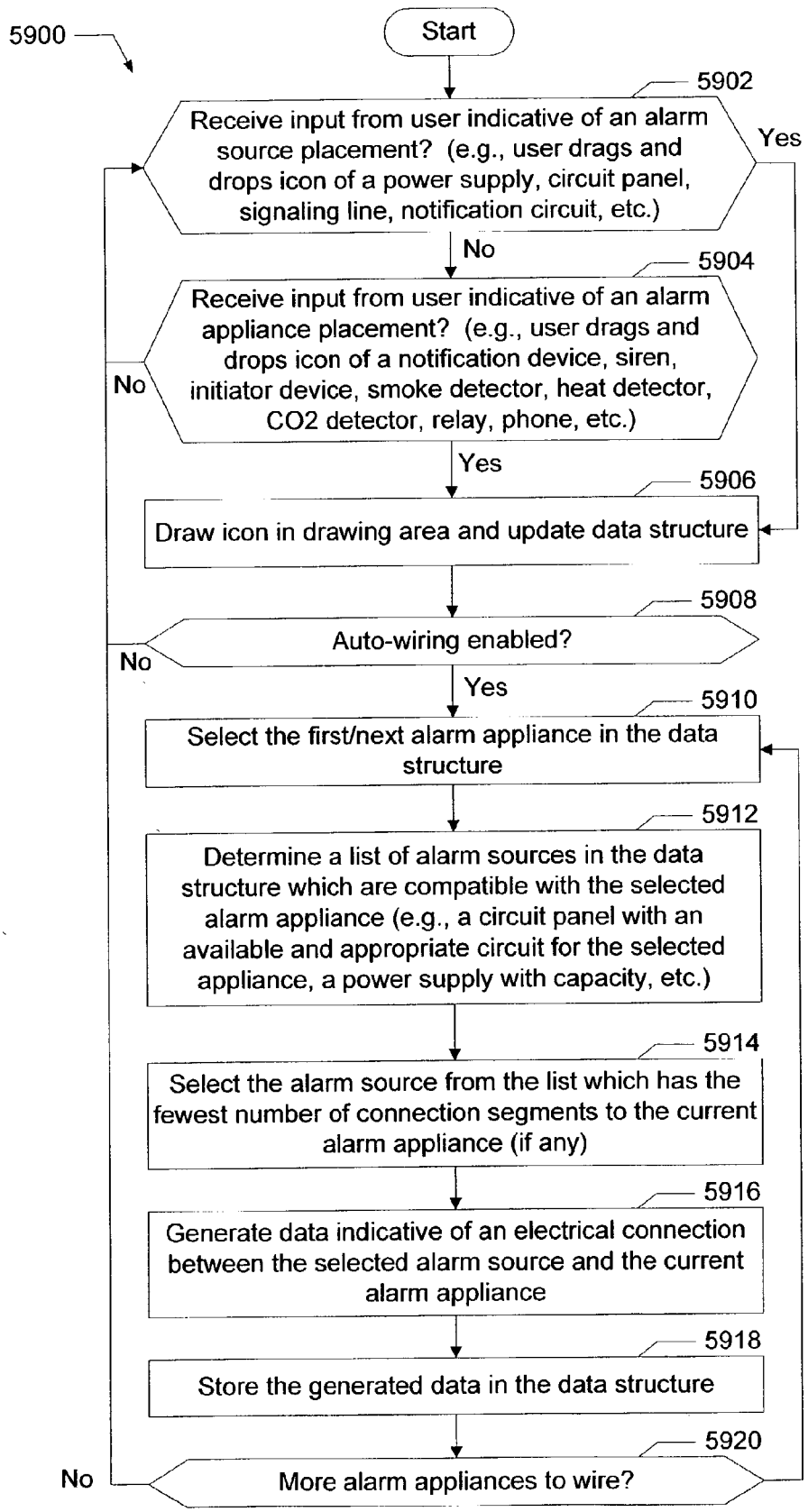
FIG. 59 is a flowchart of a process for generating a data structure indicative of an alarm system circuit.

A flowchart of a process 5900 for generating a data structure indicative of an alarm system circuit is illustrated in FIG. 59. Preferably, the process 5900 is embodied in a software program which is stored in the program store 36 and executed by the controller 44 in a well known manner. However, some or all of the steps of the process 5900 may be performed manually and/or by another device. Although the process 5900 is described with reference to the flowchart illustrated in FIG. 59, a person of ordinary skill in the art will readily appreciate that many other methods of performing the acts associated with process 5900 may be used. For example, the order of many of the steps may be changed. In addition, many of the steps described are optional.

Generally, the process 5900 causes the controller 44 to receive user inputs indicative of the placement of alarm sources and alarm appliances. For example, a user of a computer aided design (CAD) system may graphically place fire alarm icons, such as smoke detectors and sirens, on a drawing area. After one or more of the sources or appliances are placed, the controller 44 may automatically determine a series of electrical circuit connections between the alarm sources and the alarm appliances. Preferably, this determination is based on circuit type compatibility as well as a number of connected segments between a particular alarm source and a particular alarm appliance. A "connected segment" is a single wirepath between any two alarm elements.

The process 5900 begins when the controller 44 receives an input from a user indicative of an alarm source placement (block 5902) or an alarm appliance placement (block 5904). Alarm sources may include power supplies, circuit panels, addressable signaling lines, bus signaling lines, notification circuits, and other types of circuits and electrical connection lines. Alarm appliances may include notification devices, such as sirens, lights, displays, and prerecorded announcements. In addition, alarm appliances may include initiator devices, such as smoke detectors, heat detectors, and carbon-dioxide (CO2) detectors. Still further, alarm appliances may include other devices, such as relays and communications (comm) phones.

The user may generate inputs indicative of alarm source placement and/or an alarm appliance placement by "dragging and dropping" an icon from a toolbar area of a command region 54 to a drawing area 52. Preferably, each type of alarm source and each type of alarm appliance is associated with a different icon which visually indicates the particular type of alarm source or appliance being placed. After each icon is placed in the drawing area 52, the process 5900 causes the controller 44 to update a data structure stored in the database 16 (block 5906). The data structure memorializes the alarm system. For example, each alarm source may be associated with one or more circuit types, such as an addressable signaling circuit. Similarly, each alarm appliance may be associated with one or more circuit types, such as an addressable signaling circuit. Preferably, this circuit type information is stored in the data structure along with the other information indicative of the alarm system.

After one or more alarm sources and/or alarm appliances are placed in the drawing, the controller 44 checks if "auto-wiring" is enabled by testing a memory location for a predefined value (block 5908). Preferably, auto-wiring is enabled in response to a user checking a check box in a dialog box and/or issuing a command as described in detail above. If auto-wiring is not enabled, the controller 44 again checks for an input from a user indicative of an alarm source placement (block 5902) or an alarm appliance placement (block 5904).

If auto-wiring is enabled, the controller 44 selects the first alarm appliance in a list of alarm appliances generated from (or generated in conjunction with) the data structure which represents the current alarm system (block 5910). Next, the controller 44 determines a list of alarm sources in the data structure which are compatible with the selected alarm appliance (block 5912). For example, if the selected alarm appliance is an addressable smoke detector, each circuit panel with an available smoke detector circuit (e.g., an addressable signaling circuit) is included in the list of compatible alarm sources.

Next, a particular alarm source is selected from the list of compatible alarm sources (block 5914). Preferably, the alarm source which is the fewest number of connected segments away from the current appliance is selected from the list of compatible alarm sources. A "connected segment" is a single wirepath between any two alarm elements. Subsequently, the controller 44 generates data indicative of an electrical connection between the selected alarm source and the current alarm appliance (block 5916) and stores the generated data in the alarm system data structure located in the database 16 (block 5918).

If additional alarm appliances require auto-wiring (block 5920), the controller 44 selects the next alarm appliance from the list of alarm appliances (block 5910). If no additional alarm appliances require auto-wiring (block 5920), the controller 44 again checks for an input from a user indicative of an alarm source placement (block 5902) or an alarm appliance placement (block 5904).

In summary, persons of ordinary skill in the art will readily appreciate that methods and apparatus for generating a data structure indicative of an alarm system circuit have been provided. The foregoing description has been presented for the purposes of illustration and description. It is not intended to be exhaustive or to limit the scope of this patent to the examples disclosed. Many modifications and variations are possible in light of the above teachings. It is intended that the scope of this patent be defined by the claims appended hereto as reasonably interpreted literally and under the doctrine of equivalents.

What is claimed is:

1. A method of generating a data structure indicative of an alarm system circuit, the method comprising:
   receiving first data indicative of a first alarm source device, the first alarm source device being compatible with a first alarm circuit type;
   receiving second data indicative of a second alarm source device, the second alarm source device being compatible with a second alarm circuit type, the first alarm circuit type being different than the second alarm circuit type;
   receiving third data indicative of a first alarm appliance, the first alarm appliance being compatible with the first alarm circuit type;
   automatically generating fourth data indicative of an electrical connection between the first alarm source device and the first alarm appliance; and
   storing the first data, the second data, the third data, and the fourth data in the data structure.

2. A method as defined in claim 1, further comprising:
   receiving fifth data indicative of a third alarm source device, the third alarm source device being compatible with the first alarm circuit type; and
   selecting the first alarm source device instead of the third alarm source device for the automated generation of the fourth data indicative of the electrical connection, the selection being based on a fewer number of connected segments being associated with the first alarm source device then the third alarm source device.

3. A method as defined in claim 1, wherein receiving first data indicative of a first alarm source device comprises receiving an input from a user interface device indicative of placement of a graphical representation of the first alarm source device.

4. A method as defined in claim 1, wherein receiving first data indicative of a first alarm source device comprises receiving first data indicative of a power supply.

5. A method as defined in claim 1, wherein receiving first data indicative of a first alarm source device comprises receiving first data indicative of a circuit panel.

6. A method as defined in claim 1, wherein receiving first data indicative of a first alarm source device comprises receiving first data indicative of a signaling line.

7. A method as defined in claim 1, wherein receiving first data indicative of a first alarm source device comprises receiving a first data indicative of an addressable signaling line.

8. A method as defined in claim 1, wherein receiving first data indicative of a first alarm source device comprises receiving first data indicative of a remote bus signaling line.

9. A method as defined in claim 1, wherein receiving first data indicative of a first alarm source device comprises receiving first data indicative of a notification circuit.

10. A method as defined in claim 1, wherein receiving first data indicative of a first alarm source device comprises receiving first data indicative of a wiring style.

11. A method as defined in claim 1, wherein receiving third data indicative of a first alarm appliance comprises receiving third data indicative of a notifier device.

12. A method as defined in claim 1, wherein receiving third data indicative of a first alarm appliance comprises receiving third data indicative of a siren.

13. A method as defined in claim 1, wherein receiving third data indicative of a first alarm appliance comprises receiving third data indicative of an initiator device.

14. A method as defined in claim 1, wherein receiving third data indicative of a first alarm appliance comprises receiving third data indicative of a smoke detector.

15. A method as defined in claim 1, wherein receiving third data indicative of a first alarm appliance comprises receiving third data indicative of a heat detector.

16. A method as defined in claim 1, wherein receiving third data indicative of a first alarm appliance comprises receiving third data indicative of a carbon-dioxide detector.

17. A method as defined in claim 1, wherein receiving third data indicative of a first alarm appliance comprises receiving third data indicative of a relay device.

18. A method as defined in claim 1, wherein receiving third data indicative of a first alarm appliance comprises receiving third data indicative of a phone.

19. A computer readable medium storing a software program, the software program being structured to cause a computer to:
   receive first data indicative of a first alarm source device, the first alarm source device being compatible with a first alarm circuit type;
   receive second data indicative of a second alarm source device, the second alarm source device being compatible with a second alarm circuit type, the first alarm circuit type being different than the second alarm circuit type;

receive third data indicative of a first alarm appliance, the first alarm appliance being compatible with the first alarm circuit type;

automatically generate fourth data indicative of an electrical connection between the first alarm source device and the first alarm appliance; and store the first data, the second data, the third data, and the fourth data in the data structure.

20. A computer readable medium as defined in claim 19, wherein the software program is further structured to cause the computer to:

receive fifth data indicative of a third alarm source device, the third alarm source device being compatible with the first alarm circuit type; and select the first alarm source device instead of the third alarm source device for the automated generation of the fourth data indicative of the electrical connection, the selection being based on a fewer number of connected segments being associated with the first alarm source device then the third alarm source device.

21. A computer readable medium as defined in claim 19, wherein the software program is structured to cause the computer to receive an input from a user indicative of placement of a graphical representation of the first alarm source device.

22. A computer readable medium as defined in claim 19, wherein the software program is structured to cause the computer to receive data indicative of a power supply.

23. A computer readable medium as defined in claim 19, wherein the software program is structured to cause the computer to receive data indicative of a circuit panel for a fire alarm system.

24. A computer readable medium as defined in claim 19, wherein the software program is structured to cause the computer to receive data indicative of a signaling line for a fire alarm system.

25. A computer readable medium as defined in claim 19, wherein the software program is structured to cause the computer to receive data indicative of an addressable signaling line for a fire alarm system.

26. A computer readable medium as defined in claim 19, wherein the software program is structured to cause the computer to receive data indicative of a remote bus signaling line for a fire alarm system.

27. A computer readable medium as defined in claim 19, wherein the software program is structured to cause the computer to receive data indicative of a notification circuit for a fire alarm system.

28. A computer readable medium as defined in claim 19, wherein the software program is structured to cause the computer to receive data indicative of a wiring style for a fire alarm system.

29. A computer readable medium as defined in claim 19, wherein the software program is structured to cause the computer to receive data indicative of a notifier device for a fire alarm system.

30. A computer readable medium as defined in claim 19, wherein the software program is structured to cause the computer to receive data indicative of a fire alarm siren.

31. A computer readable medium as defined in claim 19, wherein the software program is structured to cause the computer to receive data indicative of an initiator device for a fire alarm system.

32. A computer readable medium as defined in claim 19, wherein the software program is structured to cause the computer to receive data indicative of a smoke detector.

33. A computer readable medium as defined in claim 19, wherein the software program is structured to cause the computer to receive data indicative of a heat detector for a fire alarm system.

34. A computer readable medium as defined in claim 19, wherein the software program is structured to cause the computer to receive data indicative of a carbon-dioxide detector for a fire alarm system.

35. A computer readable medium as defined in claim 19, wherein the software program is structured to cause the computer to receive data indicative of a relay device for a fire alarm system.

36. A computer readable medium as defined in claim 19, wherein the software program is structured to cause the computer to receive data indicative of a phone.

37. A computing device programmed to generate a data structure indicative of an alarm system circuit, the computing device comprising:

a user input device;

a user output device;

a memory storing a software program; and a processor operatively coupled to the user input device, the user output device, and the memory, the software program being structured to cause the computing device to:

receive first data indicative of a first alarm source device, the first alarm source device being compatible with a first alarm circuit type;

receive second data indicative of a second alarm source device, the second alarm source device being compatible with a second alarm circuit type, the first alarm circuit type being different than the second alarm circuit type;

receive third data indicative of a first alarm appliance, the first alarm appliance being compatible with the first alarm circuit type;

automatically generate fourth data indicative of an electrical connection between the first alarm source device and the first alarm appliance; and store the first data, the second data, the third data, and the fourth data in the data structure.

38. A computing device as defined in claim 37, wherein the software program is structured to cause the computing device to:

receive an input from the user input device, the input being indicative of placement of a graphical representation of the first alarm source device; and display the graphical representation of the first alarm source device on the user output device.

* * * * *